US010049720B2

(12) United States Patent
Tanaka et al.

(10) Patent No.: US 10,049,720 B2
(45) Date of Patent: Aug. 14, 2018

(54) DYNAMIC RANDOM ACCESS MEMORY (DRAM)

(71) Applicant: KABUSHIKI KAISHA TOSHIBA, Minato-ku (JP)

(72) Inventors: Chika Tanaka, Fujisawa (JP); Keiji Ikeda, Kawasaki (JP); Toshinori Numata, Yokkaichi (JP); Tsutomu Tezuka, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/445,331

(22) Filed: Feb. 28, 2017

(65) Prior Publication Data
US 2018/0033478 A1    Feb. 1, 2018

(30) Foreign Application Priority Data

Jul. 29, 2016 (JP) .................................. 2016-150474

(51) Int. Cl.
    *G11C 11/24*    (2006.01)
    *G11C 11/4091*  (2006.01)
    (Continued)

(52) U.S. Cl.
    CPC ........ *G11C 11/4091* (2013.01); *G11C 11/404* (2013.01); *G11C 14/0018* (2013.01)

(58) Field of Classification Search
    CPC ............ G11C 11/4091; G11C 14/0018; G11C 11/404; G11C 27/10805; G11C 27/10847
    (Continued)

(56) References Cited

U.S. PATENT DOCUMENTS 5,297,077 A * 3/1994 Imai .................. G11C 14/00
                                                365/117
6,262,910 B1 * 7/2001 Takata ................ G11C 11/22
                                                365/117
(Continued)

FOREIGN PATENT DOCUMENTS

JP          6-295589         10/1994
JP          2000-100175      4/2000
(Continued)

OTHER PUBLICATIONS

Teruyoshi Hatanaka et al., "Ferroelectric (Fe)-NAND Flash Memory With Batch Write Algorithm and Smart Data Store to the Nonvolatile Page Buffer for Data Center Application High-Speed and Highly Reliable Enterprise Solid-State Drives," IEEE Journal of Solid-State Circuits, vol. 45, No. 10, Oct. 2010, pp. 2156-2164.

(Continued)

*Primary Examiner* — Gene Auduong
(74) *Attorney, Agent, or Firm* — Oblon, McClelland, Maier & Neustadt, L.L.P.

(57) ABSTRACT

According to one embodiment, a semiconductor memory device includes a memory cell, the cell includes a first capacitor which includes first and second electrodes, and a first transistor which includes first and second terminals and a first control terminal, the first terminal being connected to the first electrode, a first conductive line connected to the second terminal, a second conductive line connected to the second electrode, a sense amplifier, a switch element connected between the first conductive line and the sense amplifier, and a controller turning off the switch element in a write operation, applies a first potential to the first conductive line, and sets a potential of the second conductive line according to a value of write data to be written to the cell.

20 Claims, 52 Drawing Sheets

(51) Int. Cl.
*G11C 14/00* (2006.01)
*G11C 11/404* (2006.01)

(58) Field of Classification Search
USPC .................. 365/145, 149, 203, 63, 205, 208
See application file for complete search history.

(56) References Cited

U.S. PATENT DOCUMENTS

| | | | |
|---|---|---|---|
| 6,469,546 B2* | 10/2002 | Matano | G11C 7/065 |
| | | | 327/51 |
| 6,967,858 B2 | 11/2005 | Kang | |
| 7,778,068 B2* | 8/2010 | Kawahara | H01L 27/228 |
| | | | 365/158 |
| 9,698,272 B1 | 7/2017 | Ikeda et al. | |
| 2003/0174545 A1* | 9/2003 | Wada | G11C 7/06 |
| | | | 365/189.09 |
| 2005/0180222 A1* | 8/2005 | Suzuki | G11C 11/22 |
| | | | 365/189.05 |
| 2012/0099368 A1 | 4/2012 | Kamata | |
| 2013/0229849 A1* | 9/2013 | Kawashima | G11C 11/412 |
| | | | 365/145 |
| 2016/0358640 A1* | 12/2016 | Brederlow | G06F 8/65 |

FOREIGN PATENT DOCUMENTS

| | | |
|---|---|---|
| JP | 3622390 | 2/2005 |
| JP | 4801125 | 10/2011 |
| JP | 2013-8431 | 1/2013 |
| JP | 2017-168623 A | 9/2017 |

OTHER PUBLICATIONS

Daisaburo Takashima et al., "An Embedded DRAM Technology for High-Performance NAND Flash Memories," 2011 IEEE International Solid-State Circuits Conference Digest of Technical Papers (ISSCC), Feb. 20-24, 2011, pp. 504-505.

* cited by examiner

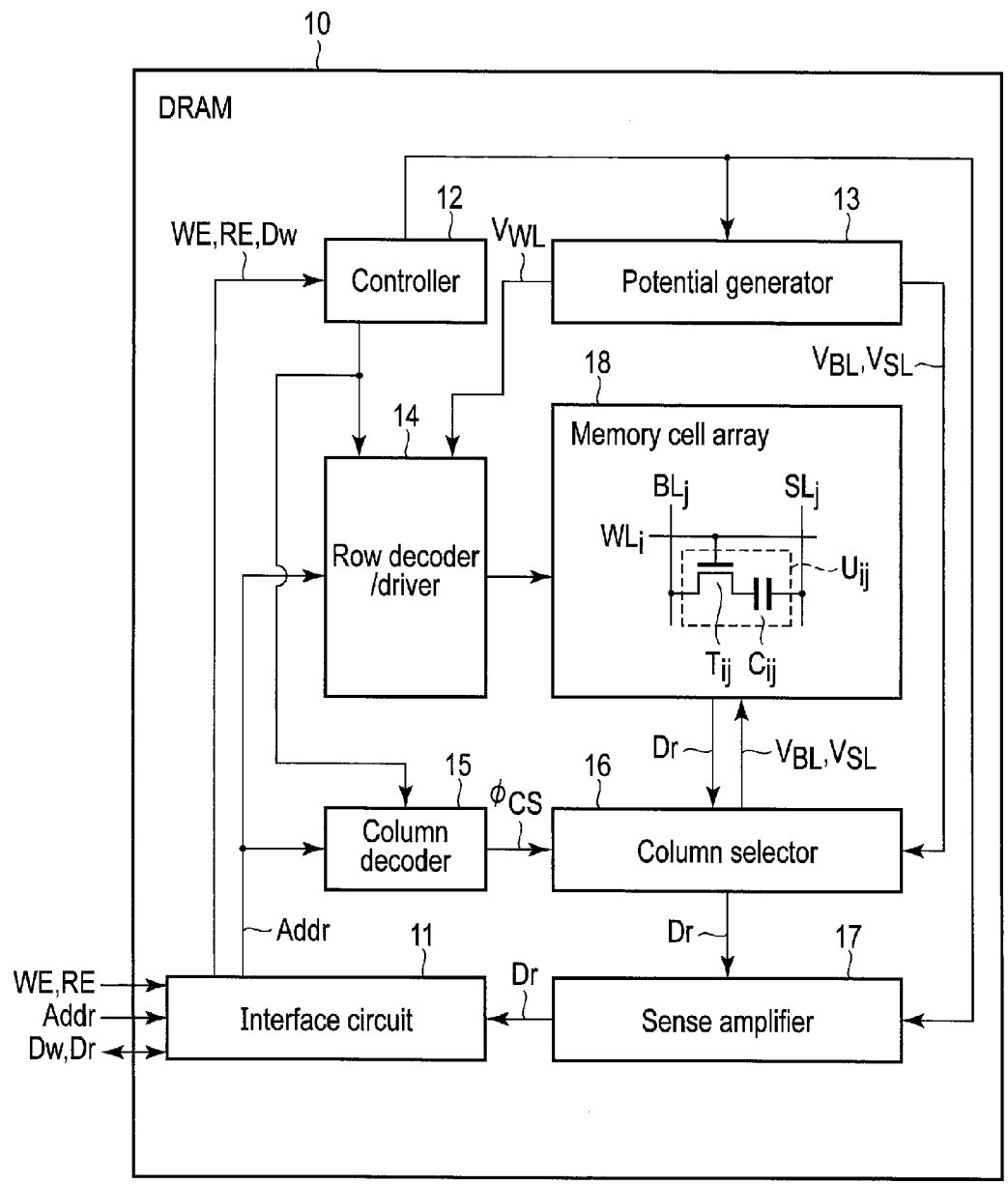
F I G. 1

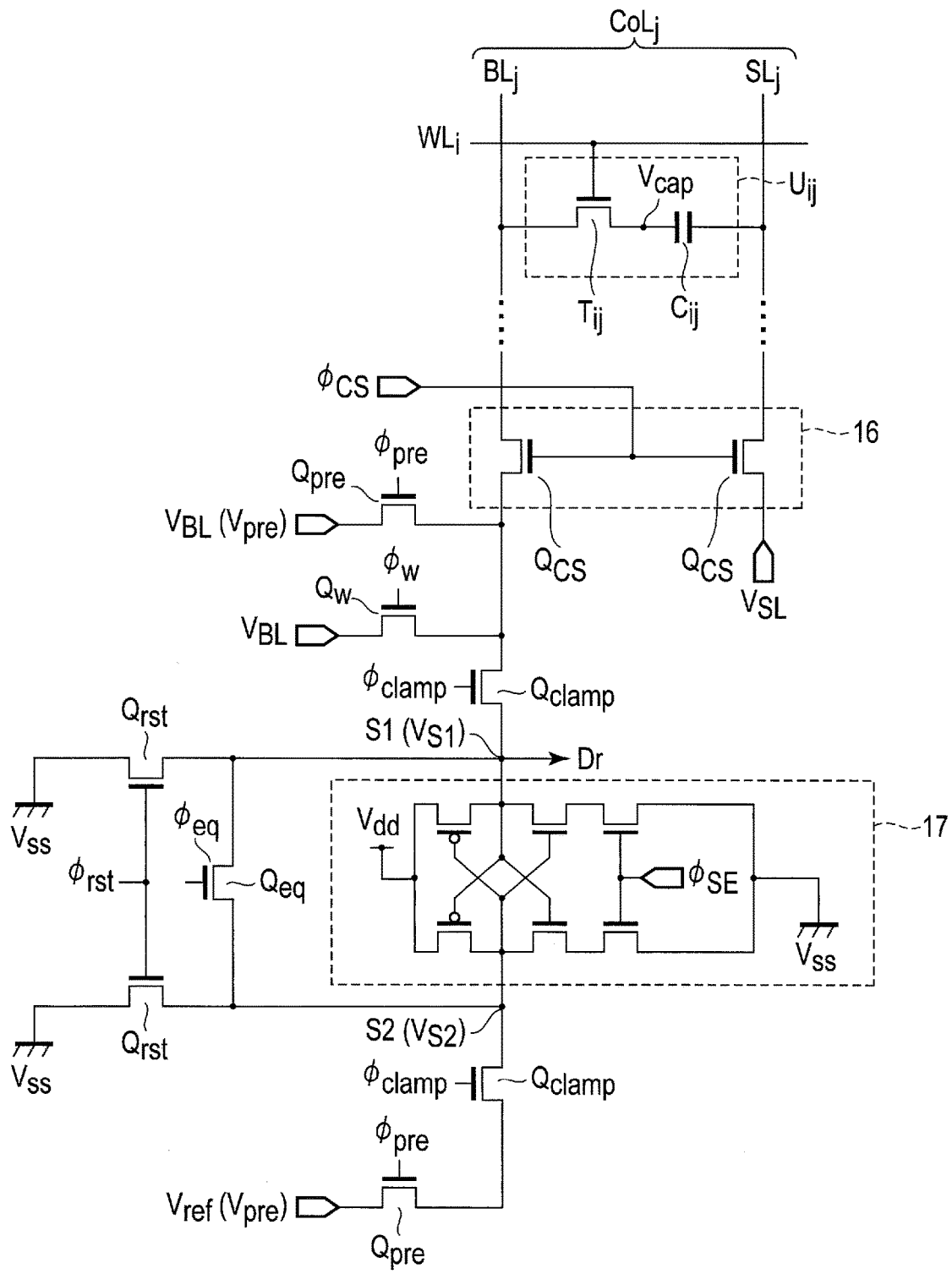
F I G. 3

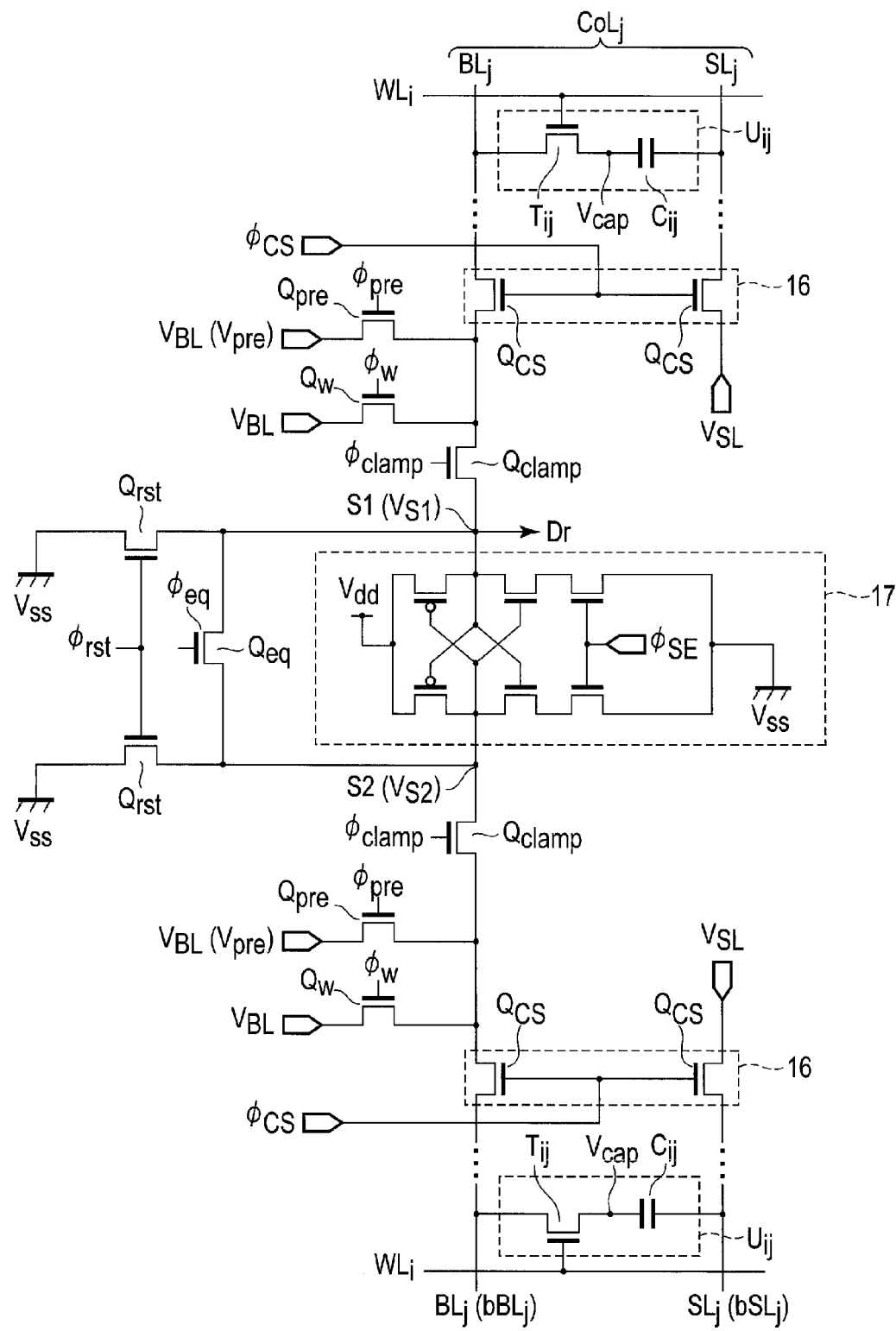
F I G. 4

| Write operation | | | | |
|---|---|---|---|---|
| Data | $V_{WL}$ | $V_{BL}$ | $V_{SL}$ | $V_{storage}$ $(=V_{BL}-V_{SL})$ |
| 1 | $V_{on\_w}$ | $V_{dd}$ | 0V | $V_{W1}=V_{dd}$ |
| 0 | $V_{on\_w}$ | $V_{dd}$ | $V_{dd}$ | $V_{W0}=0V$ |

$V_{on\_w} \geqq V_{BL}+V_{th}$

F I G. 7

| Read operation | | |
|---|---|---|
| Equivalent circuit | Data determination | $V_{read}$ |
| BL$_j$ (V$_{BL}$)<br>WL$_i$ (V$_{WL}$) —⊣[ ~T$_{ij}$<br>V$_{cap}$ ~C$_{ij}$<br>SL$_j$ (V$_{SL}$)<br>V$_{read}$ | Determination on 0 and 1 | $V_{pre}$ (e.g., $\frac{1}{2}V_{dd}$) |

F I G. 8

| Read operation | | | | |
|---|---|---|---|---|
| Data | $V_{WL}$ | $V_{BL}$ (=$V_{pre}$): Variation of floating | $V_{SL}$ | $V_{read}$ (=$V_{BL}-V_{SL}$) |
| 1 | $V_{on\_r}$ | $\frac{1}{2}V_{dd}$ → Rise | 0V or 0V → ±βV (boost effect) | $V_{pre}=\frac{1}{2}V_{dd}$ |
| 0 | $V_{on\_r}$ | $\frac{1}{2}V_{dd}$ → Fall | 0V or 0V → ±βV (boost effect) | $V_{pre}=\frac{1}{2}V_{dd}$ |

$V_{on\_r} \geq V_{BL}+V_{th}$

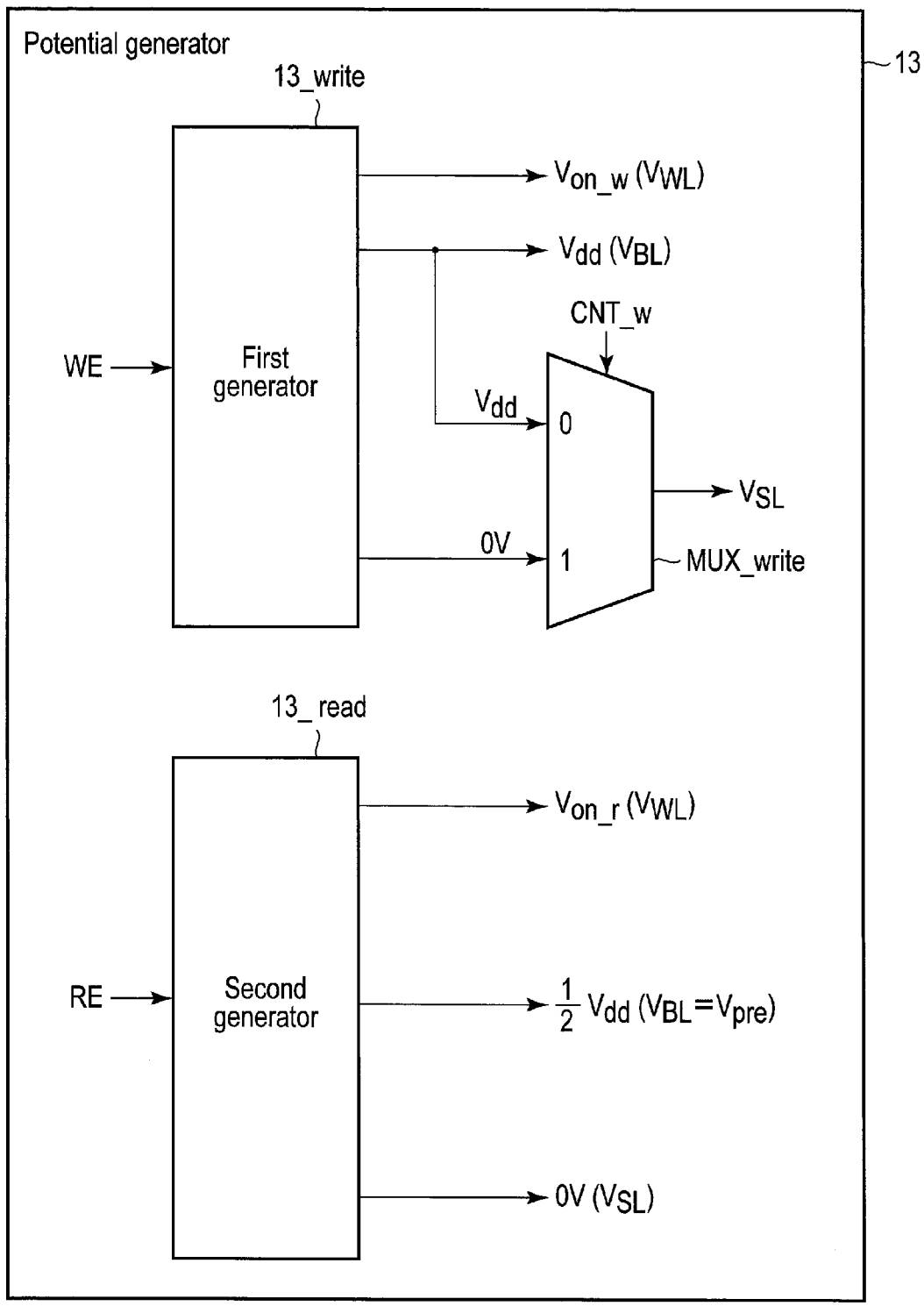
F I G. 11

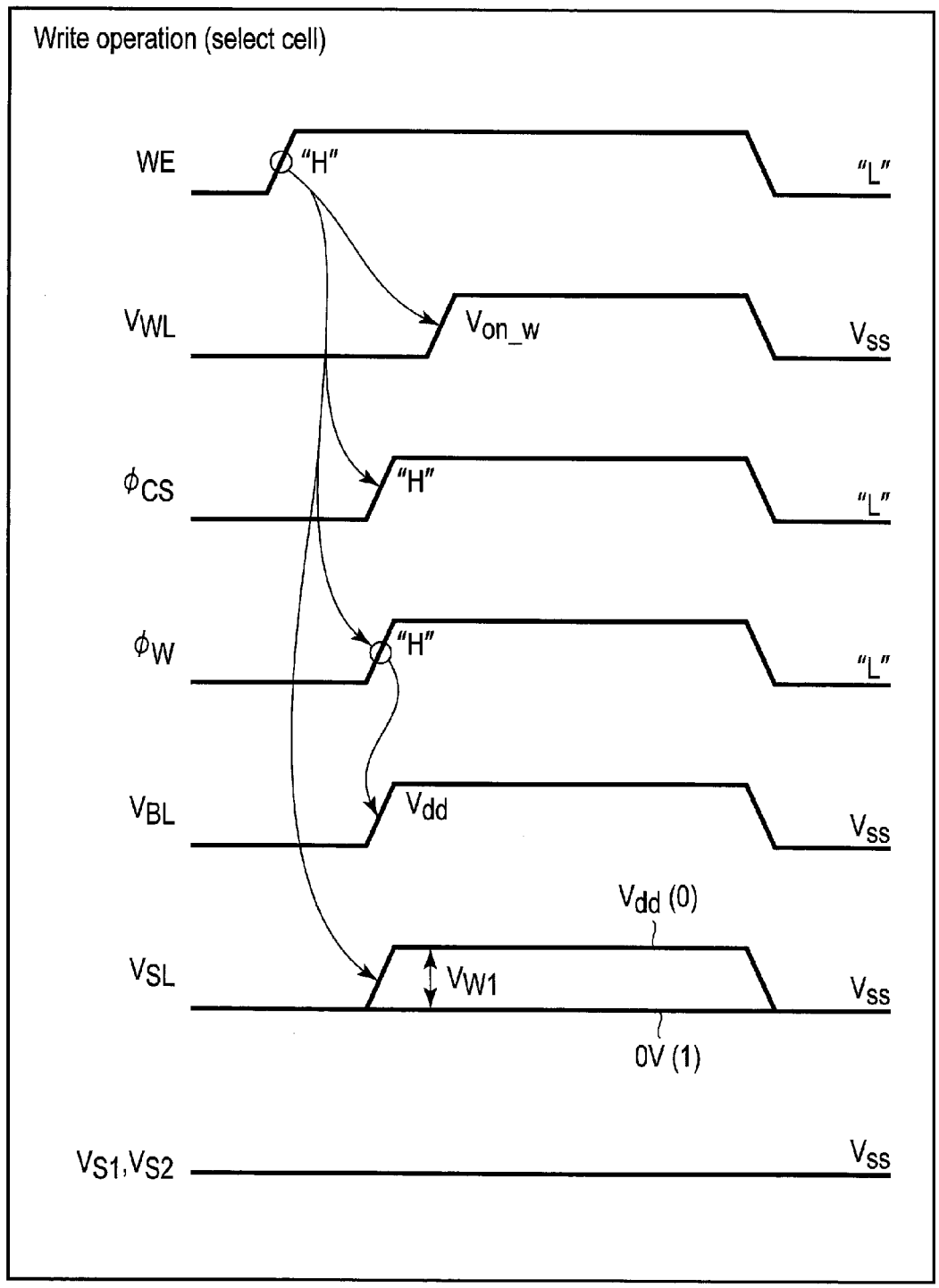
F I G. 12

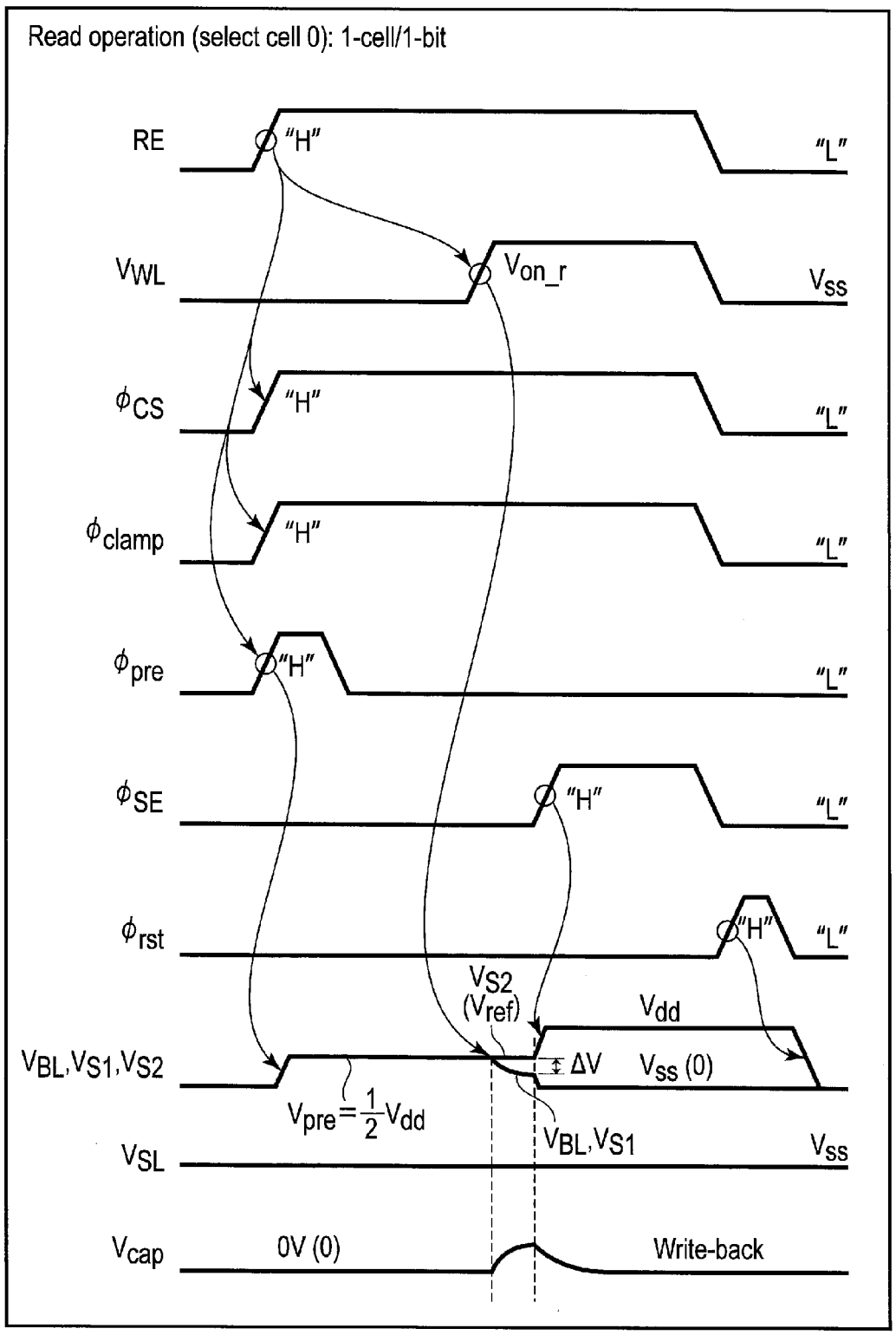
F I G. 14

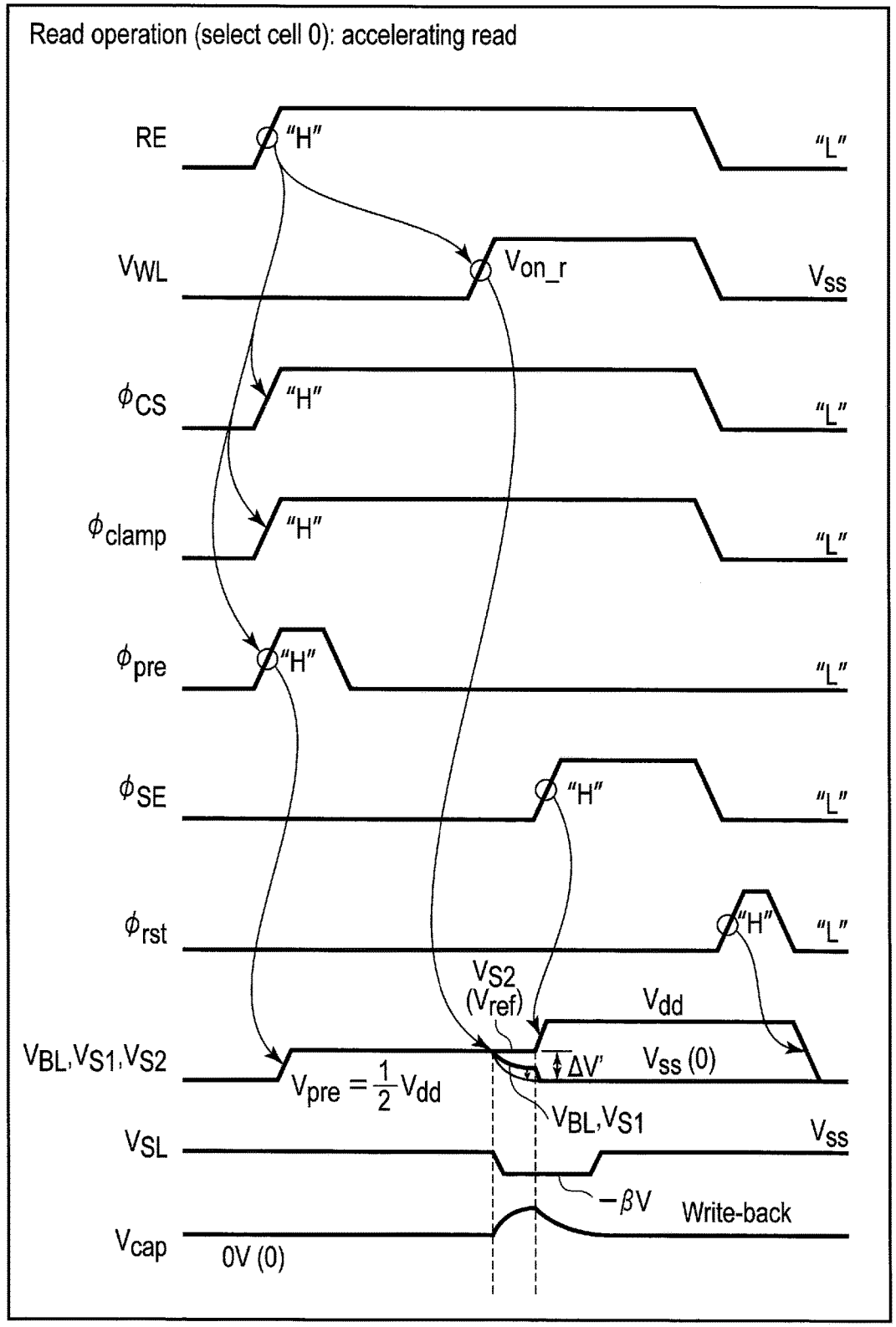
F I G. 20

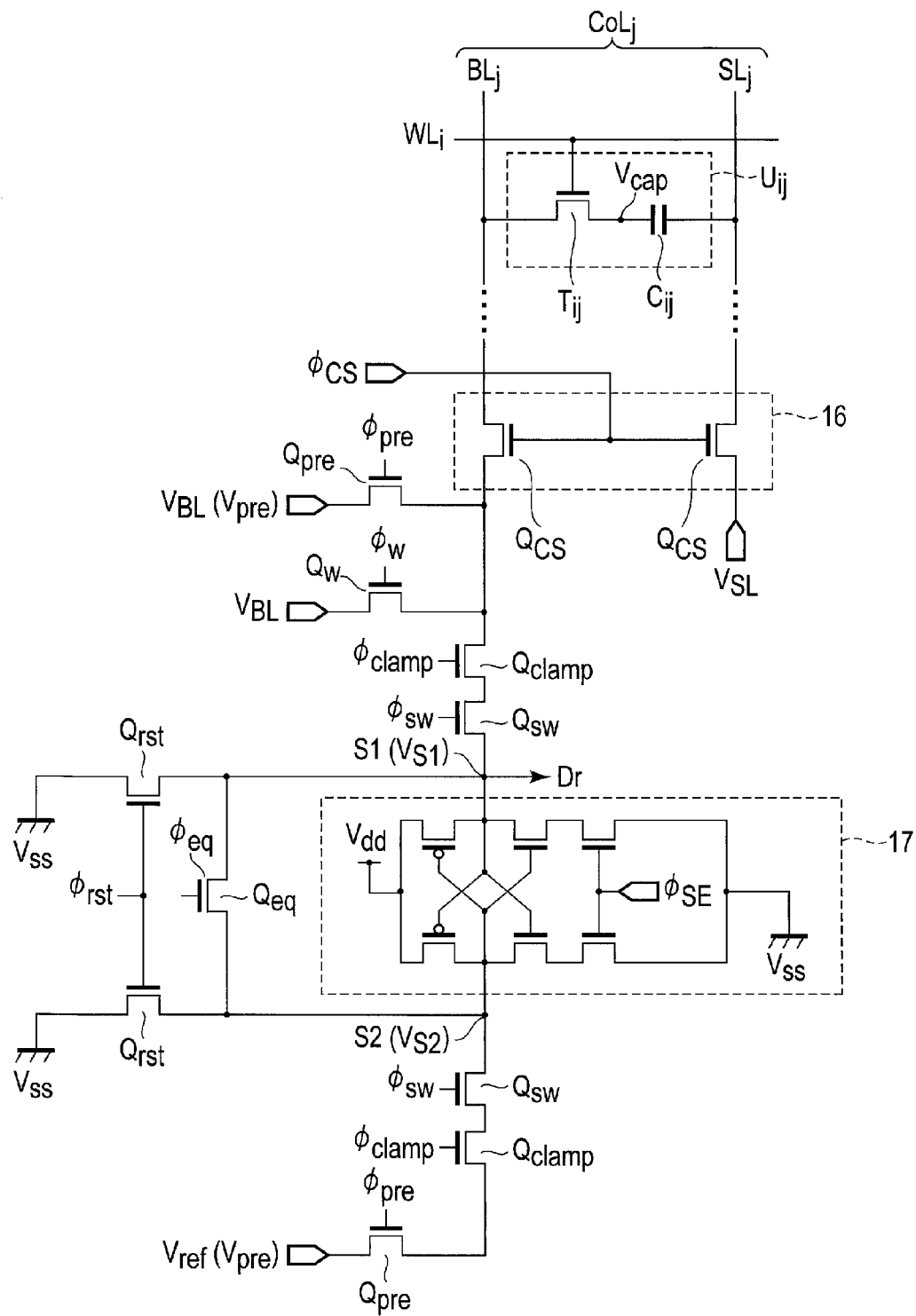
F I G. 23

| Write operation | | | |
|---|---|---|---|
| Equivalent circuit | | Data | $V_{storage}$=variable |
| WL$_i$ (V$_{WL}$), T$_{ij}$, V$_{cap}$, BL$_j$ (V$_{BL}$), C$_{ij}$, V$_{storage}$, SL$_j$ (V$_{SL}$) | | 11 | V$_{W11}$ (e.g, V$_{dd}$) |
| | | 10 | V$_{W10}$ (e.g, $\frac{2}{3}$V$_{dd}$) |
| | | 01 | V$_{W01}$ (e.g, $\frac{1}{3}$V$_{dd}$) |
| | | 00 | V$_{W00}$ (e.g, 0V) |

$V_{W00} < V_{W01} < V_{W10} < V_{W11}$

F I G. 24

| Write operation | | | | |
|---|---|---|---|---|
| Data | $V_{WL}$ | $V_{BL}$ | $V_{SL}$ | $V_{storage}$ $(=V_{BL}-V_{SL})$ |
| 11 | $V_{on\_w}$ | $V_{dd}$ | 0V | $V_{W11}=V_{dd}$ |
| 10 | $V_{on\_w}$ | $V_{dd}$ | $\frac{1}{3}V_{dd}$ | $V_{W10}=\frac{2}{3}V_{dd}$ |
| 01 | $V_{on\_w}$ | $V_{dd}$ | $\frac{2}{3}V_{dd}$ | $V_{W01}=\frac{1}{3}V_{dd}$ |
| 00 | $V_{on\_w}$ | $V_{dd}$ | $V_{dd}$ | $V_{W00}=0V$ |

$V_{on\_w} \geq V_{BL}+V_{th}$

| Read operation | | |
|---|---|---|
| Equivalent circuit | Data determination | $V_{read}$=variable |
| BL_j (V_BL)<br>WL_i (V_WL)—T_ij<br>V_cap—C_ij<br>SL_j (V_SL)<br>V_read | Determination on 11 or 10, and 01 or 00 | $V_{pre}$ (e.g, $\frac{3}{6}V_{dd}$) |
| | Determination on 11 and 10 | $V_{pre}$ (e.g, $\frac{5}{6}V_{dd}$) |
| | Determination on 01 and 00 | $V_{pre}$ (e.g, $\frac{1}{6}V_{dd}$) |
F I G. 27
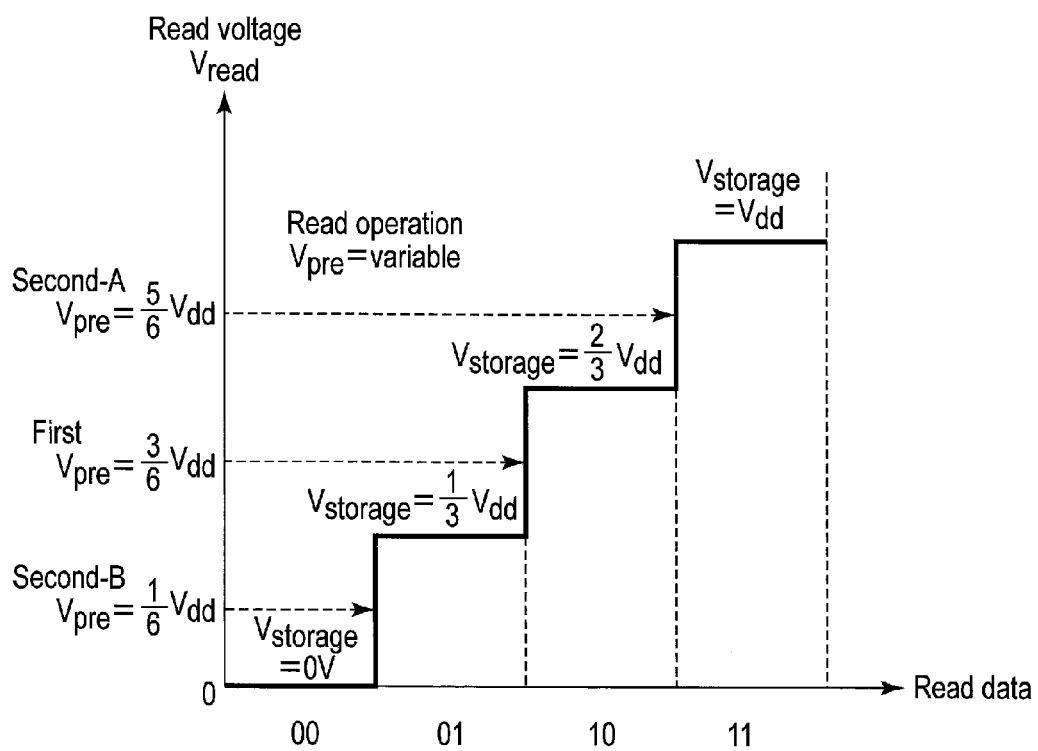
F I G. 28

| Read operation | | | | | |
|---|---|---|---|---|---|
| | Data | $V_{WL}$ | $V_{BL}$ (=$V_{pre}$): Variation of floating | $V_{SL}$ | $V_{read}$ (=$V_{BL}-V_{SL}$) |
| First | 11 or 10 | $V_{on\_r}$ | $\frac{3}{6}V_{dd}$ → Rise | 0V or 0V → ±βV (boost effect) | $V_{pre}=\frac{3}{6}V_{dd}$ |
| First | 01 or 00 | $V_{on\_r}$ | $\frac{3}{6}V_{dd}$ → Fall | 0V or 0V → ±βV (boost effect) | $V_{pre}=\frac{3}{6}V_{dd}$ |
| Second-A | 11 | $V_{on\_r}$ | $\frac{5}{6}V_{dd}$ → Rise | 0V or 0V → ±βV (boost effect) | $V_{pre}=\frac{5}{6}V_{dd}$ |
| Second-A | 10 | $V_{on\_r}$ | $\frac{5}{6}V_{dd}$ → Fall | 0V or 0V → ±βV (boost effect) | $V_{pre}=\frac{5}{6}V_{dd}$ |
| Second-B | 01 | $V_{on\_r}$ | $\frac{1}{6}V_{dd}$ → Rise | 0V or 0V → ±βV (boost effect) | $V_{pre}=\frac{1}{6}V_{dd}$ |
| Second-B | 00 | $V_{on\_r}$ | $\frac{1}{6}V_{dd}$ → Fall | 0V or 0V → ±βV (boost effect) | $V_{pre}=\frac{1}{6}V_{dd}$ |

$V_{on\_r} \geq V_{BL}+V_{th}$

F I G. 29

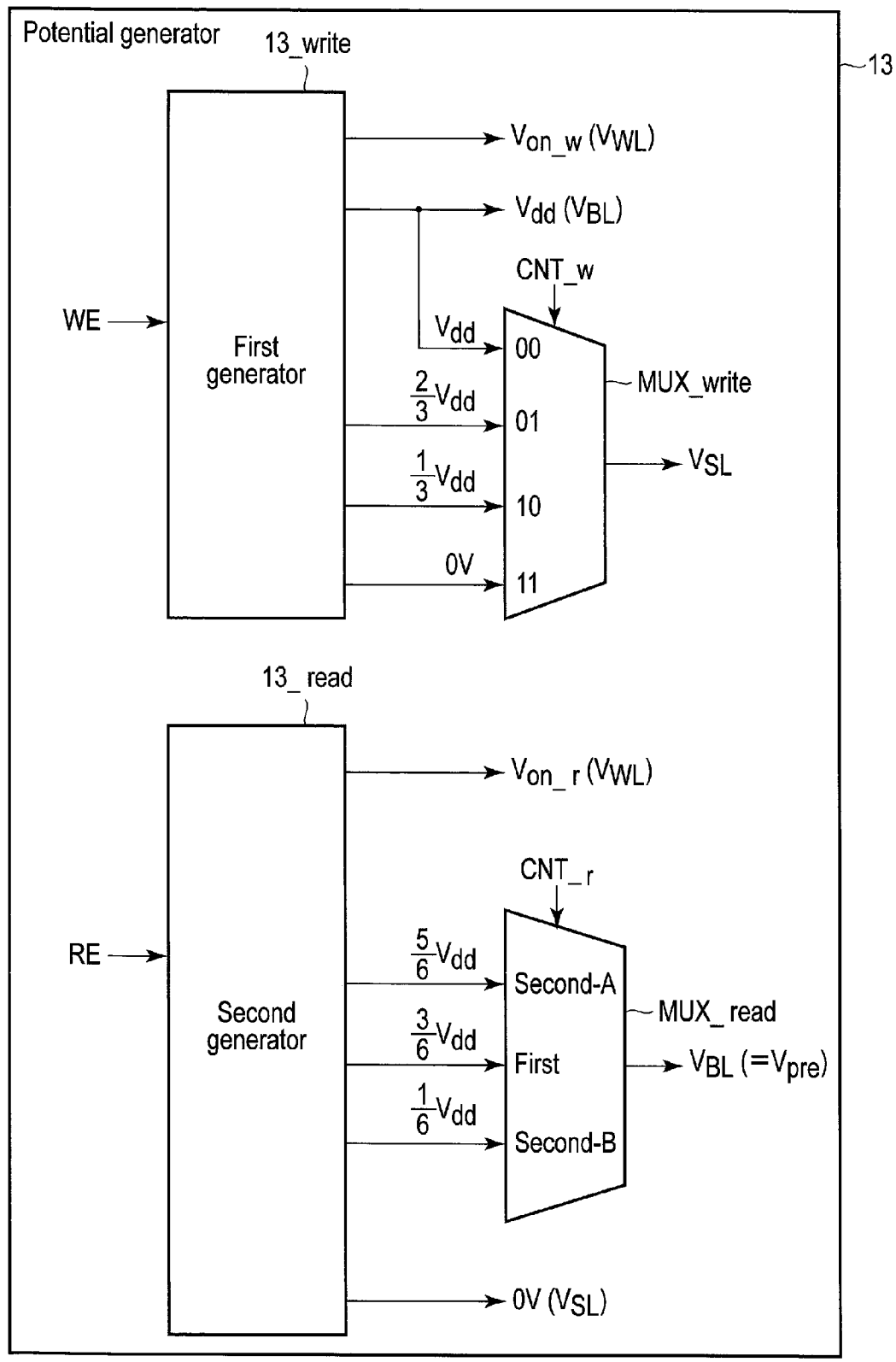
F I G. 30

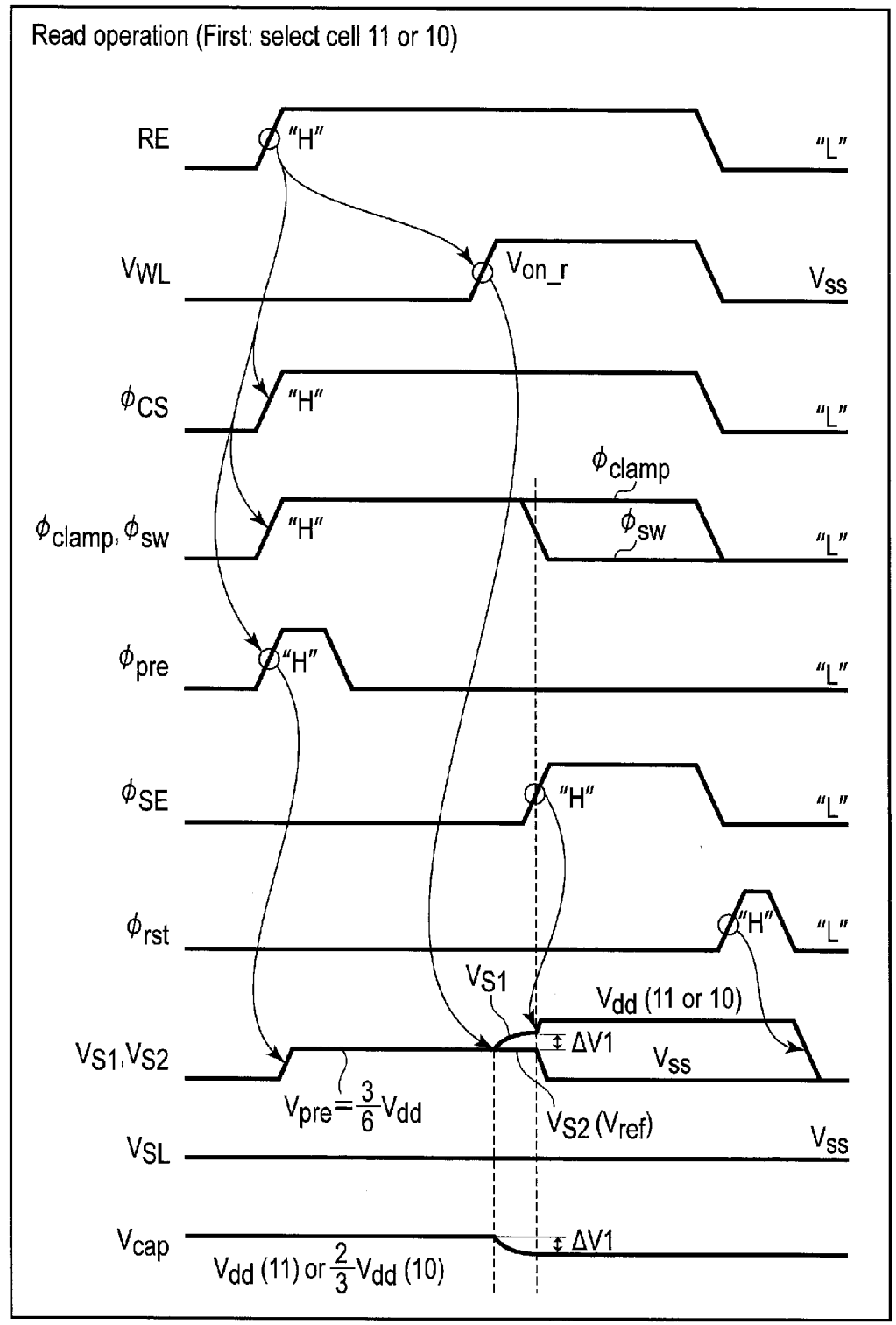
F I G. 32

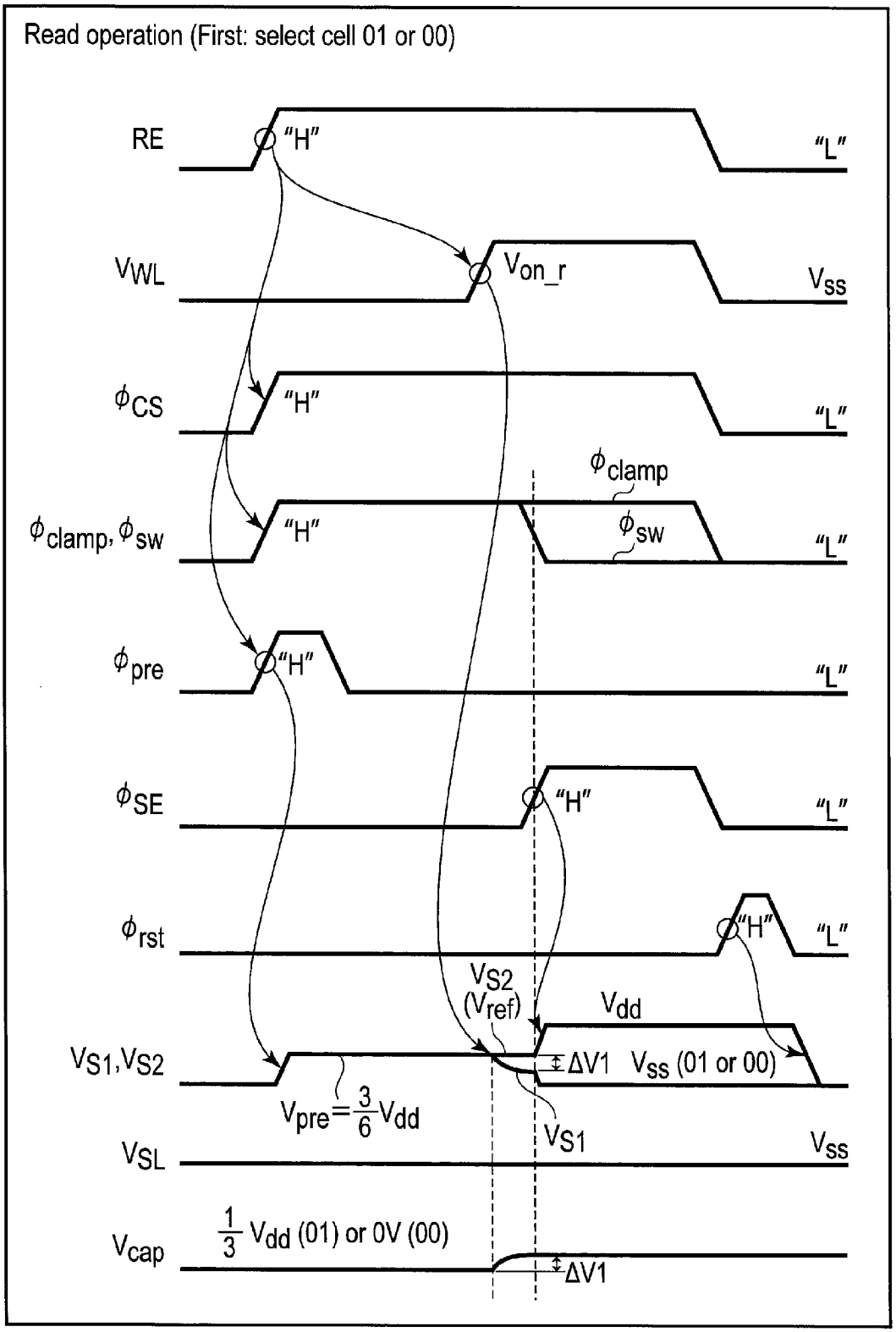
F I G. 33

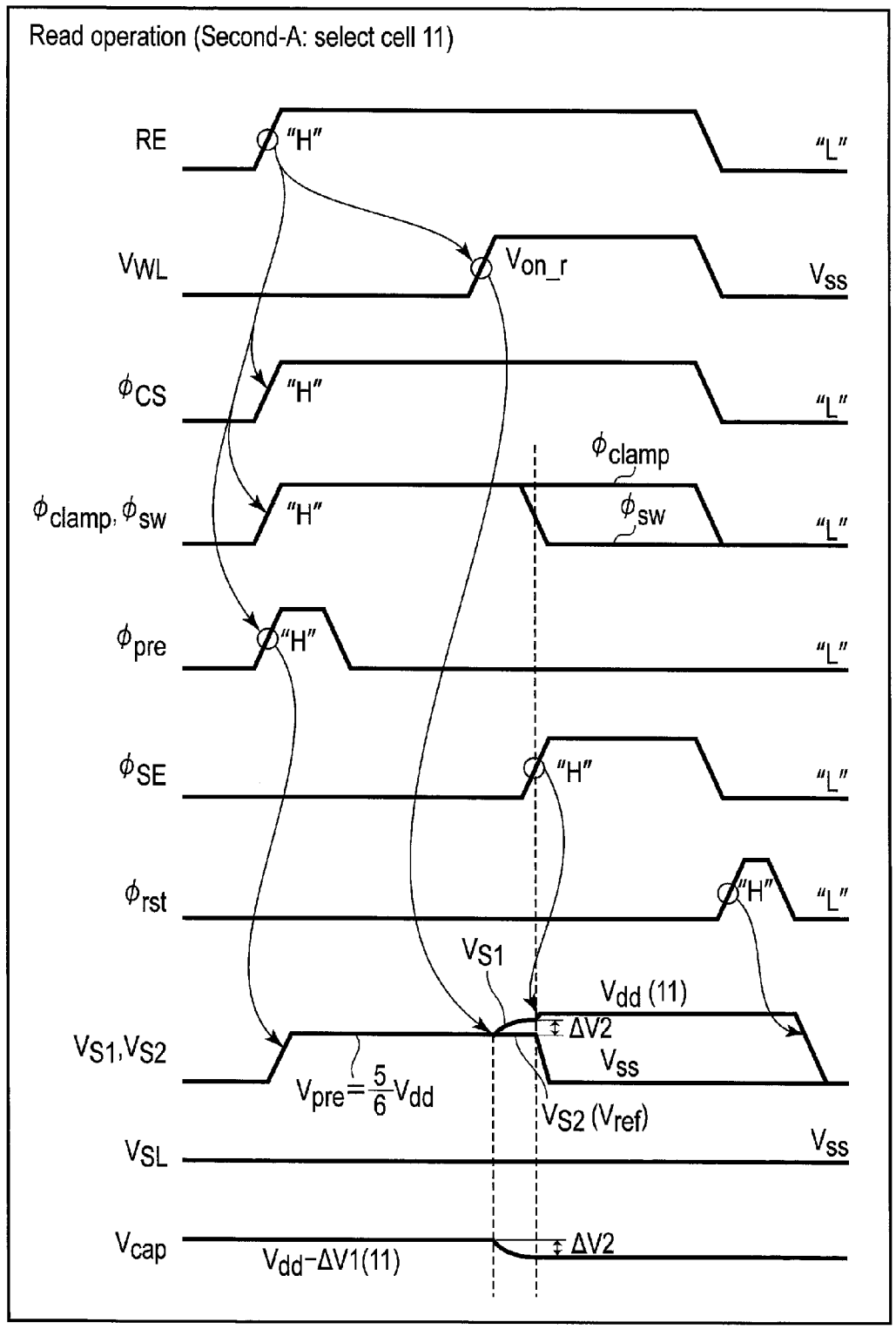
F I G. 34

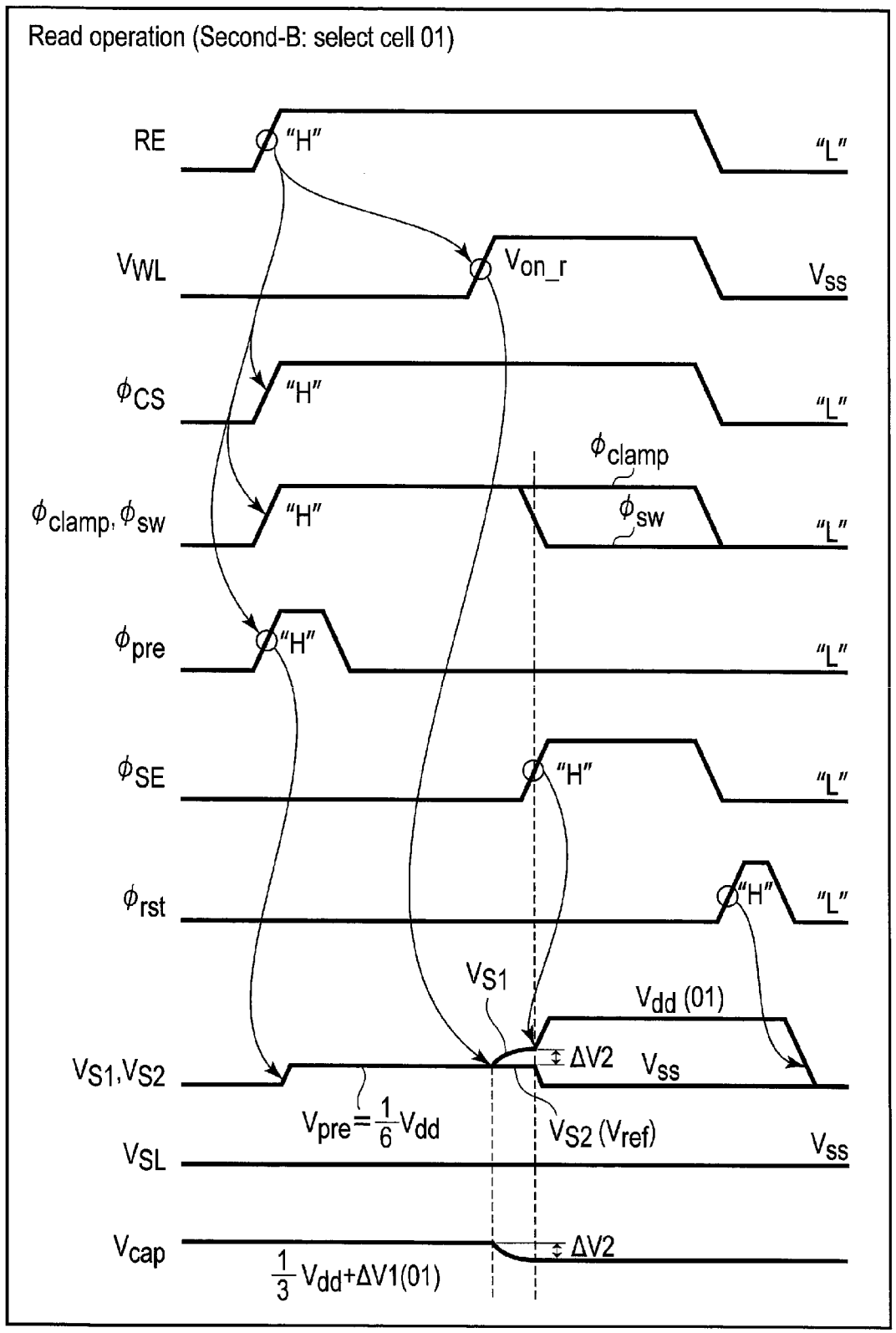
F I G. 36

| Read data | Register Reg.0 | Register Reg.1 | Write-back data |
|---|---|---|---|
| 11 | 1 | 1 | → 11 |
| 10 | 1 | 0 | → 10 |
| 01 | 0 | 1 | → 01 |
| 00 | 0 | 0 | → 00 |

F I G. 40

| Read data | $V_{S10}$ | $V_{S11}$ | $V_{S12}$ | Dr | | Write-back data |
| | | | | Dr0 | Dr1 | |
|---|---|---|---|---|---|---|
| 11 | 1 | 1 | 1 | 1 | 1 | → 11 |
| 10 | 1 | 0 | 1 | 1 | 0 | → 10 |
| 01 | 0 | 0 | 1 | 0 | 1 | → 01 |
| 00 | 0 | 0 | 0 | 0 | 0 | → 00 |

F I G. 45

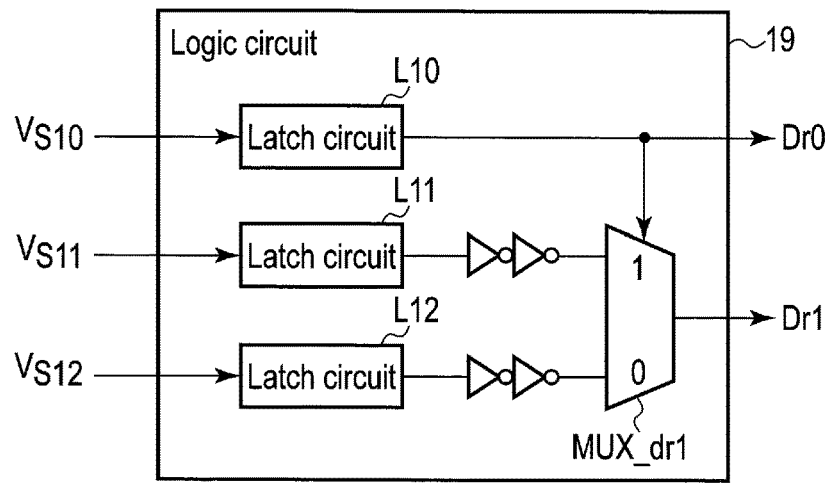
F I G. 42
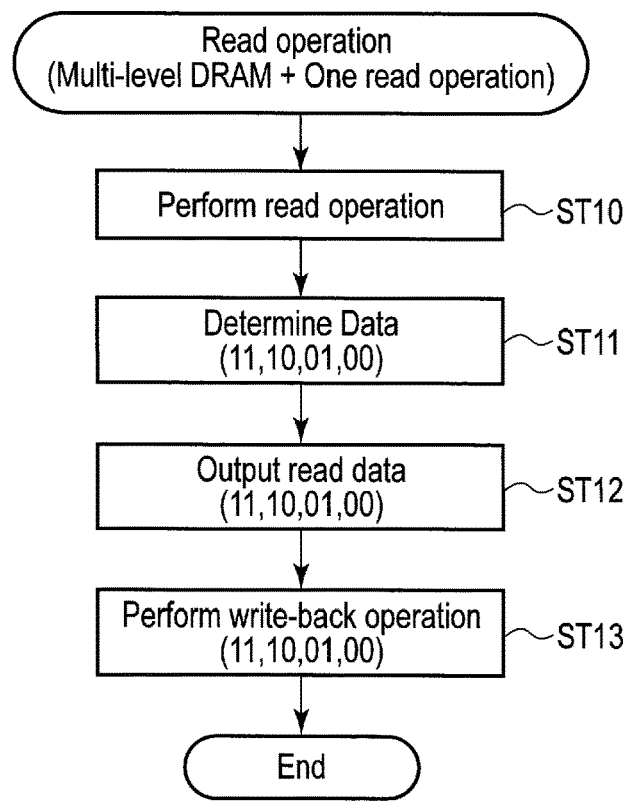
F I G. 43

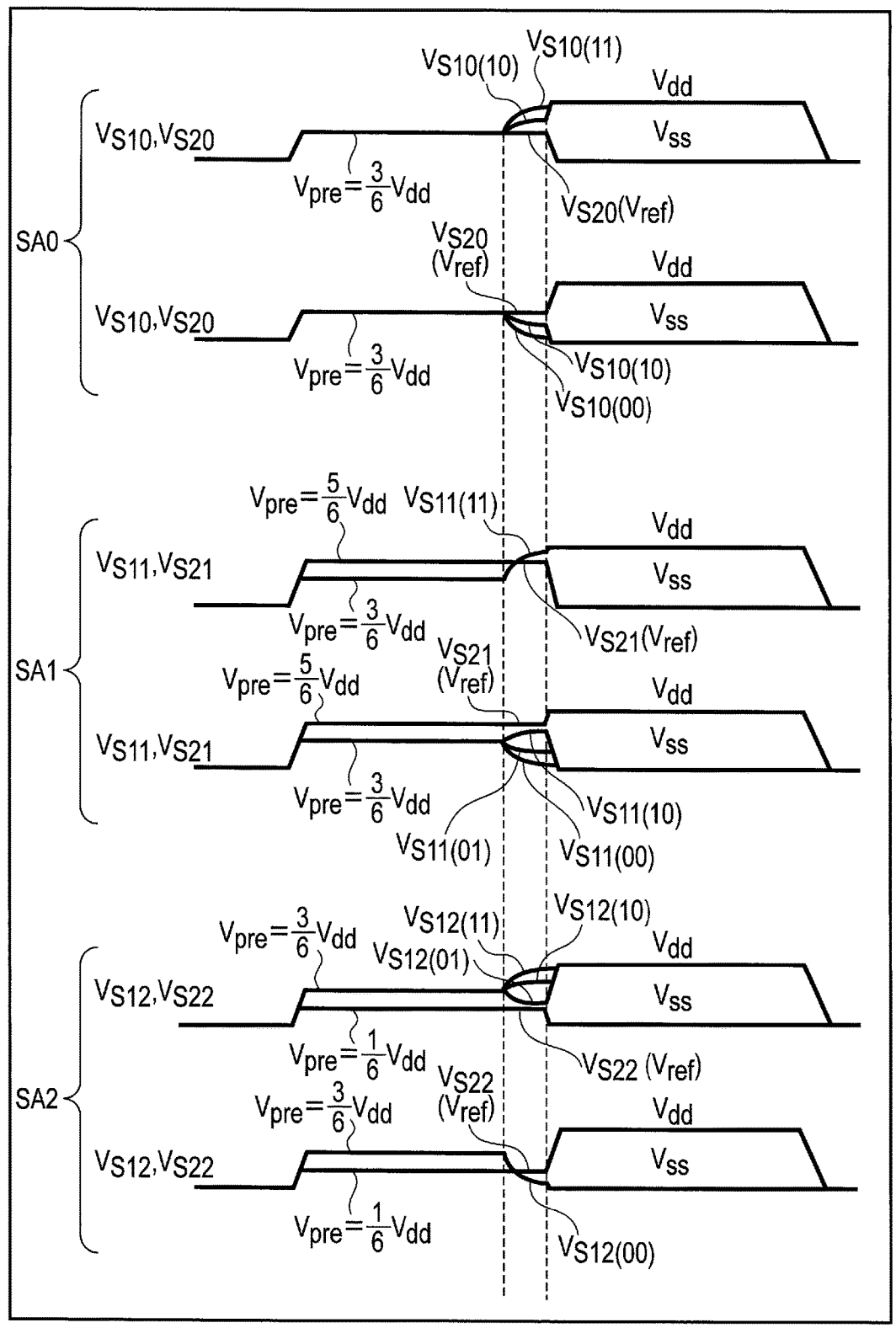
F I G. 44

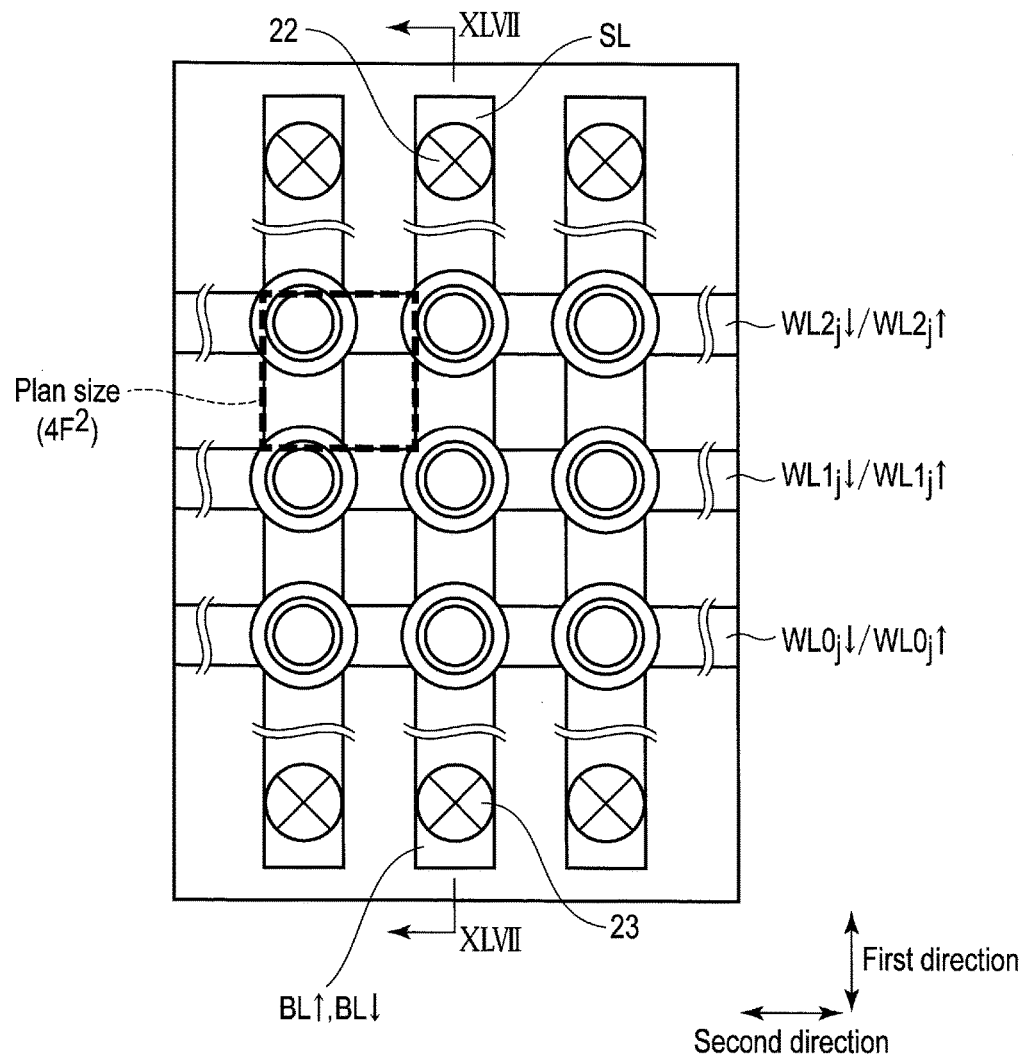
F I G. 46

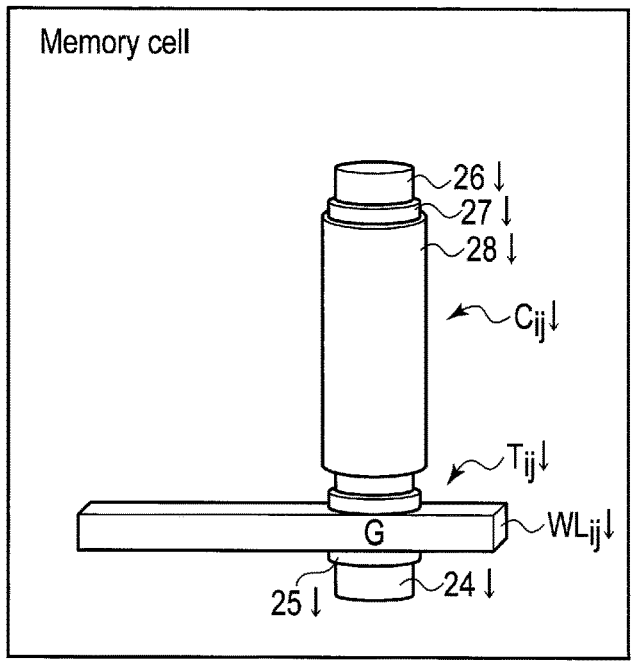
F I G. 48
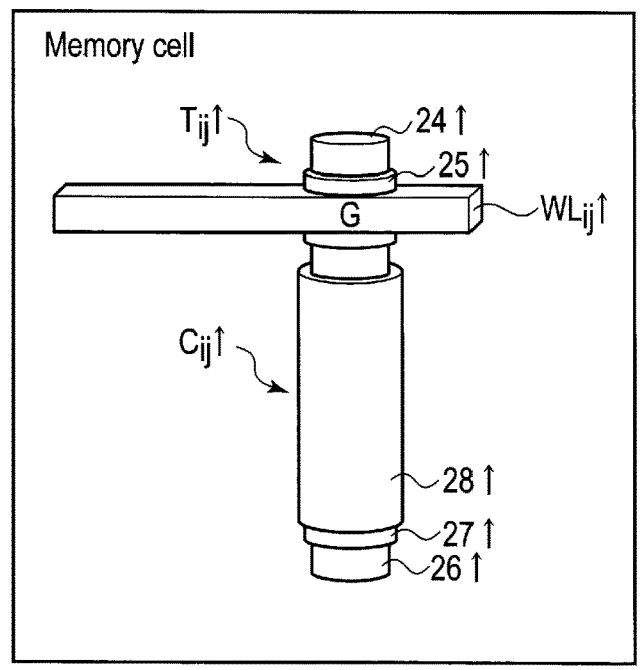
F I G. 49

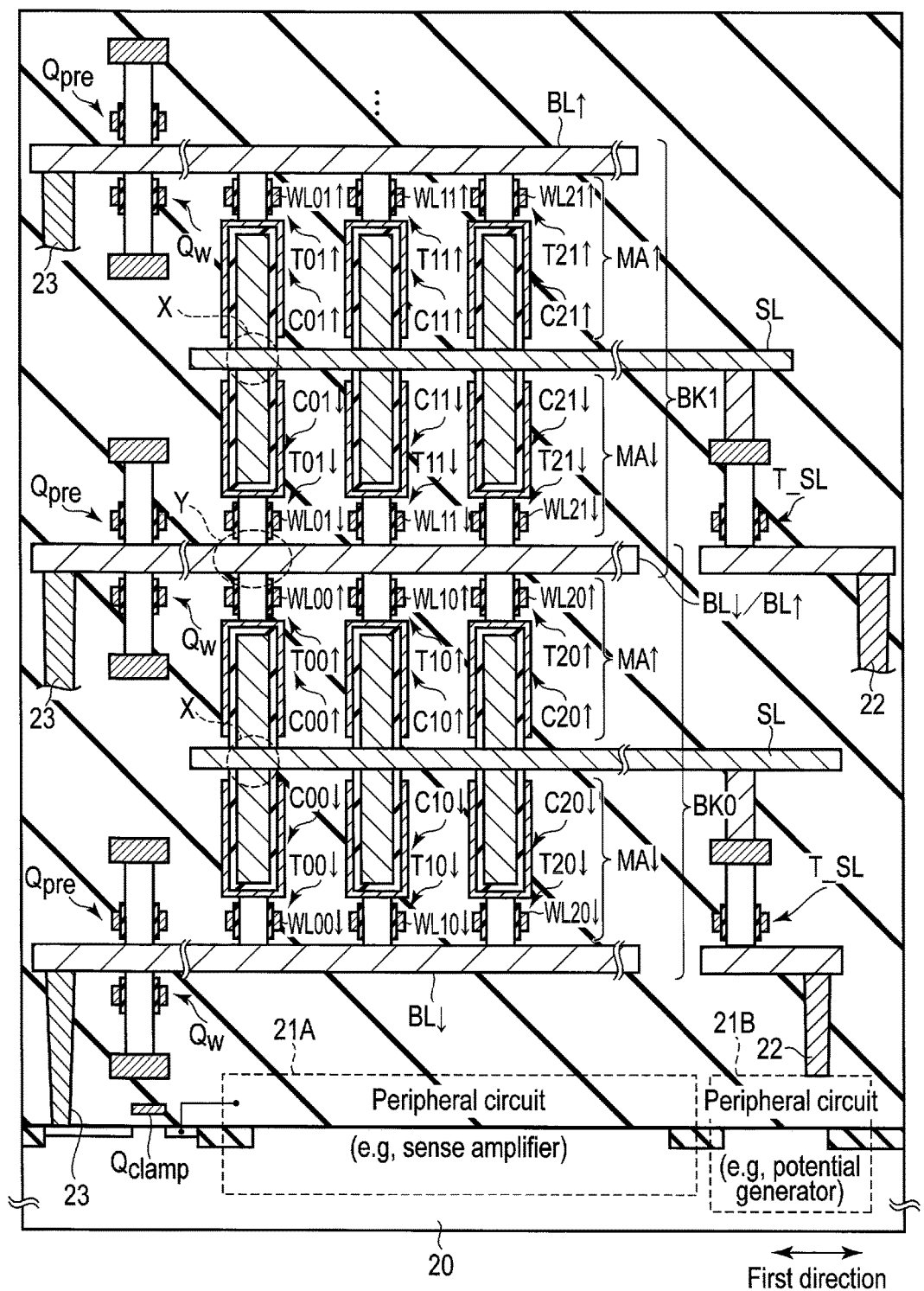
F I G. 52

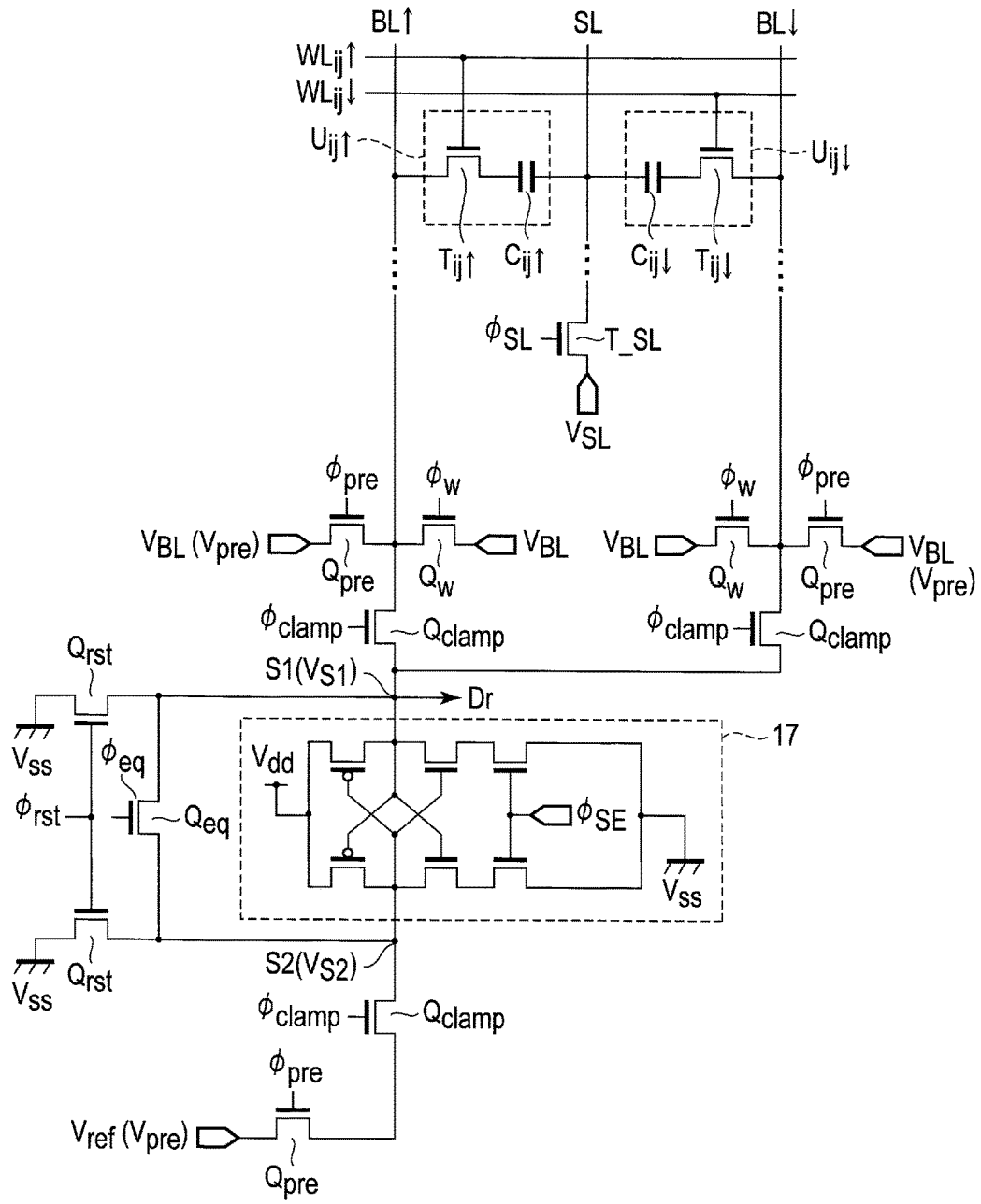
F I G. 54

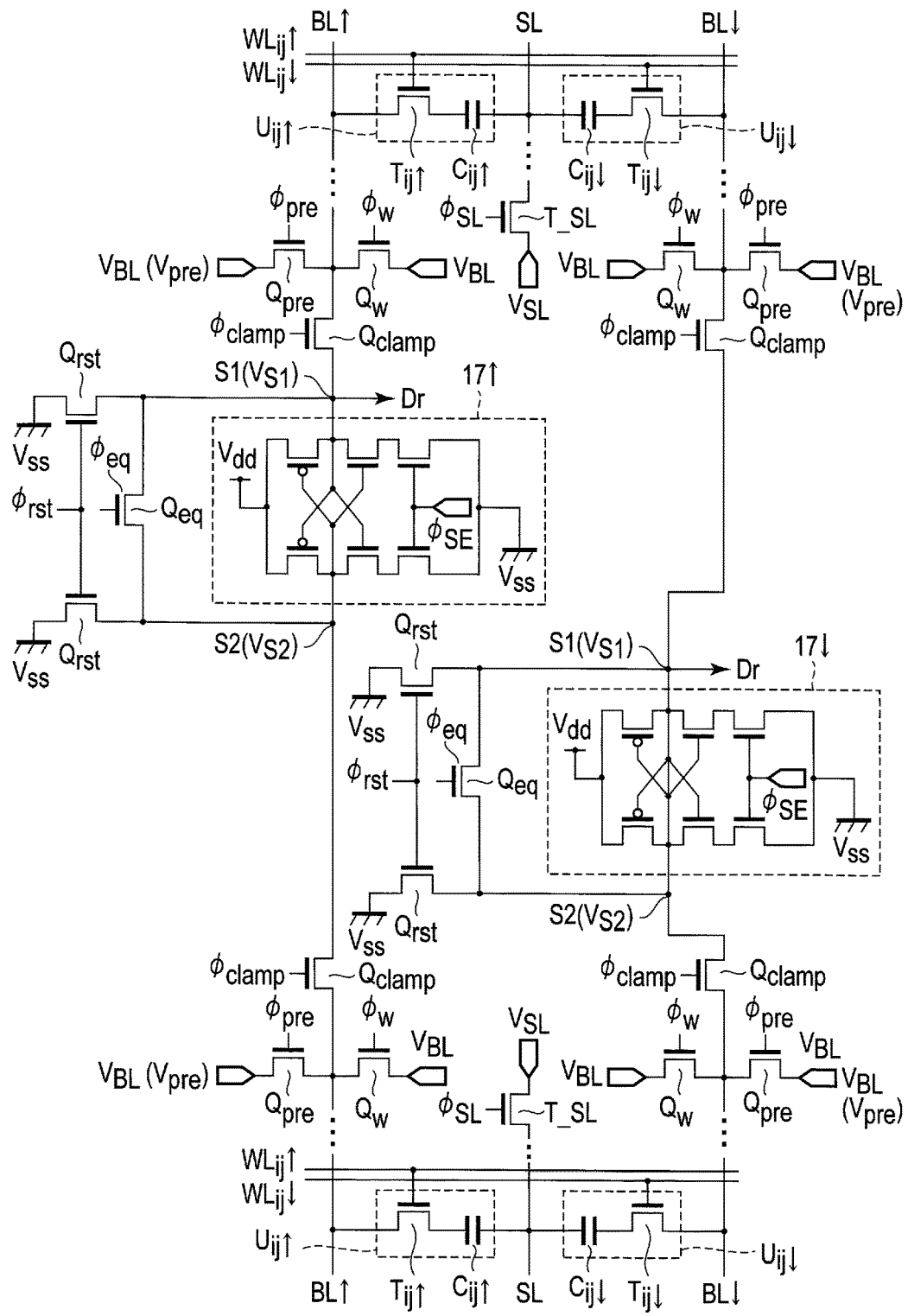
F I G. 57

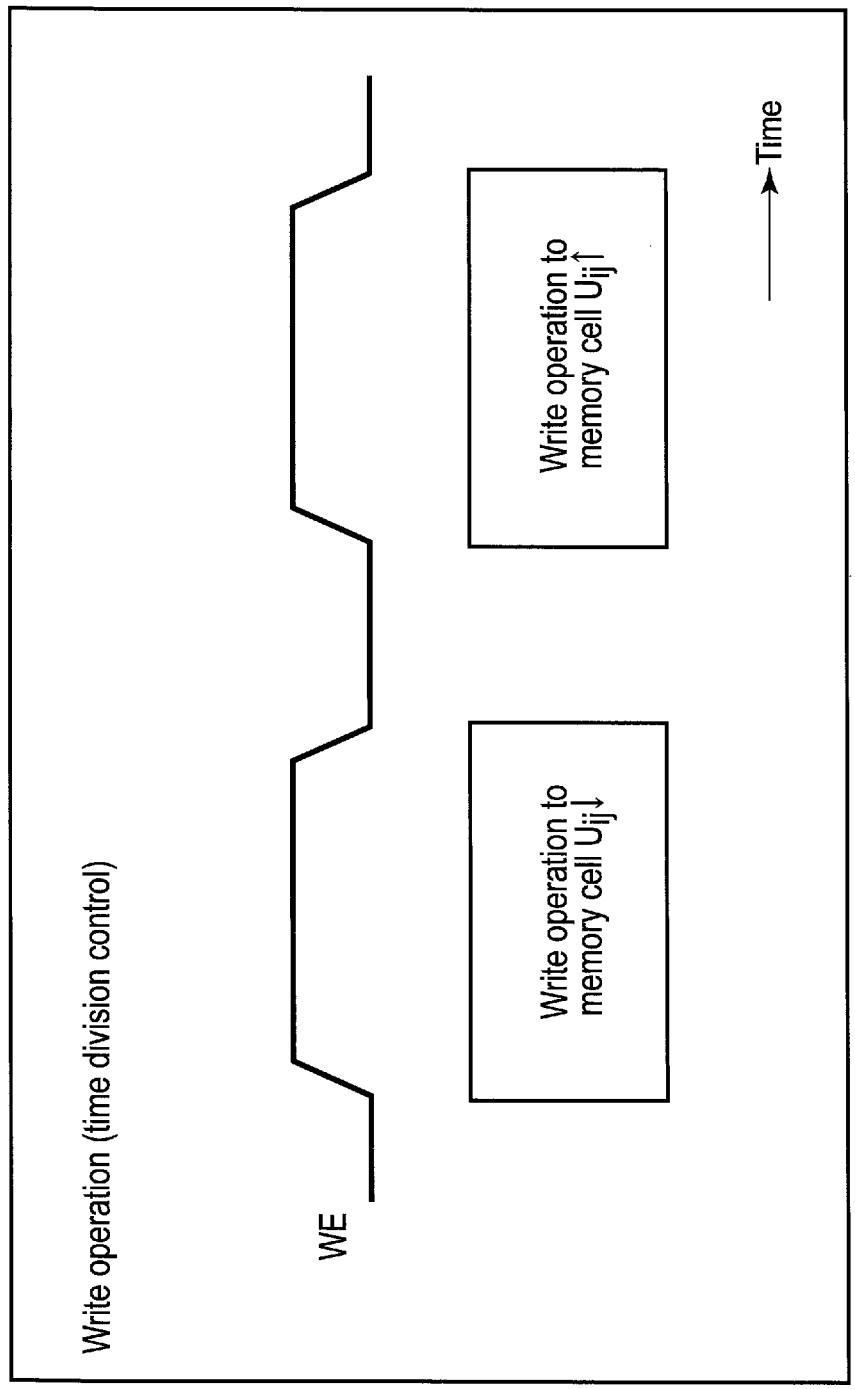
F I G. 58

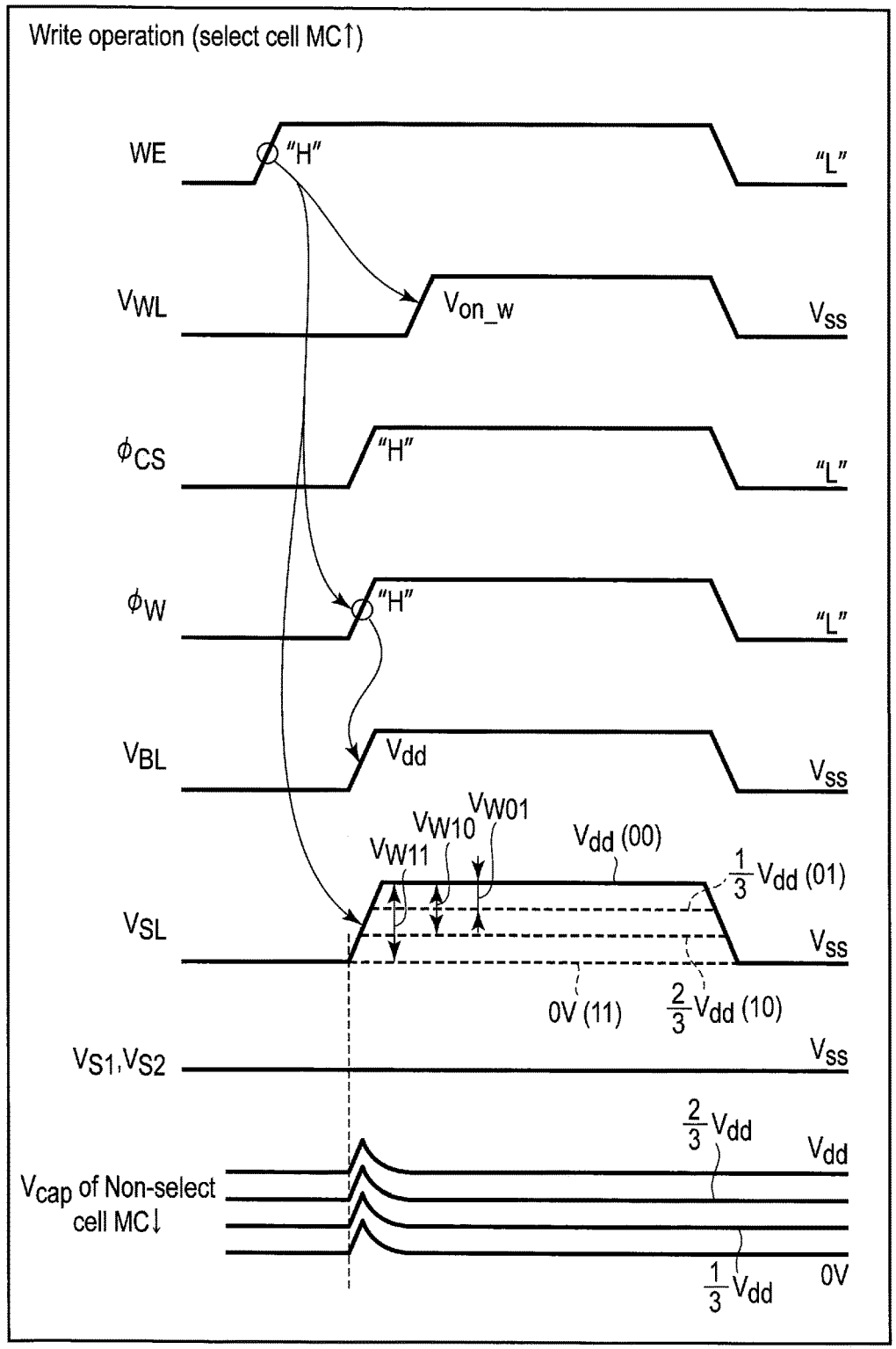
F I G. 59

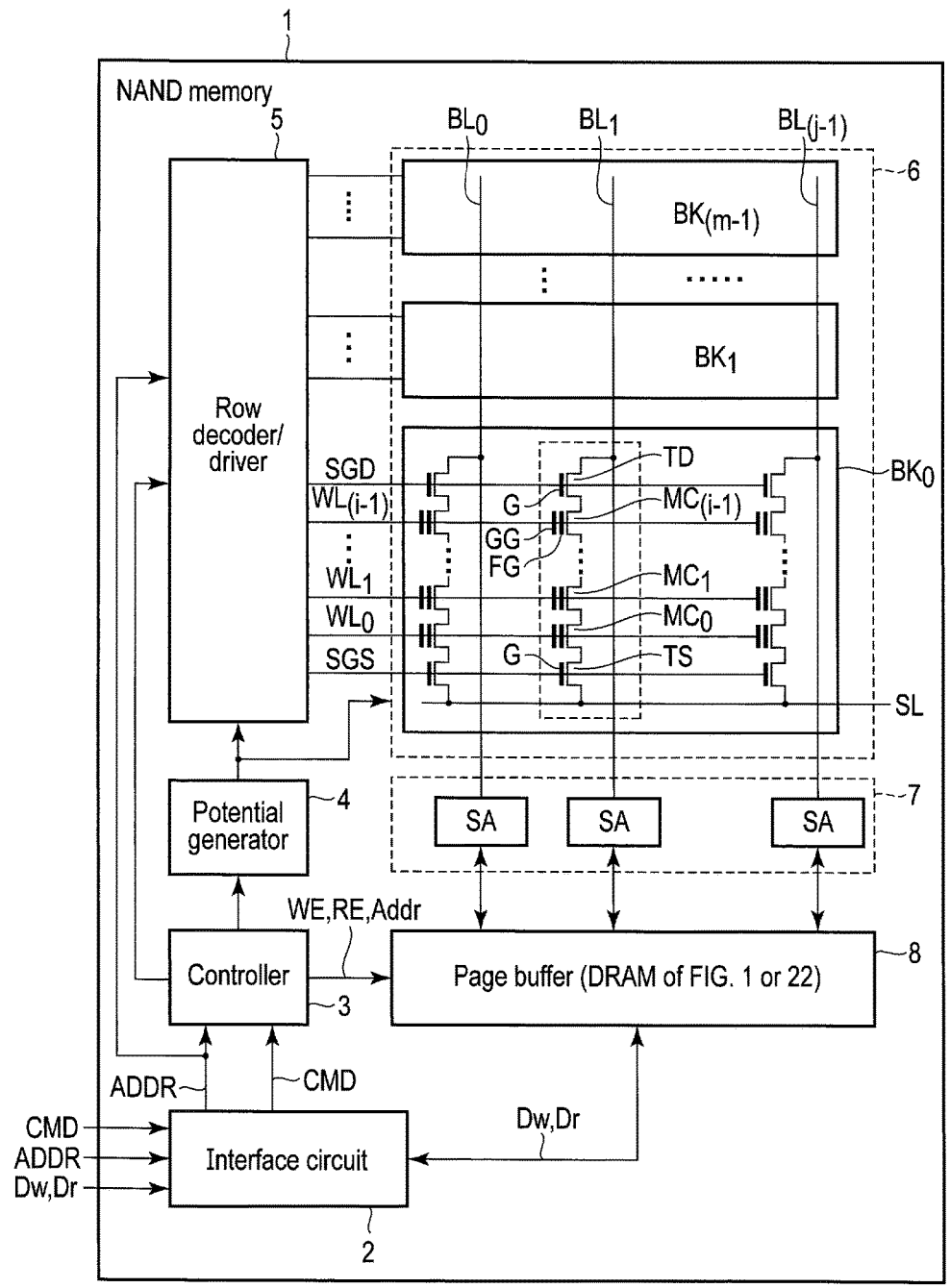
F I G. 60

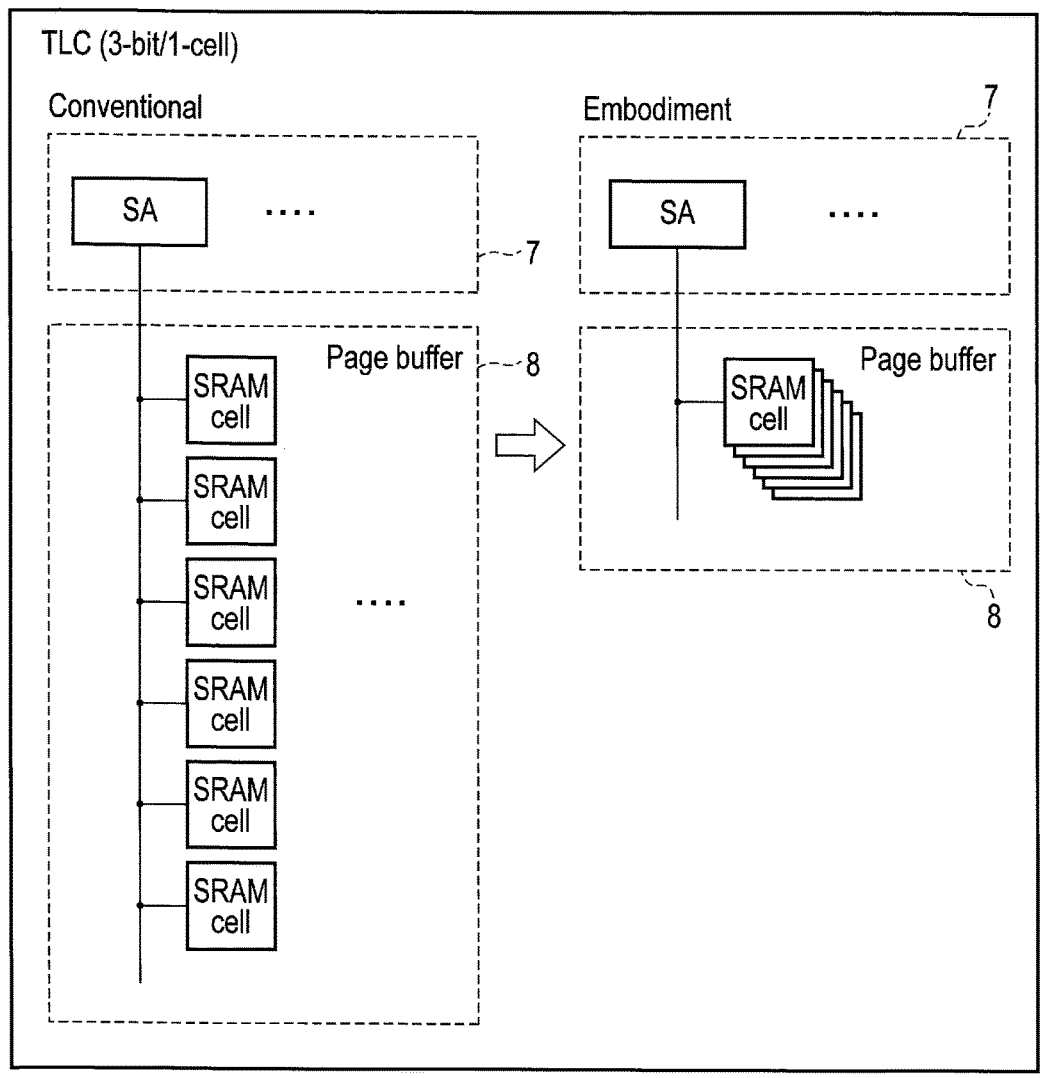
F I G. 61

DYNAMIC RANDOM ACCESS MEMORY (DRAM)

CROSS-REFERENCE TO RELATED APPLICATIONS

This application is based upon and claims the benefit of priority from Japanese Patent Application No. 2016-150474, filed Jul. 29, 2016, the entire contents of which are incorporated herein by reference.

FIELD

Embodiments described herein relate generally to a semiconductor memory device.

BACKGROUND

A dynamic random access memory (DRAM) is used for various memories such as a main memory or a buffer memory of a system. Therefore, high performance and cost reduction of the DRAM are important.

BRIEF DESCRIPTION OF THE DRAWINGS

FIG. 1 is a block diagram of a DRAM;
FIG. 3 is a circuit diagram illustrating an example of a peripheral circuit;
FIG. 4 is a circuit diagram illustrating an example of the peripheral circuit;
FIG. 7 is a diagram illustrating an example of determining $V_{storage}$;
FIG. 8 is a diagram illustrating an example of a read operation;
FIG. 11 is a diagram illustrating an example of a potential generator;
FIG. 12 is a diagram illustrating an example of operation waveforms of the write operation;
FIG. 14 is a diagram illustrating an example of the operation waveforms of the read operation;
FIG. 20 is a diagram illustrating a modification of the operation waveforms of FIGS. 13 to 16;
FIG. 23 is a circuit diagram illustrating a modification of FIG. 3;
FIG. 24 is a diagram illustrating an example of the write operation;
FIG. 27 is a diagram illustrating an example of the read operation;
FIG. 28 is a diagram illustrating a relation between the read data and the read voltage;
FIG. 29 is a diagram illustrating an example of determining $V_{read}$;
FIG. 30 is a diagram illustrating an example of the potential generator;
FIG. 32 is a diagram illustrating an example of operation waveforms of a first read operation;
FIG. 33 is a diagram illustrating an example of the operation waveforms of the first read operation;
FIG. 34 is a diagram illustrating an example of operation waveforms of a second-A read operation;
FIG. 36 is a diagram illustrating an example of operation waveforms of a second-B read operation;
FIG. 40 is a diagram illustrating data stored in a register in twice read;
FIG. 42 is a diagram illustrating an example of a logic circuit of FIG. 41;
FIG. 43 is a flowchart illustrating a flow of Multi-level DRAM+once reading;
FIG. 44 is a diagram illustrating operation waveforms of the sense amplifiers which are used in once reading;
FIG. 45 is a diagram illustrating an example of data output from the sense amplifier in once reading;
FIG. 46 is a plan view of a three-dimensional DRAM;
FIG. 48 is a perspective view illustrating an exemplary structure of a memory cell;
FIG. 49 is a perspective view illustrating an exemplary structure of the memory cell;
FIG. 52 is a cross-sectional view illustrating a modification of a device structure of FIG. 47;
FIG. 54 is a circuit diagram illustrating an example of the peripheral circuit.

FIG. 57 is a circuit diagram illustrating an example of the peripheral circuit;

FIG. 58 is a diagram illustrating an example of the write operation of two memory cells which share the source line;

FIG. 59 is a diagram for describing an influence of a potential change of the source line onto a non-select cell;

FIG. 60 is a diagram illustrating an application to a page buffer of a NAND memory; and FIG. 61 is a diagram for describing an area reduction effect of the page buffer.

DETAILED DESCRIPTION

Figure 2:
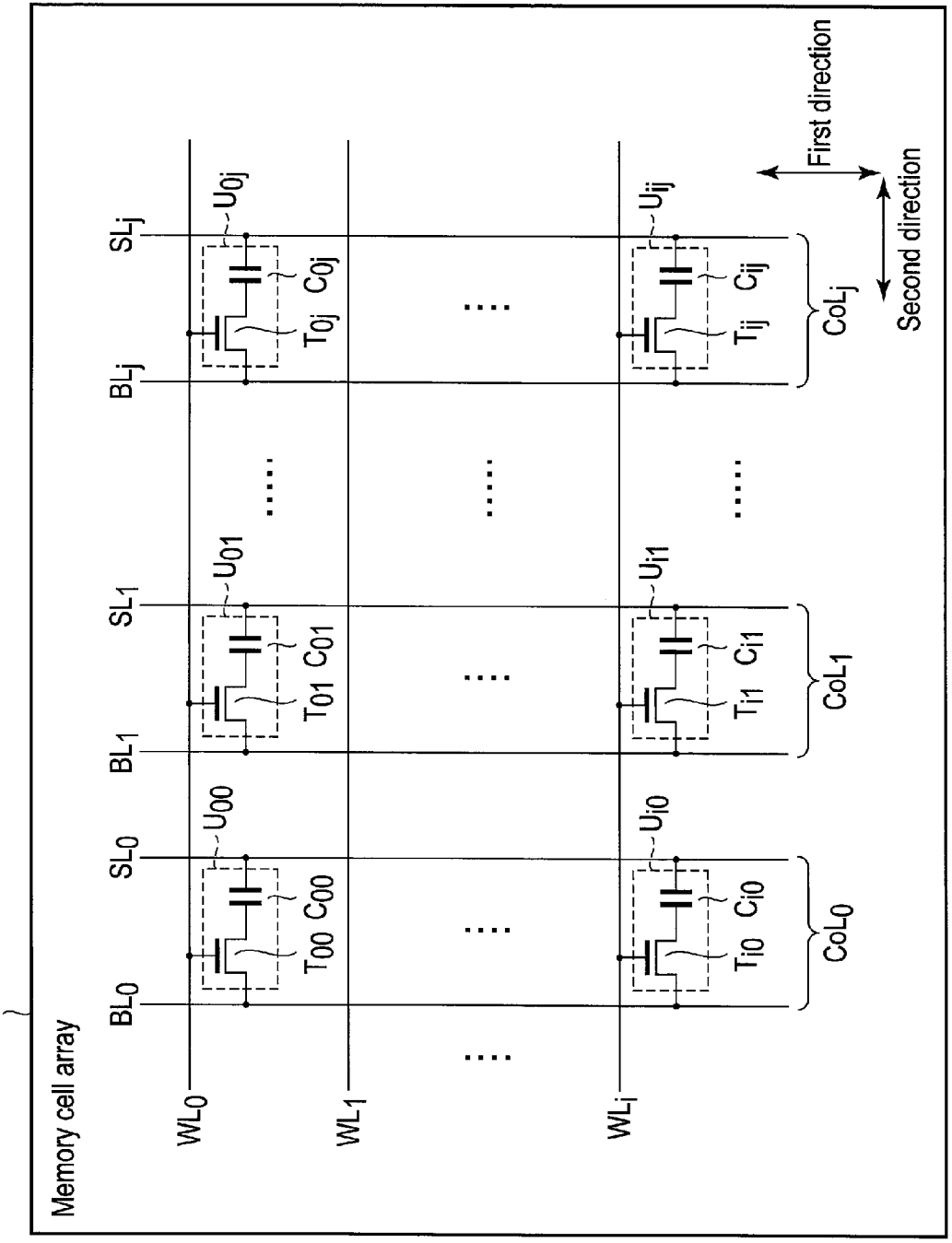
FIG. 2 is a circuit diagram illustrating an example of a memory cell array.

In general, according to one embodiment, a semiconductor memory device comprises: a first memory cell that includes first capacitor which includes first and second electrodes, and a first transistor which includes a first current path containing first and second terminals and a first control terminal to turn on/off the first current path, the first terminal is connected to the first electrode; a first conductive line connected to the second terminal; a second conductive line connected to the second electrode; a third conductive line connected to the first control terminal; a first sense amplifier; a first switch element connected between the first conductive line and the first sense amplifier; and a controller turning off the first switch element in a first write operation, applies a first potential to the first conductive line, and sets a potential of the second conductive line according to a value of first write data to be written to the first memory cell.

Hereinafter, embodiments will be described with reference to the drawings.

(Block Diagram)

FIG. 1 is a block diagram of a DRAM according to an embodiment.

A DRAM 10 includes an interface circuit 11, a controller 12, a potential generator 13, a row decoder/driver 14, a column decoder 15, a column selector 16, a sense amplifier 17, and a memory cell array 18.

A write enable signal WE, a read enable signal RE, an address signal Addr, and write data Dw are input from the outside of the DRAM 10 to the interface circuit 11. Read data Dr is output from the interface circuit 11 to the outside of the DRAM 10.

The write enable signal WE, the read enable signal RE, and the write data Dw are transferred from the interface circuit 11 to the controller 12.

The controller 12 controls the operations of the potential generator 13, the row decoder/driver 14, the column decoder 15, and the sense amplifier 17.

For example, when receiving the write enable signal WE, the controller 12 sets the potential generator 13, the row decoder/driver 14, and the column decoder 15 to an operating state, and sets the sense amplifier 17 to a non-operating state. In addition, the controller 12 instructs the potential generator 13 to generate a plurality of potentials $V_{WL}$, $V_{BL}$, and $V_{SL}$ which are required for a write operation.

In addition, for example, the controller 12 sets the potential generator 13, the row decoder/driver 14, the column decoder 15, and the sense amplifier 17 to the operating state when receiving the read enable signal RE. In addition, the controller 12 instructs the potential generator 13 to generate the plurality of potentials $V_{WL}$, $V_{BL}$, and $V_{SL}$ which are required for a read operation.

The address signal Addr is transferred from the interface circuit 11 to the row decoder/driver 14 and the column decoder 15.

The row decoder/driver 14 selects a word line WL on the basis of the address signal Addr, and transfers the potential $V_{WL}$ from the potential generator 13 to the word line WL. The column decoder 15 selects a bit line BL and a source line SL using the column selector 16 on the basis of the address signal Addr. The potentials $V_{BL}$ and $V_{SL}$ from the potential generator 13 are transferred to the bit line BL and the source line SL through the column selector 16.

A memory cell $U_{ij}$ includes a capacitor $C_{ij}$ and a transistor (FET: Field Effect Transistor) $T_{ij}$.

For example, as illustrated in FIG. 2, the memory cell $U_{ij}$ includes the capacitor $C_{ij}$ and the transistor $T_{ij}$ which are connected in series. In this case, i and j are 0, 1, 2, . . . and so on.

The capacitor $C_{ij}$ includes first and second electrodes, and the transistor $T_{ij}$ includes a current path in which first and second terminals are present, and a control terminal which controls turning On/Off of the current path. The first terminal of the transistor $T_{ij}$ is connected to the first electrode of the capacitor $C_{ij}$.

A bit line $BL_j$ is connected to the second terminal of the transistor $T_{ij}$, and extends in a first direction. A source line $SL_j$ is connected to the second electrode of the capacitor $C_{ij}$, and extends in the first direction. A word line $WL_i$ is connected to the control terminal of the transistor $T_{ij}$, and extends in a second direction intersecting with the first direction.

An important point herein is that the source line $SL_j$ is independently provided for each column $CoL_j$, and the bit line $BL_j$ and the source line $SL_j$ extend in parallel with each other. In addition, in such a layout, the write operation is performed, for example, such that a fixed potential (for example, a power source potential $V_{dd}$) $V_{BL}$ is applied to the bit line $BL_j$, and the potential $V_{SL}$ of the source line $SL_j$ is changed according to a value of the write data Dw.

For example, in a case where 1-bit data (0 or 1) is written to the memory cell $U_{ij}$, the potential $V_{SL}$ of the source line $SL_j$ may be set to $V_{dd}$ when the write data is "0", and the potential $V_{SL}$ of the source line $SL_j$ may be set to $V_{ss}$ (0V) when the write data is "1".

In addition, in a case where 2-bit data (00, 01, 10, or 11) is written to the memory cell $U_{ij}$, the potential $V_{SL}$ of the source line $SL_j$ may be set to $V_{dd}$ when the write data is "00", the potential $V_{SL}$ of the source line $SL_j$ may be set to $(\frac{1}{3}) \times V_{dd}$ when the write data is "01", the potential $V_{SL}$ of the source line $SL_j$ may be set to $(\frac{2}{3}) \times V_{dd}$ when the write data is "10", and the potential $V_{SL}$ of the source line $SL_j$ may be set to $V_{dd}$ when the write data is "11".

In general, in a case where n-bit data is written to the memory cell $U_{ij}$, $2^n$ potentials (that is, a first potential, a second potential, a third potential, . . . , and a $2^n$-th potential) are prepared in accordance with $2^n$ write data, and one of them may be set to the potential $V_{SL}$ of the source line $SL_j$. In this case, "n" is a natural number, the $2^n$ potentials (that is, the first potential, the second potential, the third potential, . . . , and the $2^n$-th potential) are different from each other.

(Peripheral Circuit)

FIGS. 3 and 4 illustrate examples of a peripheral circuit in which the column selector and the sense amplifier are included.

The memory cell $U_{ij}$, the capacitor $C_{ij}$, the transistor $T_{ij}$, the word line $WL_i$, the bit line $BL_j$, and the source line $SL_j$ correspond to the memory cell $U_{ij}$, the capacitor $C_{ij}$, the transistor $T_{ij}$, the word line $WL_i$, the bit line $BL_j$, and the source line $SL_j$ illustrated in FIGS. 1 and 2.

The column selector 16 includes a transistor (for example, an N-channel FET) $Q_{CS}$ as a select element which selects the column $CoL_j$. The transistor $Q_{CS}$ is turned on when a select signal $\varphi_{CS}$ from the column decoder 15 of FIG. 1 is active (for example, a high level), and turned off when the select signal $\varphi_{CS}$ is non-active (for example, a low level).

In a case where the transistor $Q_{CS}$ is turned on, the potential $V_{SL}$ from the potential generator 13 of FIG. 1 is applied to the source line $SL_j$.

$Q_w$ is a transistor (for example, the N-channel FET) for applying the potential $V_{BL}$ from the potential generator 13 of FIG. 1 to the bit line $BL_j$ in the write operation. The potential $V_{BL}$ in the write operation is, for example, a fixed potential (for example, the power source potential $V_{dd}$) as described above. Therefore, when the control signal $\varphi_w$ from the controller 12 of FIG. 1 becomes active (for example, the high level) in the write operation, a transistor $Q_w$ is turned on and the fixed potential $V_{BL}$ is transferred to the bit line $BL_j$. In addition, when the control signal $\varphi_w$ becomes non-active (for example, the low level), the transistor $Q_w$ is turned off.

$Q_{pre}$ is a transistor (for example, the N-channel FET) for applying the potential $V_{BL}$ from the potential generator 13 of FIG. 1 to the bit line $BL_j$ as a precharge potential in the read operation. In the read operation, when a control signal $\varphi_{pre}$ from the controller 12 of FIG. 1 becomes active (for example, the high level), the transistor $Q_{pre}$ is turned on and the potential $V_{BL}$ is transferred to the bit line $BL_j$. In addition, when the control signal $\varphi_{pre}$ becomes non-active (for example, the low level), the transistor $Q_{pre}$ is turned off.

$Q_{clamp}$ serves as a switch element (clamp circuit) for electrically connecting the bit line $BL_j$ to the sense amplifier 17 in the read operation. $Q_{clamp}$ is, for example, the N-channel FET. In the read operation, when a control signal $\varphi_{clamp}$ from the controller 12 of FIG. 1 becomes active (for example, the high level), the transistor $Q_{clamp}$ is turned on, and the bit line $BL_j$ and the sense amplifier 17 are electrically connected to each other. In addition, when the control signal $\varphi_{clamp}$ becomes non-active (for example, the low level), the transistor $Q_{clamp}$ is turned off.

The transistor $Q_{clamp}$ is turned off in the write operation. In other words, the sense amplifier 17 is not used in the write operation. The reason is that the write operation is performed by setting the potential $V_{BL}$ of the bit line $BL_j$ to a fixed potential, and by changing the potential $V_{SL}$ of the source line $SL_j$. However, rewriting (write-back) of the read data in the read operation (Single-level DRAM) is omitted.

The details of the write operation and the read operation will be described below.

The sense amplifier 17 includes an SRAM (static random access memory) cell (that is, two inverter circuits which are connected in a flip-flop fashion). When a control signal (sense amplifier enable signal) $\varphi_{SE}$ from the controller 12 of FIG. 1 becomes active (for example, the high level), the sense amplifier 17 enters the operating state. In addition, when the control signal $\varphi_{SE}$ becomes non-active (for example, the low level), the sense amplifier 17 enters the non-operating state.

The sense amplifier 17 includes two input/output nodes S1 and S2. The read data Dr is output from the input/output node S1 for example.

$Q_{eq}$ is a transistor (equalize circuit) which equalizes potentials $V_{S1}$ and $V_{S2}$ at two input/output nodes S1 and S2. $Q_{eq}$ is, for example, the N-channel FET. When a control signal $\varphi_{eq}$ from the controller 12 of FIG. 1 becomes active (for example, the high level), a transistor $Q_{eq}$ is turned on, and the potentials $V_{S1}$ and $V_{S2}$ at two input/output nodes S1 and S2 are equalized. When the control signal $\varphi_{eg}$ becomes non-active (for example, the low level), the transistor $Q_{eq}$ is turned off.

$Q_{rst}$ is a transistor (for example, the N-channel FET) which resets the potentials $V_{S1}$ and $V_{S2}$ at two input/output nodes S1 and S2. When a control signal $\varphi_{rst}$ from the controller 12 of FIG. 1 becomes active (for example, the high level), a transistor $Q_{rst}$ is turned on, and the potentials $V_{S1}$ and $V_{S2}$ at two input/output nodes S1 and S2 are reset. When the control signal $\varphi_{rst}$ becomes non-active (for example, the low level), the transistor $Q_{rst}$ is turned off.

The sense amplifier 17 of FIG. 3 corresponds to a single-level DRAM of a 1-cell/1-bit type to store the 1-bit data in one memory cell $U_{ij}$, or a multi-level DRAM to store the n-bit data ("n" is a natural number of 2 or more) in one memory cell $U_{ij}$. Therefore, a reference voltage $V_{ref}$ used in the read operation is applied to the input/output node S2 through the transistor $Q_{pre}$ and the transistor $Q_{clamp}$.

In addition, the sense amplifier 17 of FIG. 4 corresponds to a single-level DRAM of a 2-cell/1-bit type to store the 1-bit data in two memory cells $U_{ij}$. In this case, complementary data is stored in two memory cells $U_{ij}$. Therefore, in the read operation, the potential $V_{BL}$ of the bit line $BL_{ij}$ is transferred to the input/output node S1, and the potential $V_{BL}$ ($V_{bBL}$) of the bit line $BL_{ij}$ ($bBL_{ij}$) is transferred to the input/output node S2.

Operation Example: Single-Level DRAM

Figure 5:
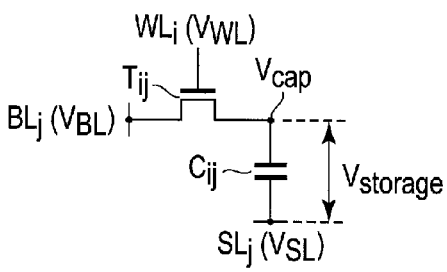
FIG. 5 is a diagram illustrating an example of a write operation.
Figure 6:
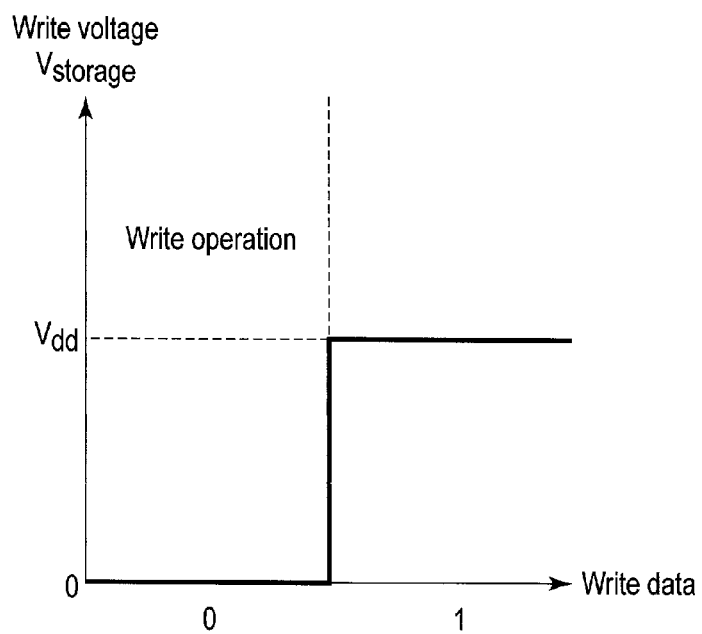
FIG. 6 is a diagram illustrating a relation between write data and a write voltage.

FIG. 5 illustrates an example of the write operation. FIG. 6 illustrates a relation between the write data and the write voltage. The example shows a case where the 1-bit data (0 or 1) is written to the memory cell.

The memory cell includes the capacitor $C_{ij}$ and the transistor $T_{ij}$ which are connected in series between the bit line $BL_j$ and the source line $SL_j$ as illustrated in an equivalent circuit of the drawing.

In this case, the write data can be controlled by the write voltage (capacitor voltage) $V_{storage}$ ($=V_{cap}-V_{SL}$) which is applied to the capacitor $C_{ij}$.

For example, in a case where the write data "1" is written to the memory cell, the write voltage $V_{storage}$ may be set to $V_{w1}$ (for example, $V_{dd}$). In a case where the write data "0" is written to the memory cell, the write voltage $V_{storage}$ may be set to $V_{w0}$ (for example, 0V). In this case, $V_{w0}$ is less than $V_{w1}$ ($V_{w0}<V_{w1}$).

FIG. 7 illustrates an example of determining the write voltage $V_{storage}$ in FIGS. 5 and 6.

In this embodiment, the potential $V_{SL}$ of the source line $SL_j$ is changed in the write operation as described above.

Therefore, for example, in a case where the write data "1" is written to the memory cell, the potential $V_{WL}$ of the word line $WL_i$ is set to $V_{on\_w}$, the potential $V_{BL}$ of the bit line $BL_j$ is set to $V_{dd}$, and the potential $V_{SL}$ of the source line $SL_j$ is set to 0V. Herein, $V_{on\_w}$ is equal to or greater than $V_{BL}+V_{th}$ ($V_{on\_w} \geq V_{BL}+V_{th}$) in which $V_{th}$ is a threshold voltage of the transistor $T_{ij}$.

In this case, the write voltage $V_{storage}$ ($=V_{cap}-V_{SL}$) becomes $V_{w1}$ ($=V_{BL}-V_{SL}=V_{dd}$), and the write data "1" is stored in the capacitor $C_{ij}$.

In addition, in a case where the write data "0" is written to the memory cell, the potential $V_{WL}$ of the word line $WL_i$ is set to $V_{on\_w}$, the potential $V_{BL}$ of the bit line $BL_j$ is set to $V_{dd}$, and the potential $V_{SL}$ of the source line $SL_j$ is set to $V_{dd}$.

In this case, the write voltage $V_{storage}$ (=$V_{cap}$-$V_{SL}$) becomes $V_{w0}$ (=$V_{BL}$-$V_{SL}$=0V), and the write data "0" is stored in the capacitor $C_{ij}$.

In this embodiment, the potential $V_{SL}$ of the source line $SL_j$ can be changed in the write operation. Therefore, for example, in a case where the write data "1" is written to the memory cell, the potential $V_{SL}$ of the source line $SL_j$ is set to, for example, −αV (negative potential), so that the write operation of the write data "1" can be performed at a high speed.

In other words, when the potential $V_{SL}$ of the source line $SL_j$ is set to −αV, the write voltage $V_{storage}$ (=$V_{cap}$-$V_{SL}$) becomes $V_{w1}$ (=$V_{BL}$-$V_{SL}$=$V_{dd}$ αV), and the write voltage $V_{storage}$ is increased compared to the case of "0 V". Therefore, the write data "1" is acceleratively stored in the capacitor $C_{ij}$ (accelerating write).

Figures 9, 10:
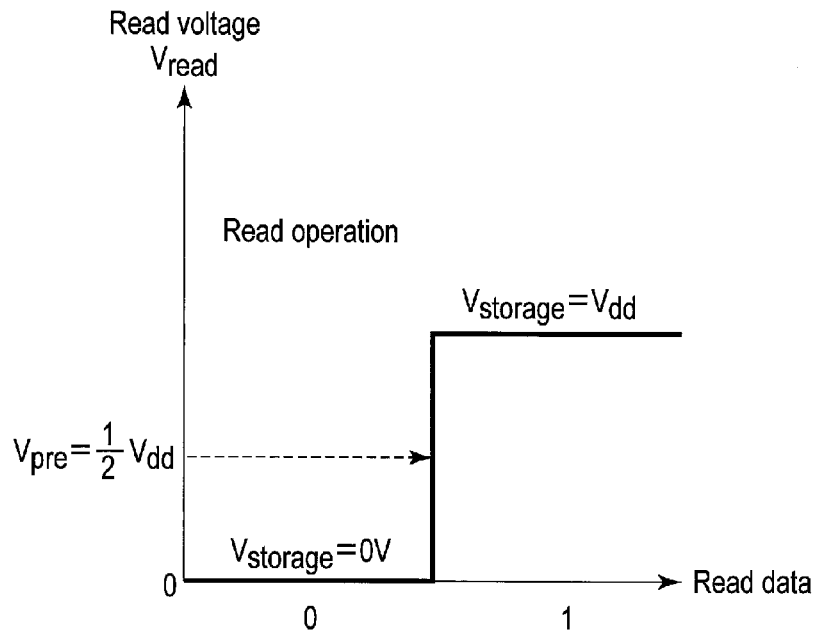
FIG. 9 is a diagram illustrating a relation between read data and a read voltage.
FIG. 10 is a diagram illustrating an example of determining $V_{read}$.

FIG. 8 illustrates an example of the read operation. FIG. 9 illustrates a relation between the read data and the read voltage. The example shows a case where the 1-bit data (0 or 1) is read out of the memory cell.

The memory cell includes the capacitor $C_{ij}$ and the transistor $T_{ij}$ which are connected in series between the bit line $BL_j$ and the source line $SL_j$ as illustrated in an equivalent circuit of the drawing.

For example, in a case where "1" is stored in the memory cell, the capacitor $C_{ij}$ stores $V_{dd}$ as the write voltage $V_{storage}$ In other words, when the potential of the source line $SL_j$ becomes 0V, $V_{cap}$ is $V_{dd}$. In addition, in a case where "0" is stored in the memory cell, the capacitor $C_{ij}$ stores 0V as the write voltage $V_{storage}$. In other words, when the potential of the source line $SL_j$ is 0V, $V_{cap}$ is also 0V.

In this case, the read data ("1" or "0" stored in the memory cell) can be determined by applying a voltage (for example, $V_{dd}$/2) between $V_{dd}$ and 0V as a read voltage $V_{read}$ (=$V_{BL}$-$V_{SL}$) to the capacitor $C_{ij}$.

For example, in the read operation, in a case where the transistor $T_{ij}$ is turned on in a state where the potential $V_{SL}$ of the source line $SL_j$ is set to 0V, and the potential $V_{BL}$ of the bit line $BL_j$ is set to the precharge potential $V_{pre}$=$V_{dd}$/2 (floating), the potential $V_{BL}$ of the bit line $BL_j$ changes according to the data (0 or 1) stored in the capacitor $C_{ij}$.

In other words, in a case where the transistor $T_{ij}$ is turned on in a state where the data stored in the capacitor $C_{ij}$ is 1 ($V_{cap}$ is $V_{dd}$), the charges accumulated in the capacitor $C_{ij}$ move to the bit line $BL_j$, and the potential $V_{BL}$ of the bit line $BL_j$ rises up by ΔV from $V_{pre}$=$V_{dd}$/2 (floating). On the contrary, in a case where the transistor $T_{ij}$ is turned on in a state where the data stored in the capacitor $C_{ij}$ is 0 ($V_{cap}$ is 0V), the charges accumulated in the bit line $BL_j$ move to the capacitor $C_{ij}$, and the potential $V_{BL}$ of the bit line $BL_j$ falls down by ΔV from $V_{dd}$/2 (floating).

Therefore, when the change in potential of the bit line $BL_j$ is detected by the sense amplifier, the data stored in the memory cell can be read out.

FIG. 10 illustrates an example of determining the read voltage $V_{read}$ in FIGS. 8 and 9.

For example, in a case where the data is read out of the memory cell, the potential $V_{WL}$ of the word line $WL_i$ is set to $V_{on\_r}$, the potential $V_{BL}$ of the bit line $BL_j$ is set to the precharge potential $V_{pre}$=$V_{dd}$/2 (floating), and the potential $V_{SL}$ of the source line $SL_j$ is set to 0V. In this case, $V_{on\_r}$ is equal to or greater than $V_{BL}$+$V_{th}$ ($V_{on\_r}$≥$V_{BL}$ $V_{th}$) in which $V_{th}$ is the threshold voltage of the transistor $T_{ij}$.

In this case, as described above, the potential $V_{BL}$ of the bit line $BL_j$ rises up/falls down from the precharge potential $V_{pre}$=$V_{dd}$/2 (floating) according to the data (0 or 1) stored in the memory cell.

In this embodiment, as described above, the potential $V_{SL}$ of the source line $SL_j$ can be changed. Therefore, in the read operation, for example, the potential $V_{SL}$ of the source line $SL_j$ is changed by ±βV from 0V, and ΔV described above can be increased by the capacity coupling in the capacitor $C_{ij}$ (bit line boost effect). When ΔV is large, for example, an initial potential difference generated between two input/output nodes S1 and S2 of the sense amplifier 17 of FIGS. 3 and 4 is increased, so that the read operation can be performed at a high speed.

For example, in a case where the potential $V_{SL}$ of the source line $SL_j$ is changed by +βV from 0V, a rising amount of the potential $V_{BL}$ of the bit line $BL_j$ when the read data is "1" becomes large compared to that in a case where the potential $V_{SL}$ of the source line $SL_j$ is kept at 0V. In addition, in a case where the potential $V_{SL}$ of the source line $SL_j$ is changed by −βV from 0V, a falling amount of the potential $V_{BL}$ of the bit line $BL_j$ when the read data is "0" becomes large compared to that in a case where the potential $V_{SL}$ of the source line $SL_j$ is kept at 0V.

FIG. 11 illustrates an example of the potential generator. The potential generator 13 corresponds to the potential generator 13 of FIG. 1.

The potential generator 13 includes a first generator 13_write, a second generator 13_read, and a multiplexer MUX_write.

The first generator 13_write has a function of outputting a potential which is used in the write operation, and enters the operating state when the write enable signal WE becomes active (for example, the high level).

The first generator 13_write outputs, for example, $V_{WL}$ (=$V_{on\_w}$) and $V_{BL}$ (=$V_{dd}$) illustrated in FIG. 7. In addition, the multiplexer MUX_write outputs $V_{SL}$ (=$V_{dd}$ or 0V) illustrated in FIG. 7.

For example, when a control signal CNT_W from the controller 12 of FIG. 1 is "1" (that is, when the write data Dw is "1"), the multiplexer MUX_write outputs 0V as $V_{SL}$. In addition, when the control signal CNT_W from the controller 12 of FIG. 1 is "0" (that is, the write data Dw is "0"), the multiplexer MUX_write outputs $V_{dd}$ as $V_{SL}$.

The second generator 13_read has a function of outputting a potential which is used in the read operation, and enters the operating state when the read enable signal RE becomes active (for example, the high level).

The second generator 13_read outputs, for example, $V_{WL}$ (=$V_{on\_r}$), $V_{BL}$=$V_{pre}$ (=$V_{dd}$/2), and $V_{SL}$ (=0V) as illustrated in FIG. 10.

FIG. 12 illustrates an example of operation waveforms of the write operation.

In the drawing, WE is the write enable signal, $V_{WL}$, $V_{BL}$, and $V_{SL}$ correspond to, for example, $V_{WL}$, $V_{BL}$, and $V_{SL}$ of FIG. 7, and $φ_W$, $V_{S1}$, and $V_{S2}$ correspond to $φ_W$, $V_{S1}$, and $V_{S2}$ of FIGS. 3 and 4.

The operation waveforms are controlled by the controller 12 of FIG. 1.

When the write enable signal WE ascends to the high level, the controller 12 sets the control signal $φ_{CS}$ and the control signal $φ_W$ to the high level. When the control signal $φ_{CS}$ and the control signal $φ_W$ ascend to the high level, $V_{dd}$ is transferred as $V_{BL}$ to the bit line $BL_j$ selected from the potential generator 13 of FIG. 11. In addition, the potential ($V_{dd}$ or 0V) corresponding to the write data (0 or 1) is transferred as $V_{SL}$ to the source line $SL_j$ selected from the potential generator 13 of FIG. 11.

Thereafter, the controller 12 instructs the row decoder/driver 14 of FIG. 1 to transfer $V_{on\_w}$ as $V_{WL}$ to the selected word line $WL_i$. In other words, when receiving the instruction from the controller 12, the row decoder/driver 14 of FIG. 1 transfers $V_{on\_w}$ to the word line $WL_i$ selected from the potential generator 13 of FIG. 11.

As a result, the transistor $T_{ij}$ in the selected memory cell (select cell) $U_{ij}$ is turned on, and the write voltage $V_{storage}$ corresponding to the write data (0 or 1) is applied to the capacitor $C_{ij}$ in the select cell $U_{ij}$.

For example, in a case where the write data is "1", the write voltage $V_{storage}$ becomes $V_{dd}$ (=$V_{BL}$-$V_{SL}$), and the data "1" is written to the capacitor $C_{ij}$ in the select cell $U_{ij}$. In addition, in a case where the write data is "0", the write voltage $V_{storage}$ becomes 0V (=$V_{BL}$-$V_{SL}$), and the data "0" is written to the capacitor $C_{ij}$ in the select cell $U_{ij}$.

Further, in the write operation, for example, the sense amplifier 17 illustrated in FIGS. 3 and 4 is not used. Therefore, the transistor $Q_{clamp}$ is turned off, and the potentials at two input/output nodes S1 and S2 of the sense amplifier 17 come to be a reset state ($V_{ss}$).

FIGS. 13 to 16 illustrate examples of the operation waveforms of the read operation.

The read operation is different in the DRAM of the 1-cell/1-bit type (FIG. 3) and in the DRAM of the 2-cell/1-bit type (FIG. 4), and thus the description below will be given about these.

Figure 13:
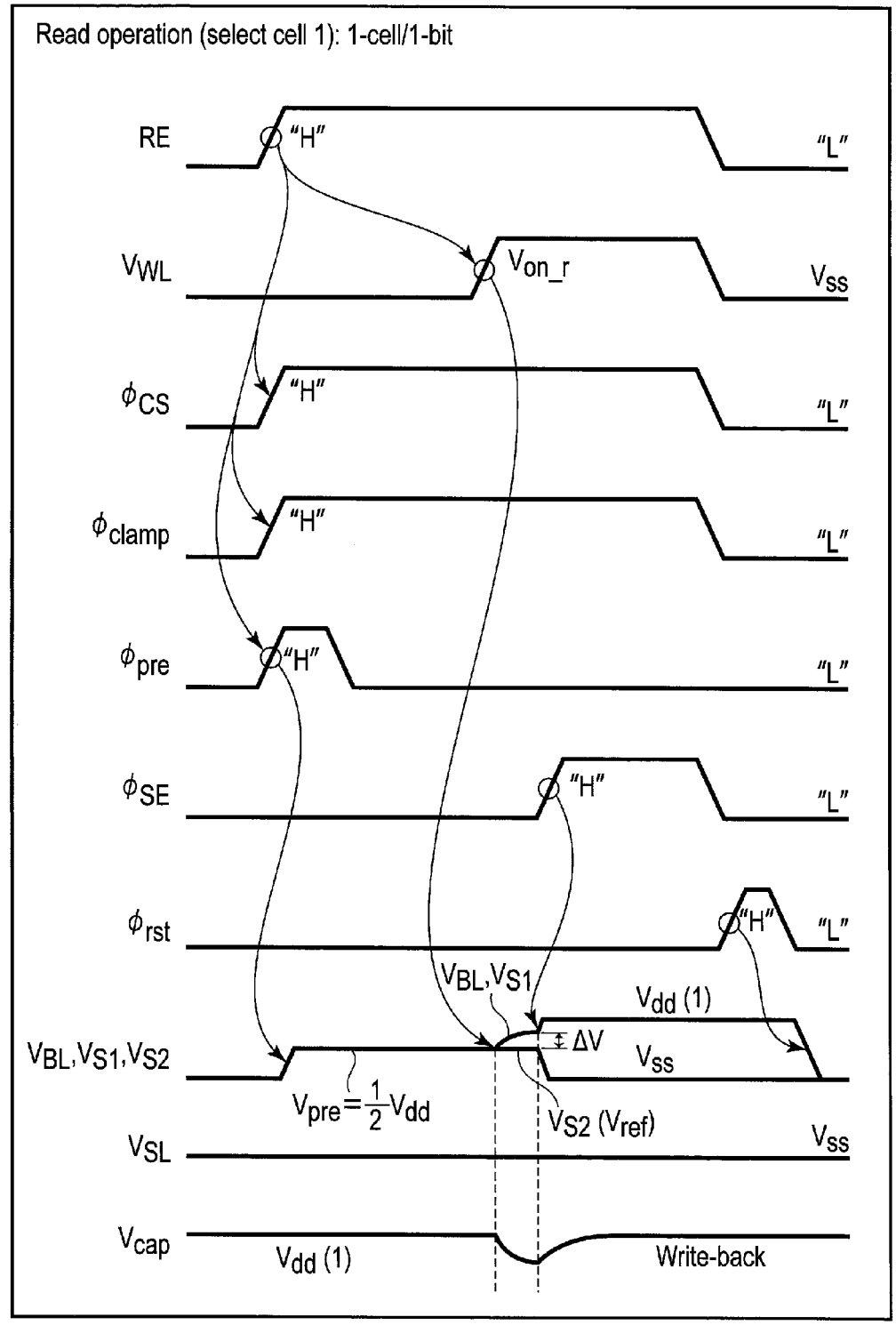
FIG. 13 is a diagram illustrating an example of operation waveforms of the read operation.

FIGS. 13 and 14 illustrate the operation waveforms of the read operation of the DRAM of the 1-cell/1-bit type. In addition, FIG. 13 illustrates the operation waveforms when the data "1" is stored in the select cell which is a target of the read operation, and FIG. 14 illustrates the operation waveforms when the data "0" is stored in the select cell.

In these drawings, RE is the read enable signal, $V_{WL}$, $V_{BL}$, and $V_{SL}$ correspond to, for example, $V_{WL}$, $V_{BL}$, and $V_{SL}$ of FIG. 10, and $\varphi_{clamp}$, $\varphi_{pre}$, $\varphi_{SE}$, $V_{S1}$, $V_{S2}$, $\varphi_{rst}$, and $\varphi_{cap}$ correspond to $\varphi_{clamp}$, $\varphi_{pre}$, $\varphi_{SE}$, $V_{S1}$, $V_{S2}$, $\varphi_{rst}$, and $\varphi_{cap}$ of FIG. 3.

The operation waveforms are controlled by the controller 12 of FIG. 1.

When the read enable signal RE ascends to the high level, the controller 12 sets the control signal $\varphi_{CS}$ and the control signal $\varphi_{clamp}$ to the high level. In addition, the controller 12 sets the control signal $\varphi_{pre}$ to the high level.

When the control signal $\varphi_{pre}$ ascends to the high level, the precharge potential $V_{pre}$ (=$V_{dd}$/2) is transferred as $V_{BL}$ to the bit line $BL_j$ selected from the potential generator 13 of FIG. 11, and the potentials $V_{S1}$ and $V_{S2}$ at two input/output nodes S1 and S2 of the sense amplifier 17 of FIG. 3 are set to the precharge potential $V_{pre}$.

Thereafter, when the control signal $\varphi_{pre}$ descends to the low level, the potential $V_{BL}$ of the selected bit line $BL_j$ and the potentials $V_{S1}$ and $V_{S2}$ at two input/output nodes S1 and S2 each are set to the precharge potential $V_{pre}$ (floating).

In addition, in the read operation, $V_{ss}$ (0V) is transferred as $V_{SL}$ from the potential generator 13 of FIG. 11 to the source line $SL_j$.

Thereafter, the controller 12 instructs the row decoder/driver 14 of FIG. 1 to transfer $V_{on\_r}$ as $V_{WL}$ to the selected word line $WL_i$. In other words, when receiving the instruction from the controller 12, the row decoder/driver 14 of FIG. 1 transfers $V_{on\_r}$ to the selected word line $WL_i$ from the potential generator 13 of FIG. 11.

As a result, the transistor $T_{ij}$ in the selected memory cell (select cell) $U_{ij}$ is turned on, and the potential $V_{BL}$ of the selected bit line $BL_j$ changes according to the data (0 or 1) stored in the capacitor $C_{ij}$ in the select cell $U_{ij}$.

For example, as illustrated in FIG. 13, in a case where the transistor $T_{ij}$ is turned on when the data stored in the capacitor $C_{ij}$ is "1" ($V_{cap}$ is $V_{dd}$), the charges accumulated in the capacitor $C_{ij}$ move to the bit line $BL_j$, and the potential $V_{BL}$ of the bit line $BL_j$ and the potential $V_{S1}$ at the input/output node S1 rise up by $\Delta V$ from $V_{pre}$=$V_{dd}$/2 (floating). At this time, $V_{cap}$ is lowered by $\Delta V$ from $V_{dd}$. In addition, the potential $V_{S2}$ (the reference voltage $V_{ref}$) at the input/output node S2 does not change but remains at $V_{pre}$=$V_{dd}$/2 (floating).

On the contrary, as illustrated in FIG. 14, in a case where the transistor $T_{ij}$ is turned on when the data stored in the capacitor $C_{ij}$ is "0" ($V_{cap}$ is 0V), the charges accumulated in the bit line $BL_j$ move to the capacitor $C_{ij}$, and the potential $V_{BL}$ of the bit line $BL_j$ and the potential $V_{S1}$ at the input/output node S1 fall down by $\Delta V$ from $V_{dd}$/2 (floating). At this time, $V_{cap}$ rises up by $\Delta V$ from 0V. In addition, the potential $V_{S2}$ (the reference voltage $V_{ref}$) at the input/output node S2 does not change but remains at $V_{pre}$=$V_{dd}$/2 (floating).

Thereafter, the controller 12 sets the control signal (sense amplifier enable signal) $\varphi_{SE}$ to the high level. As a result, for example, the sense amplifier 17 of FIG. 3 enters the operating state, and a potential difference ($V_{S1}$-$V_{S2}$) between two input/output nodes S1 and S2 of the sense amplifier 17 is amplified.

In other words, as illustrated in FIG. 13, in a case where the potential $V_{S1}$ at the input/output node S1 is larger than the potential $V_{S2}$ ($V_{ref}$) at the input/output node S2, the potential $V_{S1}$ at the input/output node S1 changes to $V_{dd}$, and the potential $V_{S2}$ at the input/output node S2 changes to 0V. Therefore, the read data "1" ($V_{dd}$) is output from the input/output node S1.

In addition, when the potential $V_{S1}$ at the input/output node S1 changes to $V_{dd}$, the potential $V_{BL}$ of the selected bit line $BL_j$ also becomes $V_{dd}$, and $V_{dd}$ is transferred to the capacitor $C_{ij}$ in the select cell $U_{ij}$. Therefore, $V_{cap}$ changes from $V_{dd}$-$\Delta V$ to $V_{dd}$ again. In other words, the data "1" is written back to the capacitor $C_{ij}$ in the select cell $U_{ij}$ (refresh).

On the other hand, as illustrated in FIG. 14, in a case where the potential $V_{S1}$ at the input/output node S1 is smaller than the potential $V_{S2}$ at the input/output node S2 ($V_{ref}$), the potential $V_{S1}$ at the input/output node S1 changed to 0V, and the potential $V_{S2}$ at the input/output node S2 changes to $V_{dd}$. Therefore, the read data "0" (0V) is output from the input/output node S1.

In addition, when the potential $V_{S1}$ at the input/output node S1 changes to 0V, the potential $V_{BL}$ of the selected bit line $BL_j$ also becomes 0V, and 0V is transferred to the capacitor $C_{ij}$ in the select cell $U_{ij}$. Therefore, $V_{cap}$ changes from 0V+$\Delta V$ to 0V again. In other words, the data "0" is written back to the capacitor $C_{ij}$ in the select cell $U_{ij}$ (refresh).

Thereafter, the controller 12 changes the potential $V_{WL}$ of the selected word line $WL_i$ from $V_{on\_r}$ to $V_{ss}$ (0V), and changes each of the control signals $\varphi_{CS}$, $\varphi_{clamp}$ and $\varphi_{SE}$ to the low level.

Finally, the controller 12 sets the control signal $\varphi_{rst}$ to the high level. As a result, the potential $V_{BL}$ of the selected bit line $BL_j$, and the potentials $V_{S1}$ and $V_{S2}$ at two input/output nodes S1 and S2 of the sense amplifier 17 become to $V_{ss}$ (0V) and reset.

Figure 15:
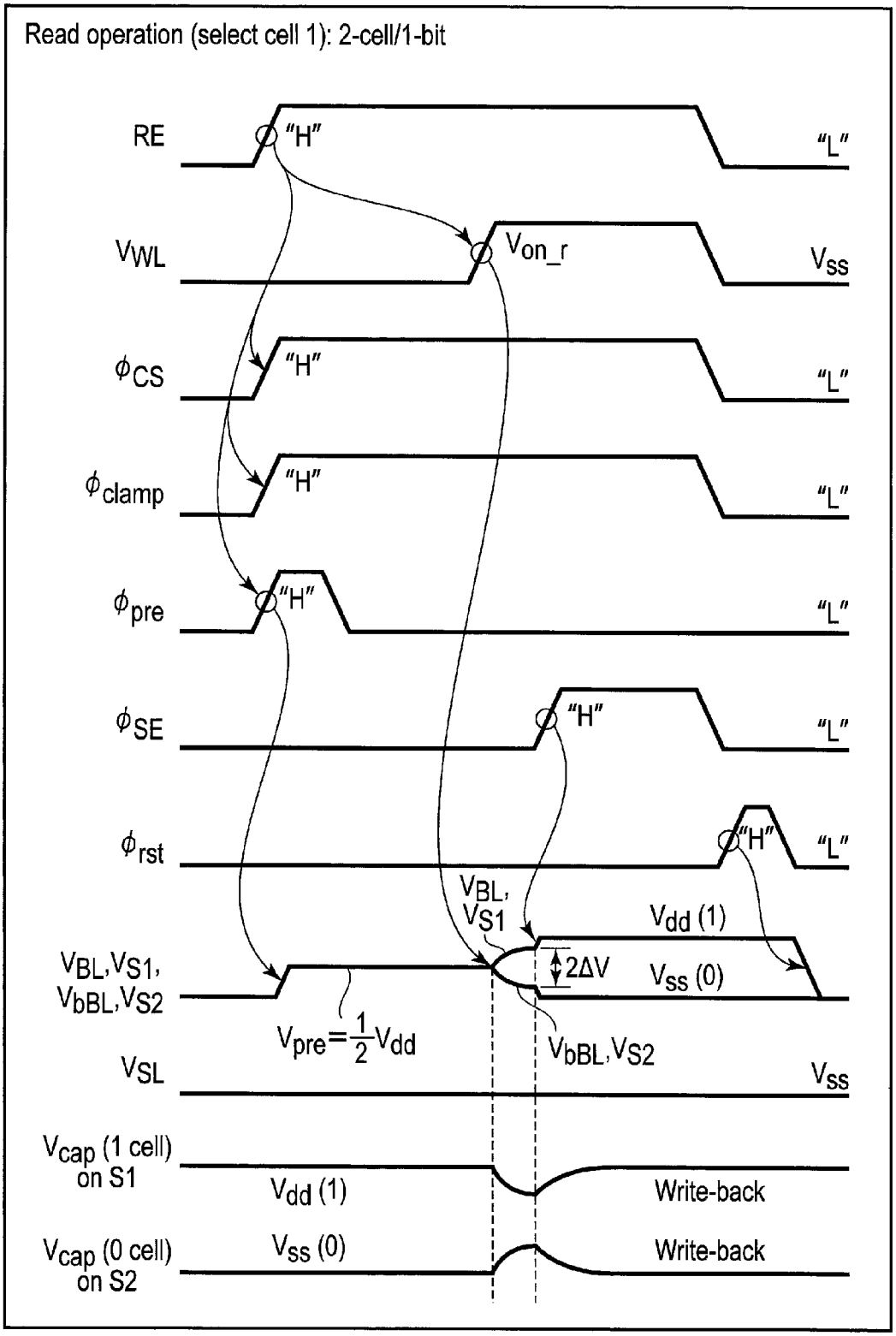
FIG. 15 is a diagram illustrating an example of the operation waveforms of the read operation.
Figure 16:
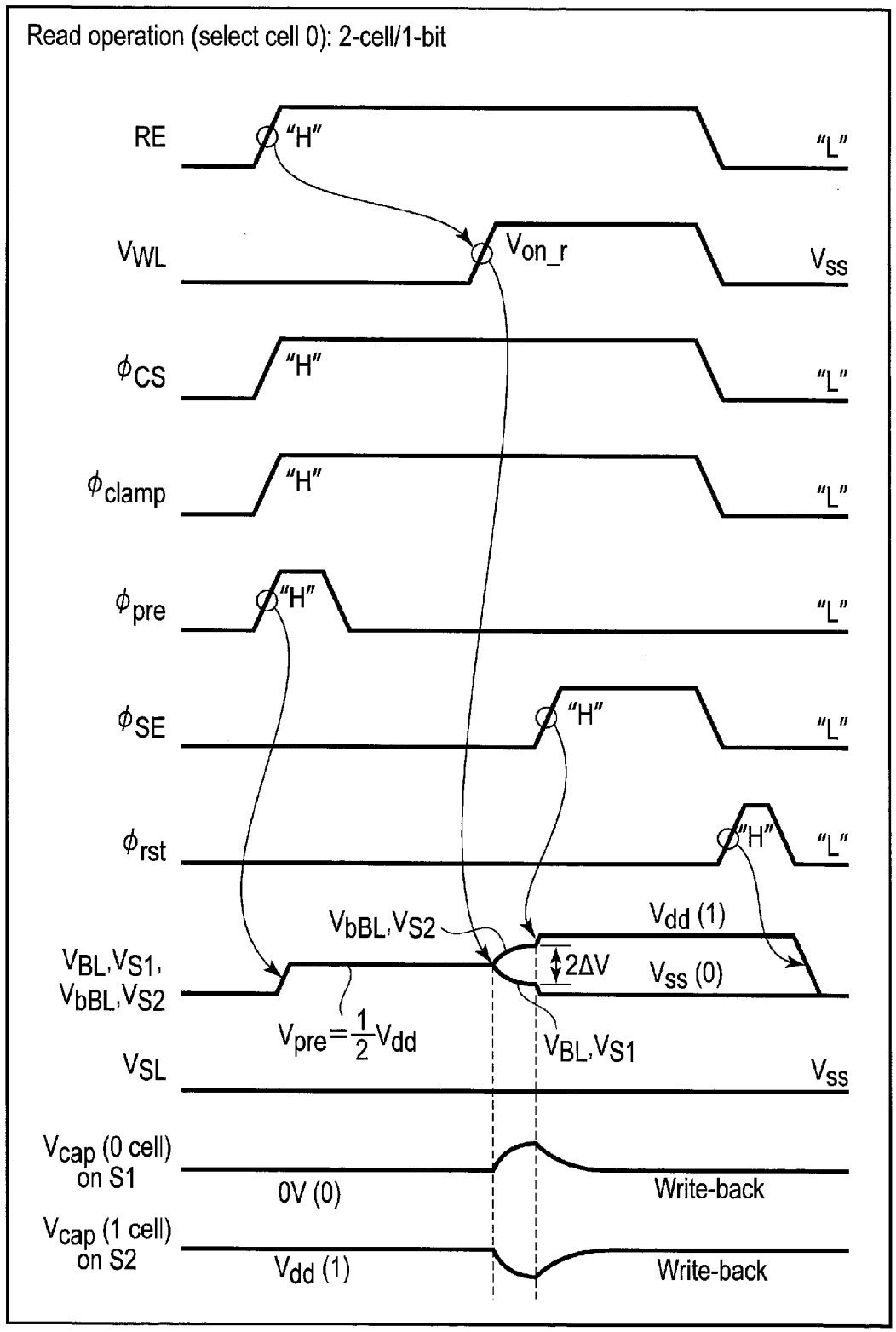
FIG. 16 is a diagram illustrating an example of the operation waveforms of the read operation.

FIGS. 15 and 16 illustrate the operation waveforms of the read operation of the DRAM of the 2-cell/1-bit type. In addition, FIG. 15 illustrates the operation waveforms when the data "1" is stored in the select cell which is a target of the read operation, and FIG. 16 illustrates the operation waveforms when the data "0" is stored in the select cell.

In these drawings, RE is the read enable signal, $V_{WL}$, $V_{BL}$, and $V_{SL}$ correspond to, for example, $V_{WL}$, $V_{BL}$, and $V_{SL}$ of FIG. 10, and $\varphi_{clamp}$, $\varphi_{pre}$, $\varphi_{SE}$, $V_{S1}$, $V_{S2}$, $\varphi_{rst}$, and $\varphi_{cap}$ correspond to $\varphi_{pre}$, $\varphi_{SE}$, $V_{S1}$, $V_{S2}$, $\varphi_{rst}$, and $\varphi_{cap}$ of FIG. 4.

The operation waveforms are controlled by the controller 12 of FIG. 1.

The operation before $V_{on\_r}$ as $V_{WL}$ is applied to the selected word line $WL_i$ is the same as that of the example of FIGS. 13 and 14, and thus the description will be omitted herein.

When $V_{on\_r}$ is applied to the selected word line $WL_i$, the transistor $T_{ij}$ in the select cell $U_{ij}$ is turned on, and the potential $V_{BL}$ of the selected bit line $BL_j$ changes according to the data (0 or 1) stored in the capacitor $C_{ij}$ in the select cell $U_{ij}$.

For example, as illustrated in FIG. 15, when the data stored in the capacitor $C_{ij}$ is "1" ($V_{cap}$ on a side near S1 is $V_{dd}$) on a side near the input/output node S1, the charges accumulated in the capacitor $C_{ij}$ move to the bit line $BL_j$ in a case where the transistor $T_{ij}$ is turned on, the potential $V_{BL}$ of the bit line $BL_j$ and the potential $V_{S1}$ at the input/output node S1 rise up by $\Delta V$ from $V_{pre}=V_{dd}/2$ (floating). At this time, $V_{cap}$ on a side near S1 falls down by $\Delta V$ from $V_{dd}$.

In this case, since the data stored in the capacitor $C_{ij}$ is "0" ($V_{cap}$ is 0V on a side near S2) on a side near the input/output node S2, in a case where the transistor $T_{ij}$ is turned on, the charges accumulated in the bit line $BL_j$ ($bBL_j$) move to the capacitor $C_{ij}$, the potential $V_{BL}$ ($V_{bBL}$) of the bit line $BL_j$ ($bBL_j$) and the potential $V_{S2}$ at the input/output node S2 fall down by $\Delta V$ from $V_{pre}=V_{dd}/2$ (floating). At this time, $V_{cap}$ on a side near S2 rises up by $\Delta V$ from 0V.

Therefore, the potential difference ($V_{S1}-V_{S2}$) between two input/output nodes S1 and S2 becomes $2\Delta V$. The potential difference is two times the potential difference $\Delta V$ ($=V_{S1}-V_{S2}$) between two input/output nodes S1 and S2 in the operation waveforms of FIG. 13.

On the contrary, as illustrated in FIG. 16, when the data stored in the capacitor $C_{ij}$ is "0" v ($V_{cap}$ on a side near S1 is 0V) on a side near the input/output node S1, the charges accumulated in the bit line $BL_j$ move to the capacitor $C_{ij}$ in a case where the transistor $T_{ij}$ is turned on, the potential $V_{BL}$ of the bit line $BL_j$ and the potential $V_{S1}$ at the input/output node S1 fall down by $\Delta V$ from $V_{dd}/2$ (floating). At this time, $V_{cap}$ on a side near S1 rises up by $\Delta V$ from 0V.

In this case, since the data stored in the capacitor $C_{ij}$ is "1" ($V_{cap}$ is $V_{dd}$) on a side near the input/output node S2, the charges accumulated in the capacitor $C_{ij}$ move to the bit line $BL_j$ ($bBL_j$) in a case where the transistor $T_{ij}$ is turned on, and the potential $V_{BL}$ ($V_{bBL}$) of the bit line $BL_j$ ($bBL_j$) and the potential $V_{S2}$ at the input/output node S2 rise up by $\Delta V$ from $V_{pre}=V_{dd}/2$ (floating). At this time, $V_{cap}$ on a side near S2 falls down by $\Delta V$ from $V_{dd}$.

Therefore, the potential difference ($V_{S1}-V_{S2}$) between two input/output nodes S1 and S2 becomes $2\Delta V$. The potential difference is two times the potential difference $\Delta V$ ($=V_{S1}-V_{S2}$) between two input/output nodes S1 and S2 in the operation waveforms of FIG. 14.

Thereafter, the controller 12 sets the control signal (sense amplifier enable signal) $\varphi_{SE}$ to the high level. As a result, for example, the sense amplifier 17 of FIG. 4 becomes the operating state, and the potential difference ($V_{S1}-V_{S2}$) between two input/output nodes S1 and S2 of the sense amplifier 17 is amplified.

In other words, as illustrated in FIG. 15, in a case where the potential $V_{S1}$ at the input/output node S1 is larger than the potential $V_{S2}$ at the input/output node S2 ($V_{ref}$), the potential $V_{S1}$ at the input/output node S1 changes to $V_{dd}$, and the potential $V_{S2}$ at the input/output node S2 changes to 0V. Therefore, the read data "1" ($V_{dd}$) is output from the input/output node S1.

The speed (sense speed) that the potential $V_{S1}$ at the input/output node S1 changes to $V_{dd}$ is higher than that of the operation waveforms of FIG. 13 since the initial potential difference between two input/output nodes S1 and S2 of the sense amplifier 17 is $2\Delta V$. This means that the reading can be made at a high speed.

In addition, when the potential $V_{S1}$ at the input/output node S1 changes to $V_{dd}$, the potential $V_{BL}$ of the selected bit line $BL_j$ also becomes $V_{dd}$, and $V_{dd}$ is transferred to the capacitor $C_{ij}$ in the select cell $U_{ij}$. Therefore, $V_{cap}$ on a side near S1 changes from $V_{dd}-\Delta V$ to $V_{dd}$ again. In other words, the data "1" is written back to the capacitor $C_{ij}$ in the select cell $U_{ij}$ (refresh).

Similarly, when the potential $V_{S2}$ at the input/output node S2 is 0V, the potential $V_{BL}$ ($V_{bBL}$) of the selected bit line $BL_j$ ($bBL_j$) also becomes 0V, and 0V is transferred to the capacitor $C_{ij}$ in the select cell $U_{ij}$. Therefore, $V_{cap}$ on a side near S2 changes from $0V+\Delta V$ to 0V again. In other words, the data "0" is written back to the capacitor $C_{ij}$ in the select cell $U_{ij}$ (refresh).

On the other hand, as illustrated in FIG. 16, in a case where the potential $V_{S1}$ at the input/output node S1 is smaller than the potential $V_{S2}$ ($V_{ref}$) at the input/output node S2, the potential $V_{S1}$ at the input/output node S1 changes to 0V, and the potential $V_{S2}$ at the input/output node S2 changes to $V_{dd}$. Therefore, the read data "0" (0V) is output from the input/output node S1.

The speed (sense speed) that the potential $V_{S1}$ at the input/output node S1 changes to 0V is higher than that of the operation waveforms of FIG. 14 since the initial potential difference between two input/output nodes S1 and S2 of the sense amplifier 17 is $2\Delta V$. This means that the reading can be made at a high speed.

In addition, when the potential $V_{S1}$ at the input/output node S1 changes to 0V, the potential $V_{BL}$ of the selected bit line $BL_j$ also becomes 0V, and 0V is transferred to the capacitor $C_{ij}$ in the select cell $U_{ij}$. Therefore, $V_{cap}$ on a side near S1 changes from $0V+\Delta V$ to 0V again. In other words, the data "0" is written back to the capacitor $C_{ij}$ in the select cell $U_{ij}$ (refresh).

Similarly, when the potential $V_{S2}$ at the input/output node S2 changes to $V_{dd}$, the potential $V_{BL}$ ($V_{bBL}$) of the selected bit line $BL_j$ ($bBL_j$) also becomes $V_{dd}$, and $V_{dd}$ is transferred to the capacitor $C_{ij}$ in the select cell $U_{ij}$. Therefore, $V_{cap}$ on a side near S2 changes from $V_{dd}-\Delta V$ to $V_{dd}$ again. In other words, the data "1" is written back to the capacitor $C_{ij}$ in the select cell $U_{ij}$ (refresh).

Thereafter, the controller 12 change the potential $V_{WL}$ of the selected word line $WL_i$ from $V_{on\_r}$ to $V_{ss}$ (0V), and changes each of the control signals $\varphi_{CS}$, $\varphi_{clamp}$, and $\varphi_{SE}$ to the low level.

Finally, the controller 12 sets the control signal $\varphi_{rst}$ to the high level. As a result, the potential $V_{BL}$ of the selected bit line $BL_j$, and the potentials $V_{S1}$ and $V_{S2}$ at two input/output nodes S1 and S2 of the sense amplifier 17 become to $V_{ss}$ (0V) and reset.

Figure 17:
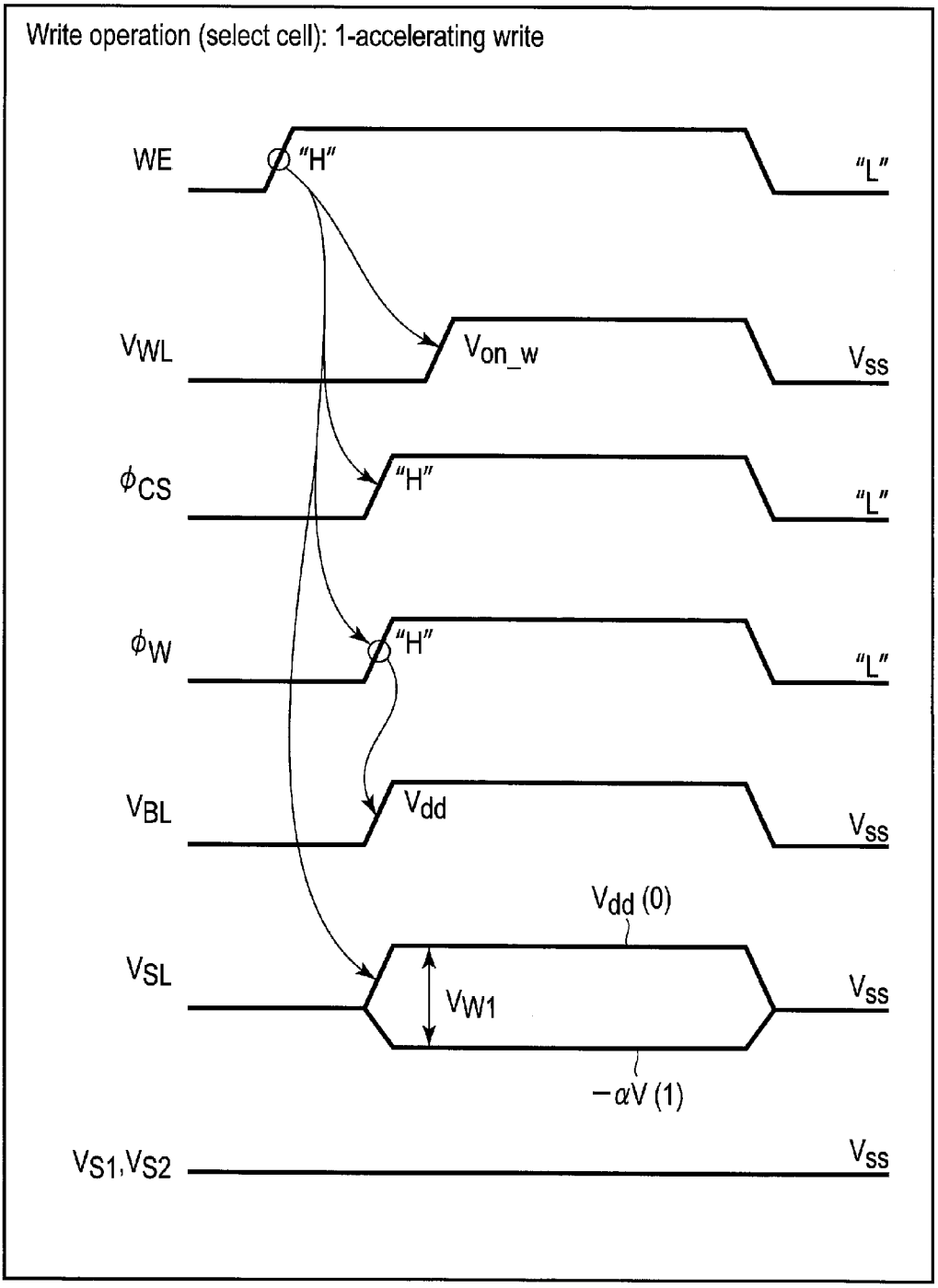
FIG. 17 is a diagram illustrating a modification of the operation waveforms of FIG. 12.

FIG. 17 illustrates a modification of the operation waveforms of the write operation of FIG. 12.

The modification relates to a technique of improving a writing speed of the write data "1" in the operation waveforms of FIG. 12.

The operation waveforms of FIG. 17 are different from the operation waveforms of FIG. 12 in that $V_{SL}$ when the write data is "1" is changed from, for example, $V_{ss}$ (0V) to −αV (negative potential). As a result, in a case where the write data "1" is written to the select cell $U_{ij}$, the write voltage $V_{storage}$ applied to the capacitor $C_{ij}$ in the select cell $U_{ij}$ becomes $V_{dd}$+αV, and the write operation is performed at a high speed (1-accelerating write).

Figure 18:
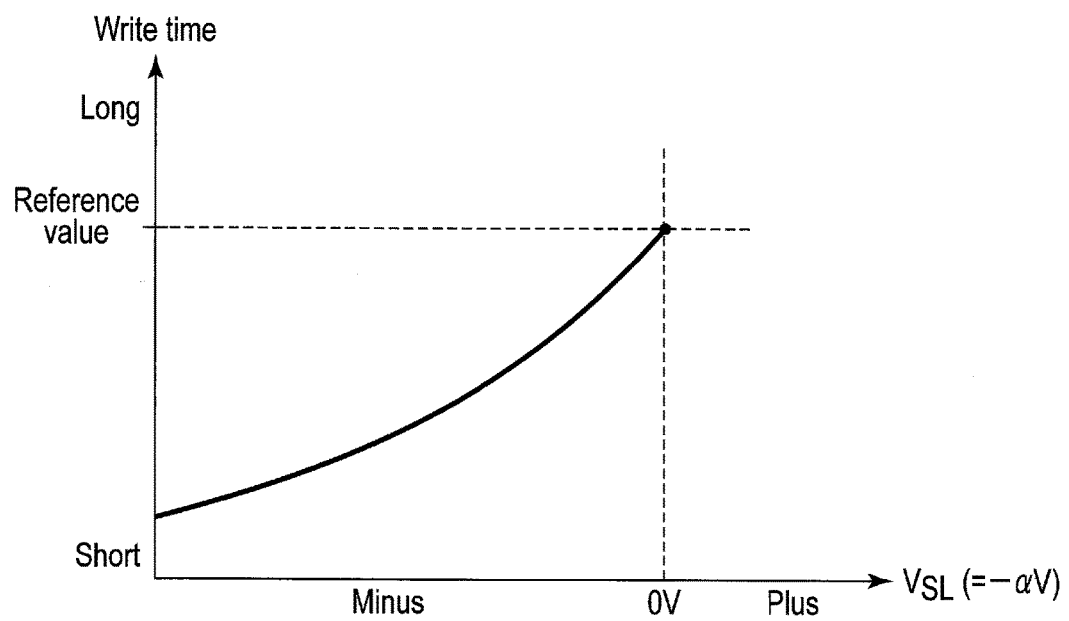
FIG. 18 is a diagram illustrating a relation between a potential of a source line and a write time.

FIG. 18 illustrates a relation between a potential of the source line and a write time. As can be seen from the drawing, the write voltage $V_{storage}$ is increased as the potential $V_{SL}$ of the source line $SL_j$ is decreased (the value of "α" is increased), the high-speed writing can be made. In this case, the write time when $V_{SL}$ is 0V is set to a reference value.

Figure 19:
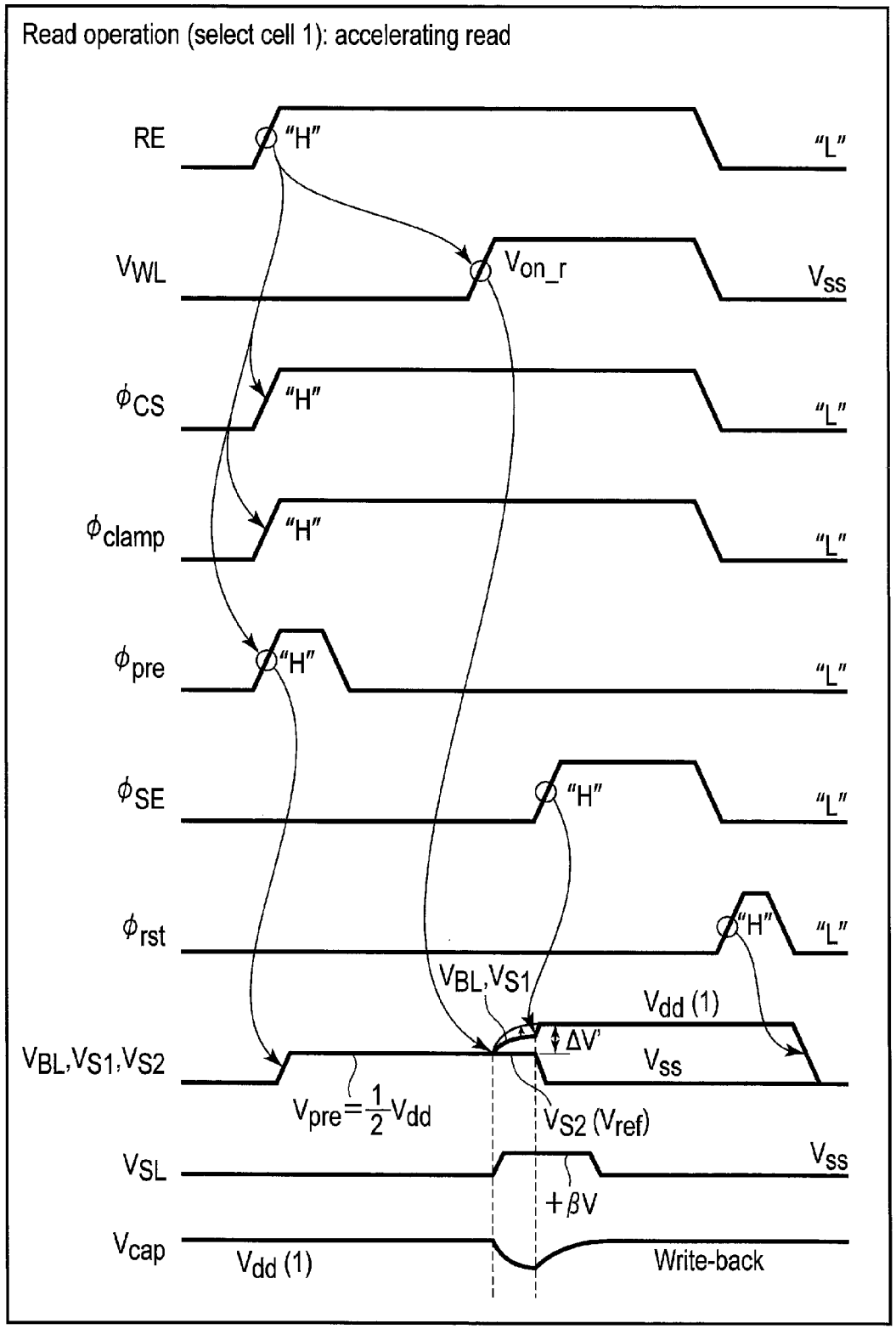
FIG. 19 is a diagram illustrating a modification of the operation waveforms of FIGS. 13 to 16.

FIGS. 19 and 20 illustrate modifications of the operation waveforms of the read operation of FIGS. 13 and 14 respectively.

The modifications relate to a technique of improving a reading speed of the read data (0 or 1) in the operation waveforms of FIGS. 13 and 14.

The operation waveforms of FIG. 19 correspond to the operation waveforms of FIG. 13, and the operation waveforms of FIG. 20 correspond to the operation waveforms of FIG. 14.

The operation waveforms of FIG. 19 are different from the operation waveforms of FIG. 13 in that the potential $V_{SL}$ of the source line SL is changed by +βV (positive potential) from 0V at a time when or after $V_{WL}$ changes to $V_{on\_r}$, and before the control signal (sense amplifier enable signal) $\varphi_{SE}$ becomes the high level.

As a result, the potential $V_{BL}$ of the bit line $BL_j$ rises up by ΔV' from $V_{pre}=V_{dd}/2$ (floating) with the bit line boost effect (in a case where the read data is "1"). ΔV' is larger than ΔV (FIG. 13) in a case where the potential $V_{SL}$ of the source line SL is kept at 0V without any change. Therefore, the read data "1" can be sensed at a high speed.

The operation waveforms of FIG. 20 are different from the operation waveforms of FIG. 14 in that the potential $V_{SL}$ of the source line SL is changed by −βV (negative potential) from 0V at a time when or after $V_{WL}$ changes to $V_{on\_r}$, and before the control signal (sense amplifier enable signal) $\varphi_{SE}$ becomes the high level.

As a result, the potential $V_{BL}$ of the bit line $BL_j$ falls down by ΔV''' from $V_{pre}=V_{dd}/2$ (floating) with the bit line boost effect (in a case where the read data is "0"). ΔV' is larger than ΔV (FIG. 14) in a case where the potential $V_{SL}$ of the source line SL is kept at 0V without any change. Therefore, the read data "0" can be sensed at a high speed.

Figure 21:
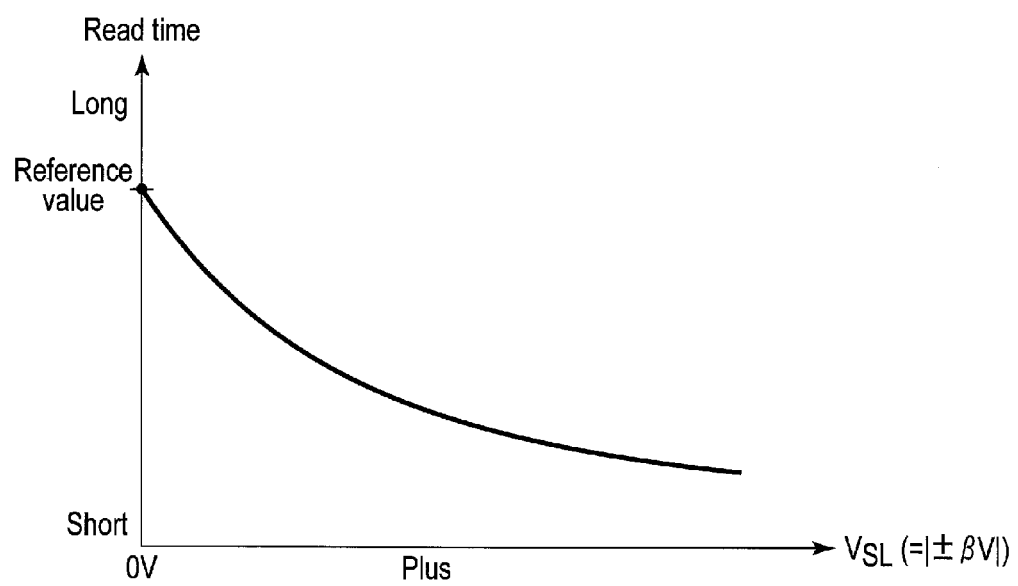
FIG. 21 is a diagram illustrating a relation between the potential of the source line and a read time.

FIG. 21 illustrates a relation between a potential of the source line and a read time. As can be seen from the drawing, as a change amount of the potential $V_{SL}$ of the source line $SL_j$ is increased (that is, the value of |±βV| is increased), the value of ΔV' is increased by the boost effect, so that the reading can be made at a high speed. In this case, the read time when $V_{SL}$ is kept at 0V without any change is set to the reference value.

Operation Example: Multi-Level DRAM

In the case of a multi-level DRAM, the write operation can be performed similarly to the single-level DRAM by changing the write voltage which is applied to the memory cell. On the other hand, since the multi-bit data is read out of the memory cell in the read operation, there needs to perform the reading plural times (multiple reading), or to perform a parallel sensing using a plurality of sense amplifiers when the reading is performed once (once reading).

In addition, the read operation of the DRAM is a so-called destructive read in which the data of the memory cell is destructed (that is, the charges accumulated in the capacitor change). Therefore, the controller has to perform a write-back operation in which the correct data is written to the memory cell again after the read operation.

In the case of the single-level DRAM, the write-back operation is performed by writing the data (0 or 1) read out from the memory cell to the sense amplifier again from the sense amplifier to the memory cell (see FIGS. 13 to 16, 19, and 20).

However, in the case of the multi-level DRAM, there are $2^n$ pieces of data stored in the memory cell (in a case where the n-bit data is stored in the memory cell) while there are 2 (0 or 1) pieces of data stored in the sense amplifier. In this case, "n" is a natural number of 2 or more. Therefore, in the multi-level DRAM, it is not possible to employ the write-back operation of the single-level DRAM.

Thus, in this embodiment, the controller performs the write-back operation corresponding to the destructive read such that the read data is temporally stored after the read operation and then the write operation is performed on the basis of the read data.

Figure 22:
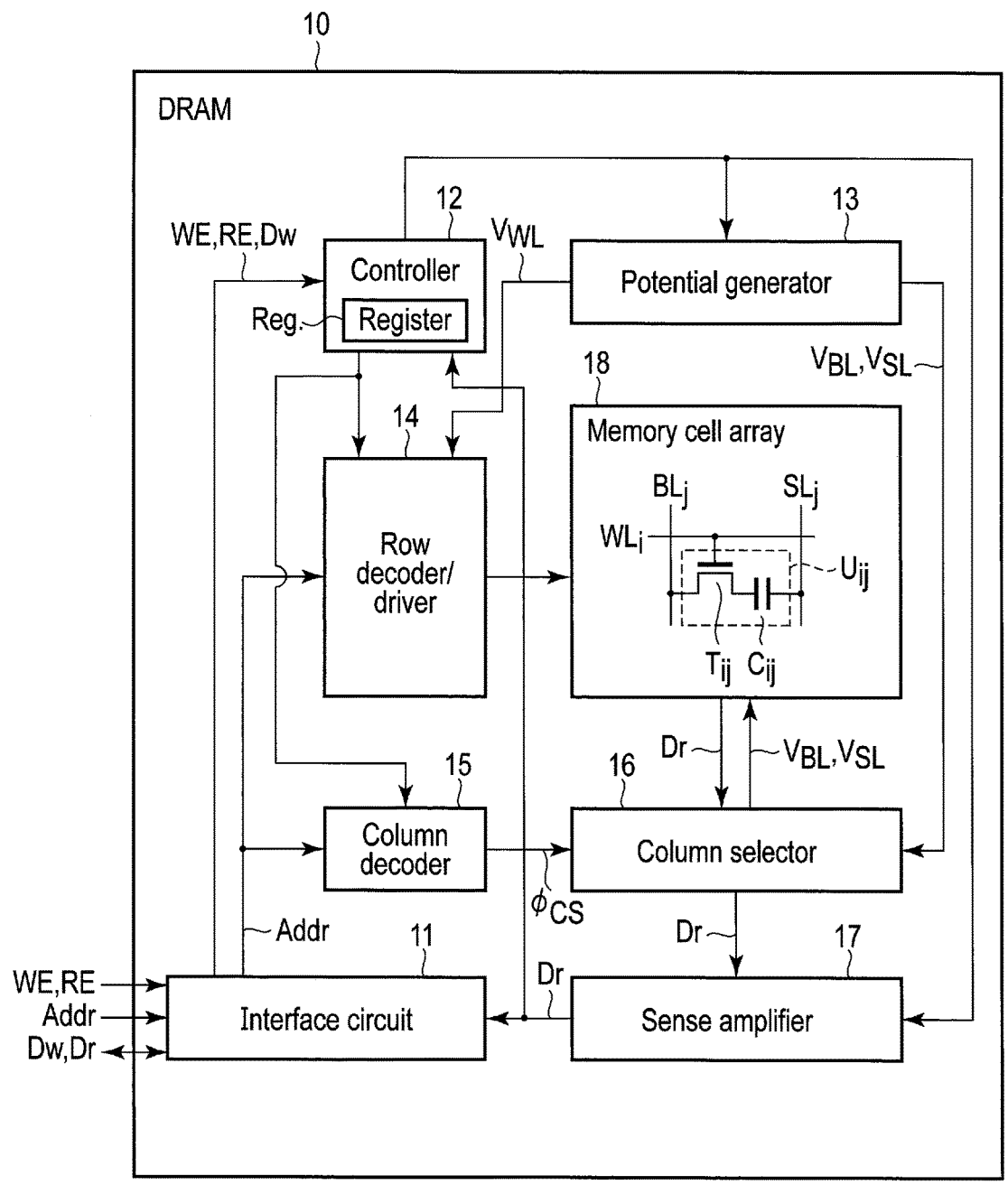
FIG. 22 is a block diagram illustrating a modification of FIG. 1.

Therefore, for example, as illustrated in FIG. 22, it is desirable that the DRAM 10 include a bus to transfer the read data Dr from the sense amplifier 17 to the controller 12, and the controller 12 include a register Reg. to temporally store the read data Dr. Further, the same components in FIG. 22 as those of FIG. 1 are denoted with the same symbols, and the detailed description thereof will be omitted.

In addition, in the case of the multi-level DRAM, for example, as illustrated in FIG. 23, a switch element (for example, the N-channel FET) $Q_{SW}$ used to determine an electrical connection between the bit line $BL_j$ and the sense amplifier 17 is connected between the bit line $BL_j$ and the sense amplifier 17. The ON/OFF of the switch element $Q_{SW}$ is controlled by the control signal $\varphi_{SW}$ from the controller 12 of FIG. 22.

The switch element $Q_{SW}$ is provided to prevent the data which is read out of the memory cell $U_{ij}$ and amplified by the sense amplifier 17 in the read operation from being transferred again to the memory cell $U_{ij}$. However, the function of the switch element $Q_{SW}$ may be realized by the transistor $Q_{clamp}$. In this case, the switch element $Q_{SW}$ may be omitted.

Further, the same elements in FIG. 23 as those of FIG. 3 will be denoted with the same symbols, and the detailed description thereof will be omitted.

Hereinafter, the description will be sequentially given about the write operation and the read operation in the multi-level DRAM.

Figures 25, 26:
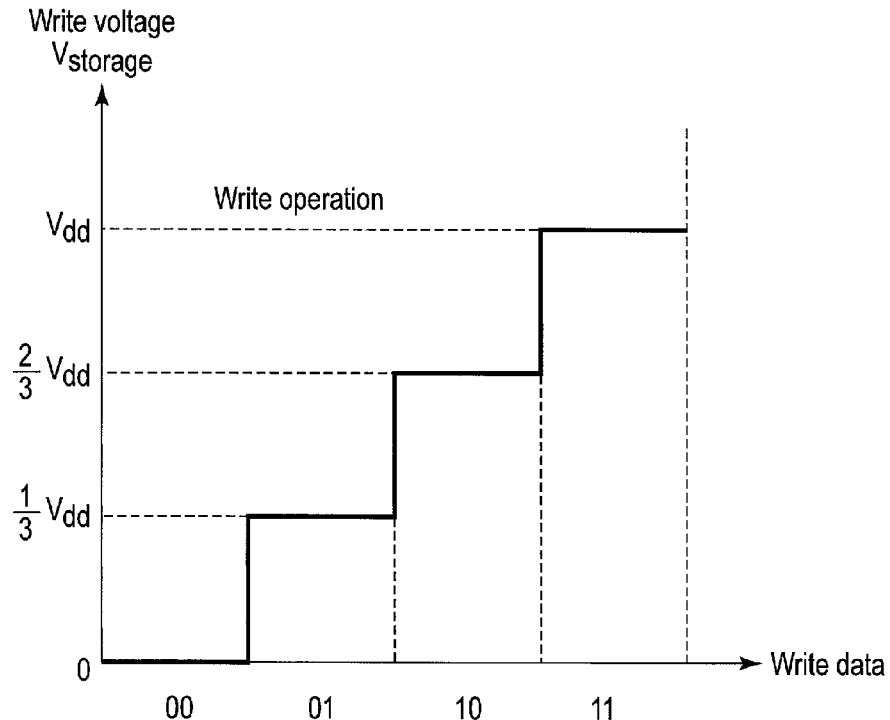
FIG. 25 is a diagram illustrating a relation between the write data and the write voltage.
FIG. 26 is a diagram illustrating an example of determining $V_{storage}$.

FIG. 24 illustrates an example of the write operation. FIG. 25 illustrates a relation between the write data and the write voltage. The example shows that the 2-bit data (00, 01, 10, or 11) is written to the memory cell.

The memory cell includes the capacitor $C_{ij}$ and the transistor $T_{ij}$ which are connected in series between the bit line $BL_j$ and the source line $SL_j$ as illustrated in an equivalent circuit of the drawing.

In this case, the write data can be controlled by the write voltage (capacitor voltage) $V_{storage}$ ($=V_{cap}-V_{SL}$) which is applied to the capacitor $C_{ij}$.

For example, in a case where the write data "11" is written to the memory cell, the write voltage $V_{storage}$ is set to $V_{w11}$ (for example, $V_{dd}$); in a case where the write data "10" is written to the memory cell, the write voltage $V_{storage}$ is set to $V_{w10}$ (for example, $(2/3) \times V_{dd}$); in a case where the write data "01" is written to the memory cell, the write voltage $V_{storage}$ is set to $V_{w01}$ (for example, $(1/3) \times V_{dd}$); and in a case where the write data "00" is written to the memory cell, the write voltage $V_{storage}$ is set to $V_{w00}$ (for example, 0V). In this case, it is assumed that there is a relation $V_{w00} < V_{w01} < V_{w10} < V_{w11}$.

FIG. 26 illustrates an example of determining the write voltage $V_{storage}$ in FIGS. 24 and 25.

In this embodiment, the potential $V_{SL}$ of the source line $SL_j$ is changed in the write operation as described above.

Therefore, for example, in a case where the write data "11" is written to the memory cell, the potential $V_{WL}$ of the word line $WL_i$ is set to $V_{on\_w}$, the potential $V_{BL}$ of the bit line $BL_j$ is set to $V_{dd}$, and the potential $V_{SL}$ of the source line $SL_j$ is set to 0V. Herein, $V_{on\_w}$ is equal to or greater than $V_{BL}+V_{th}$ ($V_{on\_w} \geq V_{BL}+V_{th}$) in which $V_{th}$ is a threshold voltage of the transistor $T_{ij}$.

In this case, the write voltage $V_{storage}$ ($=V_{cap}-V_{SL}$) becomes $V_{w11}$ ($=V_{BL}-V_{SL}=V_{dd}$), and the write data "1" is stored in the capacitor $C_{ij}$.

In addition, in a case where the write data "10" is written to the memory cell, the potential $V_{WL}$ of the word line $WL_i$ is set to $V_{on\_w}$, the potential $V_{BL}$ of the bit line $BL_j$ is set to $V_{dd}$, and the potential $V_{SL}$ of the source line $SL_j$ is set to (1/3)×Vdd.

In this case, the write voltage $V_{storage}$ ($=V_{cap}-V_{SL}$) becomes $V_{w10}$ ($=V_{BL}-V_{SL}=(2/3)\times V_{dd}$), and the write data "10" is stored in the capacitor $C_{ij}$.

In addition, in a case where the write data "01" is written to the memory cell, the potential $V_{WL}$ of the word line $WL_i$ is set to $V_{on\_w}$, the potential $V_{BL}$ of the bit line $BL_j$ is set to $V_{dd}$, and the potential $V_{SL}$ of the source line $SL_j$ is set to (2/3)×Vdd.

In this case, the write voltage $V_{storage}$ ($=V_{cap}-V_{SL}$) becomes $V_{w01}$ ($=V_{BL}-V_{SL}=(1/3)\times V_{dd}$), and the write data "01" is stored in the capacitor $C_{ij}$.

In addition, in a case where the write data "00" is written to the memory cell, the potential $V_{WL}$ of the word line $WL_i$ is set to $V_{on\_w}$, the potential $V_{BL}$ of the bit line $BL_j$ is set to $V_{dd}$, and the potential $V_{SL}$ of the source line $SL_j$ is set to $V_{dd}$.

In this case, the write voltage $V_{storage}$ ($=V_{cap}-V_{SL}$) becomes $V_{w00}$ ($=V_{BL}-V_{SL}=0V$), and the write data "00" is stored in the capacitor $C_{ij}$.

FIG. 27 illustrates an example of the read operation. FIG. 28 illustrates a relation between the read data and the read voltage. The example shows a case where the 2-bit data (00, 01, 10, or 11) is read out of the memory cell.

The memory cell includes the capacitor $C_{ij}$ and the transistor $T_{ij}$ which are connected in series between the bit line $BL_j$ and the source line $SL_j$ as illustrated in an equivalent circuit of the drawing.

For example, in a case where "11", "10", "01", and "00" are stored in the memory cell, the capacitor $C_{ij}$ stores $V_{dd}$, (2/3)×$V_{dd}$, (1/3)×$V_{dd}$, and 0V respectively as the write voltage $V_{storage}$. In this case, the potential of the source line $SL_j$ is set to 0V.

In this case, the read data can be determined by two read operations.

In a first read operation, a voltage between (2/3)×$V_{dd}$ and (1/3)×$V_{dd}$ (for example, (3/6)×$V_{dd}=V_{dd}/2$) is applied as the read voltage $V_{read}$ ($=V_{BL}-V_{SL}$) to the capacitor $C_{ij}$. Therefore, it is determined whether "11" or "10" is stored in the memory cell, or "01" or "00" is stored.

For example, in the first read operation, the transistor $T_{ij}$ is turned on in a state where the potential $V_{SL}$ of the source line $SL_j$ is set to 0V and the potential $V_{BL}$ of the bit line $BL_j$ is set to the precharge potential $V_{pre}=V_{dd}/2$ (floating), the potential $V_{BL}$ of the bit line $BL_j$ changes according to the data stored in the capacitor $C_{ij}$.

In other words, in a case where the transistor $T_{ij}$ is turned on when the data stored in the capacitor $C_{ij}$ is "11" or "10" ($V_{cap}$ is $V_{dd}$ or (2/3)×$V_{dd}$), the charges accumulated in the capacitor $C_{ij}$ move to the bit line $BL_j$, the potential $V_{BL}$ of the bit line $BL_j$ rises up by ΔV1 from $V_{pre}=V_{dd}/2$ (floating). On the contrary, in a case where the transistor $T_{ij}$ is turned on when the data stored in the capacitor $C_{ij}$ is "01" or "00" ($V_{cap}$ is (1/3)×$V_{dd}$ or 0V), the charges accumulated in the bit line $BL_j$ move to the capacitor $C_{ij}$, and the potential $V_{BL}$ of the bit line $BL_j$ falls down by ΔV1 from $V_{dd}/2$ (floating).

Therefore, when the change in potential of the bit line $BL_j$ is detected by the sense amplifier, it is possible to determine whether the data stored in the memory cell is "11" or "10", or "01" or "00".

The second read operation is performed on the basis of the result of the first read operation.

First, in the first read operation, in a case where it is determined that the data stored in the memory cell is "11" or "10", a voltage between $V_{dd}$ and (2/3)×$V_{dd}$ (for example, (5/6)×$V_{dd}$) is applied as the read voltage $V_{read}$ ($=V_{BL}-V_{SL}$) to the capacitor $C_{ij}$ in the second read operation (second-A). Therefore, it is possible to determine whether the memory cell stores "11" or "10".

For example, in the second read operation (second-A), when the transistor $T_{ij}$ is turned on in a state where the potential $V_{SL}$ of the source line $SL_j$ is set to 0V and the potential $V_{BL}$ of the bit line $BL_j$ is set to the precharge potential $V_{pre}=(5/6)\times V_{dd}$ (floating), the potential $V_{BL}$ of the bit line $BL_j$ changes according to the data stored in the capacitor $C_{ij}$.

In other words, in a case where the transistor $T_{ij}$ is turned on when the data stored in the capacitor $C_{ij}$ is "11" ($V_{cap}$ is $V_{dd}$), the charges accumulated in the capacitor $C_{ij}$ move to the bit line $BL_j$, and the potential $V_{BL}$ of the bit line $BL_j$ rises up by ΔV2 from $V_{pre}=(5/6)\times V_{dd}$ (floating). On the contrary, in a case where the transistor $T_{ij}$ is turned on when the data stored in the capacitor $C_{ij}$ is "10" ($V_{cap}$ is (2/3)×$V_{dd}$), the charges accumulated in the bit line $BL_j$ move to the capacitor $C_{ij}$, and the potential $V_{BL}$ of the bit line $BL_j$ falls down by ΔV2 from (5/6)×$V_{dd}$ (floating).

Therefore, when the change in potential of the bit line $BL_j$ is detected by the sense amplifier, it is possible to determine whether the data stored in the memory cell is "11" or "10".

Next, in a case where it is determined in the first read operation that the data stored in the memory cell is "01" or "00", a voltage between (1/3)×$V_{dd}$ and 0V (for example, (1/6)×$V_{dd}$) is applied as the read voltage $V_{read}$ ($=V_{BL}-V_{SL}$) to the capacitor $C_{ij}$ in the second read operation (second-B). Therefore, it is possible to determine whether the memory cell store "01" or "00".

For example, when the transistor $T_{ij}$ is turned on in a state where the potential $V_{SL}$ of the source line $SL_j$ is set to 0V and the potential $V_{BL}$ of the bit line $BL_j$ is set to the precharge potential $V_{pre}=(1/6)\times V_{dd}$ (floating) in the second read operation (second-B), the potential $V_{BL}$ of the bit line $BL_j$ changes according to the data stored in the capacitor $C_{ij}$.

In other words, in a case where the transistor $T_{ij}$ is turned on when the data stored in the capacitor $C_{ij}$ is "01" ($V_{cap}$ is (1/3)×$V_{dd}$), the charges accumulated in the capacitor $C_{ij}$ move to the bit line $BL_j$, and the potential $V_{BL}$ of the bit line $BL_j$ rises up by ΔV2 from $V_{pre}=(1/6)\times V_{dd}$ (floating). On the contrary, in a case where the transistor $T_{ij}$ is turned on when the data stored in the capacitor $C_{ij}$ is "00" ($V_{cap}$ is 0V), the charges accumulated in the bit line $BL_j$ move to the capacitor $C_{ij}$, and the potential $V_{BL}$ of the bit line $BL_j$ falls down by ΔV2 from (1/6)×$V_{dd}$ (floating).

Therefore, when the change in potential of the bit line $BL_j$ is detected by the sense amplifier, it is possible to read whether the data stored in the memory cell is "01" or "00".

FIG. 29 illustrates an example of determining the read voltage $V_{read}$ in FIGS. 27 and 28.

For example, in the case of the first read operation, the potential $V_{WL}$ of the word line $WL_i$ is set to $V_{on\_r}$, the potential $V_{BL}$ of the bit line $BL_j$ is set to the precharge potential $V_{pre}=(3/6) \times V_{dd}$ (floating), and the potential $V_{SL}$ of the source line $SL_j$ is set to 0V. In this case, $V_{on\_r}$ is equal to or greater than $V_{BL}+V_{th}$ ($V_{on\_r} \geq V_{BL}+V_{th}$) in which $V_{th}$ is the threshold voltage of the transistor $T_{ij}$.

In this case, as described above, the potential $V_{BL}$ of the bit line $BL_j$ rises up/falls down from the precharge potential $V_{pre}=(3/6) \times V_{dd}$ (floating) according to the data stored in the memory cell.

In this embodiment, as described above, the potential $V_{SL}$ of the source line $SL_j$ can be changed. Therefore, in the first read operation, for example, the potential $V_{SL}$ of the source line $SL_j$ is changed by $\pm\beta V$ from 0V, and $\Delta V1$ described above can be increased by the capacity coupling in the capacitor $C_{ij}$ (bit line boost effect). When $\Delta V1$ is large, for example, an initial potential difference generated in two input/output nodes S1 and S2 of the sense amplifier 17 of FIG. 23 is increased, so that the read operation can be performed at a high speed.

For example, in a case where the potential $V_{SL}$ of the source line $SL_j$ is changed by $+\beta V$ from 0V, a rising amount of the potential $V_{BL}$ of the bit line $BL_j$ when the read data is "11" or "10" becomes large compared to that in a case where the potential $V_{SL}$ of the source line $SL_j$ is kept at 0V. In addition, in a case where the potential $V_{SL}$ of the source line $SL_j$ is changed by $-\beta V$ from 0V, a falling amount of the potential $V_{BL}$ of the bit line $BL_j$ when the read data is "01" or "00" becomes large compared to that in a case where the potential $V_{SL}$ of the source line $SL_j$ is kept at 0V.

In addition, in the case of the second-A read operation, the potential $V_{WL}$ of the word line $WL_i$ is set to $V_{on\_r}$, the potential $V_{BL}$ of the bit line $BL_j$ is set to the precharge potential $V_{pre}=(5/6) \times V_{dd}$ (floating), and the potential $V_{SL}$ of the source line $SL_j$ is set to 0V.

In this case, as described above, the potential $V_{BL}$ of the bit line $BL_j$ falls down from the precharge potential $V_{pre}=(5/6) \times V_{dd}$ (floating) according to the data stored in the memory cell.

In addition, in the second-A read operation, similarly to the first read operation, for example, the potential $V_{SL}$ of the source line $SL_j$ is changed by $\pm\beta V$ from 0V, and $\Delta V2$ described above may be increased by the capacity coupling in the capacitor $C_{ij}$ (bit line boost effect).

In addition, in the case of the second-B read operation, the potential $V_{WL}$ of the word line $WL_i$ is set to $V_{on\_r}$, the potential $V_{BL}$ of the bit line $BL_j$ is set to the precharge potential $V_{pre}=(1/6) \times V_{dd}$ (floating), and the potential $V_{SL}$ of the source line $SL_j$ is set to 0V.

In this case, as described above, the potential $V_{BL}$ of the bit line $BL_j$ rises up/falls down from the precharge potential $V_{pre}=(1/6) \times V_{dd}$ (floating) according to the data stored in the memory cell.

In addition, even in the second-B read operation, similarly to the first read operation, for example, the potential $V_{SL}$ of the source line $SL_j$ is changed by $\pm\beta V$ from 0V, and $\Delta V2$ described above may be increased by the capacity coupling in the capacitor $C_{ij}$ (bit line boost effect).

Further, in the case of the multi-level DRAM, the 1-cell/1-bit type of data writing method (the 1-bit data is stored in one memory cell) is employed, and it is desirable that the reference voltage $V_{ref}$ be input to the input/output node S2 in the read operation as illustrated in the sense amplifier 17 of FIG. 23.

FIG. 30 illustrates an example of the potential generator. The potential generator 13 corresponds to the potential generator 13 of FIG. 22.

The potential generator 13 includes the first generator 13_write, the second generator 13_read, and the multiplexers MUX_write and MUX_read.

The first generator 13_write has a function of outputting a potential which is used in the write operation, and enters the operating state when the write enable signal WE becomes active (for example, the high level).

The first generator 13_write outputs, for example, $V_{WL}$ ($=V_{on\_w}$) and $V_{BL}$ ($=V_{dd}$) illustrated in FIG. 26. In addition, the first generator 13_write outputs, for example, $V_{dd}$, $(2/3) \times V_{dd}$, $(1/3) \times V_{dd}$, and 0V. The multiplexer MUX_write outputs, for example, one of $V_{dd}$, $(2/3) \times V_{dd}$, $(1/3) \times V_{dd}$, and 0V as $V_{SL}$ illustrated in FIG. 26 on the basis of the control signal CNT_W from the controller 12 of FIG. 22.

For example, when the control signal CNT_W is "11" (that is, the write data Dw is "11"), the multiplexer MUX_write outputs 0V as $V_{SL}$. In addition, when the control signal CNT_W is "10" (that is, the write data Dw is "10"), the multiplexer MUX_write outputs $(1/3) \times V_{dd}$ as $V_{SL}$. In addition, when the control signal CNT_W is "01" (that is, the write data Dw is "01"), the multiplexer MUX_write outputs $(2/3) \times V_{dd}$ as $V_{SL}$. In addition, when the control signal CNT_W is "00" (that is, the write data Dw is "00"), the multiplexer MUX_write outputs $V_{dd}$ as $V_{SL}$.

The second generator 13_read has a function of outputting a potential which is used in two read operations, and enters the operating state when the read enable signal RE becomes active (for example, the high level).

The second generator 13_read outputs, for example, $V_{WL}$ ($=V_{on\_r}$) and $V_{SL}$ ($=0V$) illustrated in FIG. 29.

In addition, the second generator 13_read outputs, for example, $(5/6) \times V_{dd}$, $(3/6) \times V_{dd}$, and $(1/6) \times V_{dd}$. The multiplexer MUX_read outputs, for example, one of $(5/6) \times V_{dd}$, $(3/6) \times V_{dd}$, and $(1/6) \times V_{dd}$ as $V_{BL}$ ($=V_{pre}$) illustrated in FIG. 29 on the basis of a control signal CNT_r from the controller 12 of FIG. 22.

For example, when the control signal CNT_r indicates the first read operation, the multiplexer MUX_read outputs $(3/6) \times V_{dd}$ as $V_{BL}$. In addition, when the control signal CNT_r indicates the second-A read operation, the multiplexer MUX_read outputs $(5/6) \times V_{dd}$ as $V_{BL}$. When the control signal CNT_r indicates the second-B read operation, the multiplexer MUX_read outputs $(1/6) \times V_{dd}$ as $V_{BL}$.

Figure 31:
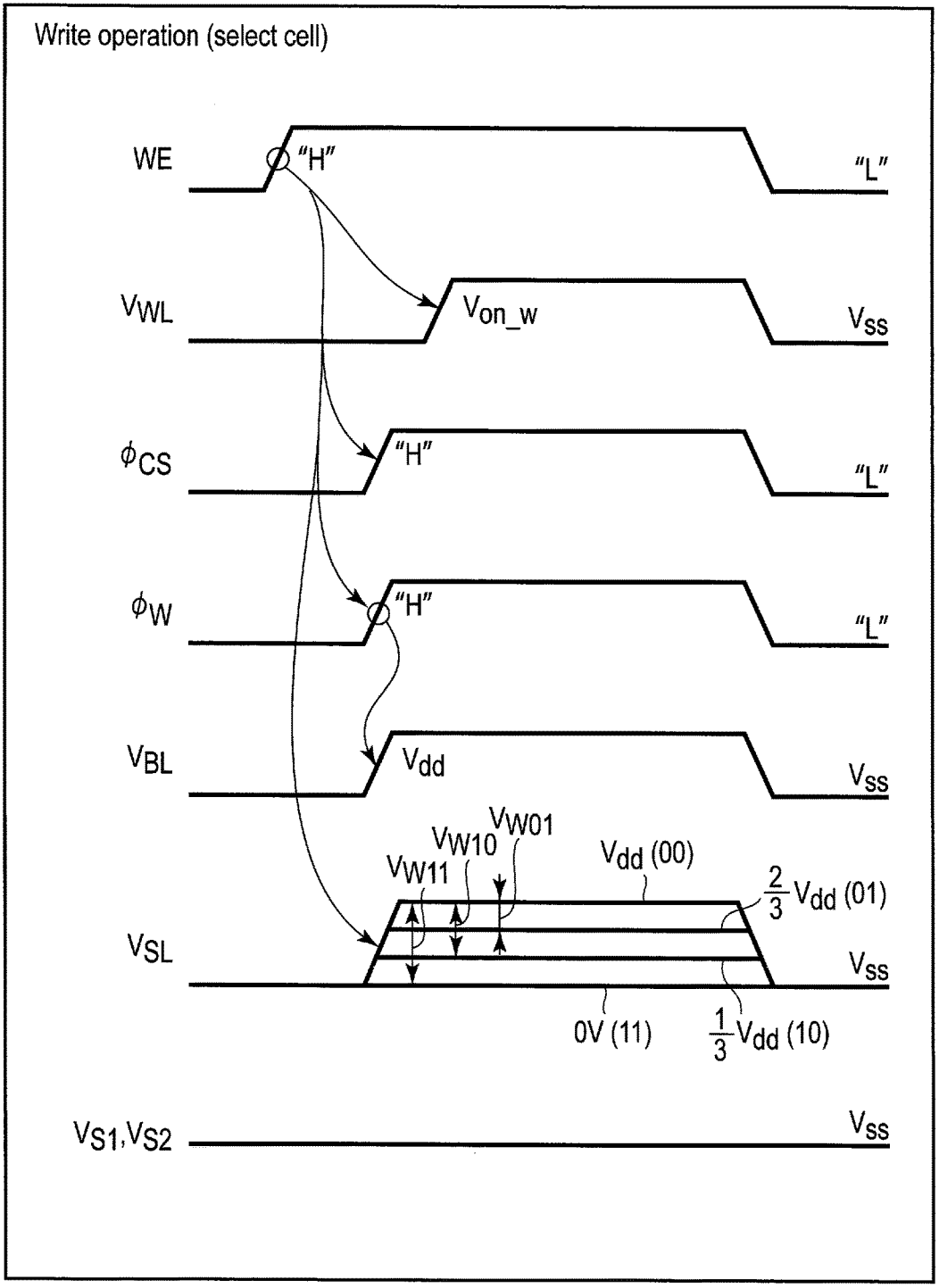
FIG. 31 is a diagram illustrating an example of operation waveforms of the write operation.

FIG. 31 illustrates an example of the operation waveforms of the write operation.

In the drawing, WE is the write enable signal, $V_{WL}$, $V_{BL}$, and $V_{SL}$ correspond to, for example, $V_{WL}$, $V_{BL}$, and $V_{SL}$ of FIG. 26, and $\varphi_W$, $V_{S1}$, and $V_{S2}$ correspond to $\varphi_W$, $V_{S1}$, and $V_{S2}$ of FIG. 23.

The operation waveforms are controlled by the controller 12 of FIG. 22.

When the write enable signal WE ascends to the high level, the controller 12 sets the control signal $\varphi_{CS}$ and the control signal $\varphi_W$ to the high level. When the control signal $\varphi_{CS}$ and the control signal $\varphi_W$ ascend to the high level, $V_{dd}$ is transferred as $V_{BL}$ to the bit line $BL_j$ selected from the potential generator 13 of FIG. 30. In addition, the potential ($V_{dd}$, $(2/3) \times V_{dd}$, $(1/3) \times V_{dd}$, or 0V) corresponding to the write data (00, 01, 10, or 11) is transferred as $V_{SL}$ to the source line $SL_j$ selected from the potential generator 13 of FIG. 30.

Thereafter, the controller 12 instructs the row decoder/driver 14 of FIG. 22 to transfer $V_{on\_w}$ as $V_{WL}$ to the selected word line $WL_i$. In other words, when receiving the instruction from the controller 12, the row decoder/driver 14 of FIG. 22 transfers $V_{on\_w}$ to the word line $WL_i$ selected from the potential generator 13 of FIG. 30.

As a result, the transistor $T_{ij}$ in the selected memory cell (select cell) $U_{ij}$ is turned on, and the write voltage $V_{storage}$ ($V_{W00}$ (0V), $V_{W01}$, $V_{W10}$, or $V_{W11}$) corresponding to the write data (00, 01, 10, or 11) is applied to the capacitor $C_{ij}$ in the select cell $U_{ij}$.

Further, for example, the sense amplifier 17 illustrated in FIG. 23 is not used in the write operation. Therefore, the transistors $Q_{clamp}$ and $Q_{SW}$ are turned off, and the potentials at two input/output nodes S1 and S2 of the sense amplifier 17 come to be a reset state ($V_{ss}$).

FIGS. 32 to 37 illustrate examples of the operation waveforms of the read operation.

The description will be given about a case where the DRAM is a type of storing the 2-bit data in one memory cell and the data is read out of the select cell using the sense amplifier 17 of FIG. 23.

First Read Operation

FIGS. 32 and 33 each illustrate the first read operation. FIG. 32 illustrates the operation waveforms when the data "11" or "10" is stored in the select cell which is a target of the read operation, and FIG. 33 illustrates the operation waveforms when the data "01" or "00" is stored in the select cell.

In these drawings, RE is the read enable signal, $V_{WL}$, $V_{BL}$, and $V_{SL}$ correspond to, for example, $V_{WL}$, $V_{BL}$, and $V_{SL}$ of FIG. 29, and $\varphi_{clamp}$, $\varphi_{sw}$, $\varphi_{pre}$, $\varphi_{SE}$, $V_{S1}$, $V_{S2}$, $\varphi_{rst}$, and $\varphi_{cap}$ correspond to $\varphi_{clamp}$, $\varphi_{sw}$, $\varphi_{pre}$, $\varphi_{SE}$, $V_{S1}$, $V_{S2}$, $\varphi_{rst}$, and $\varphi_{cap}$ of FIG. 23.

The operation waveforms are controlled by the controller 12 of FIG. 22.

When the read enable signal RE ascends to the high level, the controller 12 sets the control signals $\varphi_{CS}$, $\varphi_{clamp}$, and $\varphi_{sw}$ to the high level. In addition, the controller 12 sets the control signal $\varphi_{pre}$ to the high level.

When the control signal $\varphi_{pre}$ ascends to the high level, the precharge potential $V_{pre}$ (=($\frac{3}{6}$)×$V_{dd}$) is transferred as $V_{BL}$ to the bit line $BL_j$ selected from the potential generator 13 of FIG. 30, and the potentials $V_{S1}$ and $V_{S2}$ at two input/output nodes S1 and S2 of the sense amplifier 17 of FIG. 23 are set to the precharge potential $V_{pre}$.

Thereafter, when the control signal $\varphi_{pre}$ descends to the low level, the potential $V_{BL}$ of the selected bit line $BL_j$ and the potentials $V_{S1}$ and $V_{S2}$ at two input/output nodes S1 and S2 each are set to the precharge potential $V_{pre}$ (floating).

In addition, $V_{ss}$ (0V) is transferred as $V_{SL}$ from the potential generator 13 of FIG. 30 to the source line $SL_j$.

Thereafter, the controller 12 instructs the row decoder/driver 14 of FIG. 22 to transfer $V_{on\_r}$ as $V_{WL}$ to the selected word line $WL_i$. In other words, when receiving the instruction from the controller 12, the row decoder/driver 14 of FIG. 22 transfers $V_{on\_r}$ to the selected word line $WL_i$ from the potential generator 13 of FIG. 30.

As a result, the transistor $T_{ij}$ in the selected memory cell (select cell) $U_{ij}$ is turned on, and the potential $V_{BL}$ of the selected bit line $BL_j$ changes according to the data stored in the capacitor $C_{ij}$ in the select cell $U_{ij}$.

For example, as illustrated in FIG. 32, in a case where the transistor $T_{ij}$ is turned on when the data stored in the capacitor $C_{ij}$ is "11" or "10" ($V_{cap}$ is $V_{dd}$ or ($\frac{2}{3}$)×$V_{dd}$), the charges accumulated in the capacitor $C_{ij}$ move to the bit line $BL_j$, and the potential $V_{BL}$ of the bit line $BL_j$ and the potential $V_{S1}$ at the input/output node S1 rise up by $\Delta V1$ from $V_{pre}$=($\frac{3}{6}$)×$V_{dd}$ (floating). At this time, $V_{cap}$ falls down by $\Delta V1$ from $V_{dd}$ or ($\frac{2}{3}$)×$V_{dd}$. In addition, the potential $V_{S2}$ (the reference voltage $V_{ref}$) at the input/output node S2 is kept at $V_{pre}$=($\frac{3}{6}$)×$V_{dd}$ (floating) without any change.

On the contrary, as illustrated in FIG. 33, in a case where the transistor $T_{ij}$ is turned on when the data stored in the capacitor $C_{ij}$ is "01" or "00" ($V_{cap}$ is ($\frac{1}{3}$)×$V_{dd}$ or 0V), the charges accumulated in the bit line $BL_j$ move to the capacitor $C_{ij}$, and the potential $V_{BL}$ of the bit line $BL_j$ and the potential $V_{S1}$ at the input/output node S1 fall down by $\Delta V1$ from ($\frac{3}{6}$)×$V_{dd}$ (floating) (floating). At this time, $V_{cap}$ rises up by $\Delta V1$ from ($\frac{1}{3}$)×$V_{dd}$ or 0V. In addition, the potential $V_{S2}$ (the reference voltage $V_{ref}$) at the input/output node S2 is kept at $V_{pre}$=($\frac{3}{6}$)×$V_{dd}$ (floating) without any change.

Thereafter, the controller 12 sets the control signal (sense amplifier enable signal) $\varphi_{SE}$ to the high level. As a result, for example, the sense amplifier 17 of FIG. 23 enters the operating state, and a potential difference ($V_{S1}$–$V_{S2}$) between two input/output nodes S1 and S2 of the sense amplifier 17 is amplified.

In other words, as illustrated in FIG. 32, in a case where the potential $V_{S1}$ at the input/output node S1 is larger than the potential $V_{S2}$ ($V_{ref}$) at the input/output node S2, the potential $V_{S1}$ at the input/output node S1 changes to $V_{dd}$, and the potential $V_{S2}$ at the input/output node S2 changes to 0V. Therefore, the read data ($V_{dd}$) indicating that the select cell $U_{ij}$ stores "11" or "10" is output from the input/output node S1. The read data is transferred to the interface unit 11 and the controller 12.

On the other hand, as illustrated in FIG. 33, in a case where the potential $V_{S1}$ at the input/output node S1 is smaller than the potential $V_{S2}$ ($V_{ref}$) at the input/output node S2, the potential $V_{S1}$ at the input/output node S1 changes to 0V, and the potential $V_{S2}$ at the input/output node S2 changes to $V_{dd}$. Therefore, the read data (0V) indicating that the select cell $U_{ij}$ stores "01" or "00" is output from the input/output node S1. The read data is transferred to the interface unit 11 and the controller 12.

The controller 12 stores, for example, the read data related to the first read operation in a first register Reg.0 in the register Reg.

In addition, the controller 12 sets the control signal $\varphi_{SW}$ to the low level almost at the same time when the control signal $\varphi_{SE}$ is set to the high level, and turns off the switch element $Q_{SW}$. This operation is to prevent the potential $V_{S1}$ at the input/output node S1 (=$V_{dd}$ or 0V) amplified by the sense amplifier 17 from being transferred to the memory cell $U_{ij}$ through the bit line $BL_j$. In other words, at this time point, the write-back operation is not performed with respect to the memory cell $U_{ij}$.

Further, in a case where the switch element $Q_{SW}$ is omitted, the control signal $\varphi_{clamp}$ may be set to the low level almost at the same time when the control signal $\varphi_{SE}$ is set to the high level.

Thereafter, the controller 12 change the potential $V_{WL}$ of the selected word line $WL_i$ from $V_{on\_r}$ to $V_{ss}$ (0V), and changes each of the control signals $\varphi_{CS}$, $\varphi_{clamp}$, and $\varphi_{SE}$ to the low level.

Finally, the controller 12 sets the control signal $\varphi_{rst}$ to the high level. As a result, the potential $V_{BL}$ of the selected bit line $BL_j$, and the potentials $V_{S1}$ and $V_{S2}$ at two input/output nodes S1 and S2 of the sense amplifier 17 become to $V_{ss}$ (0V) and reset.

Second-A Read Operation

Figure 35:
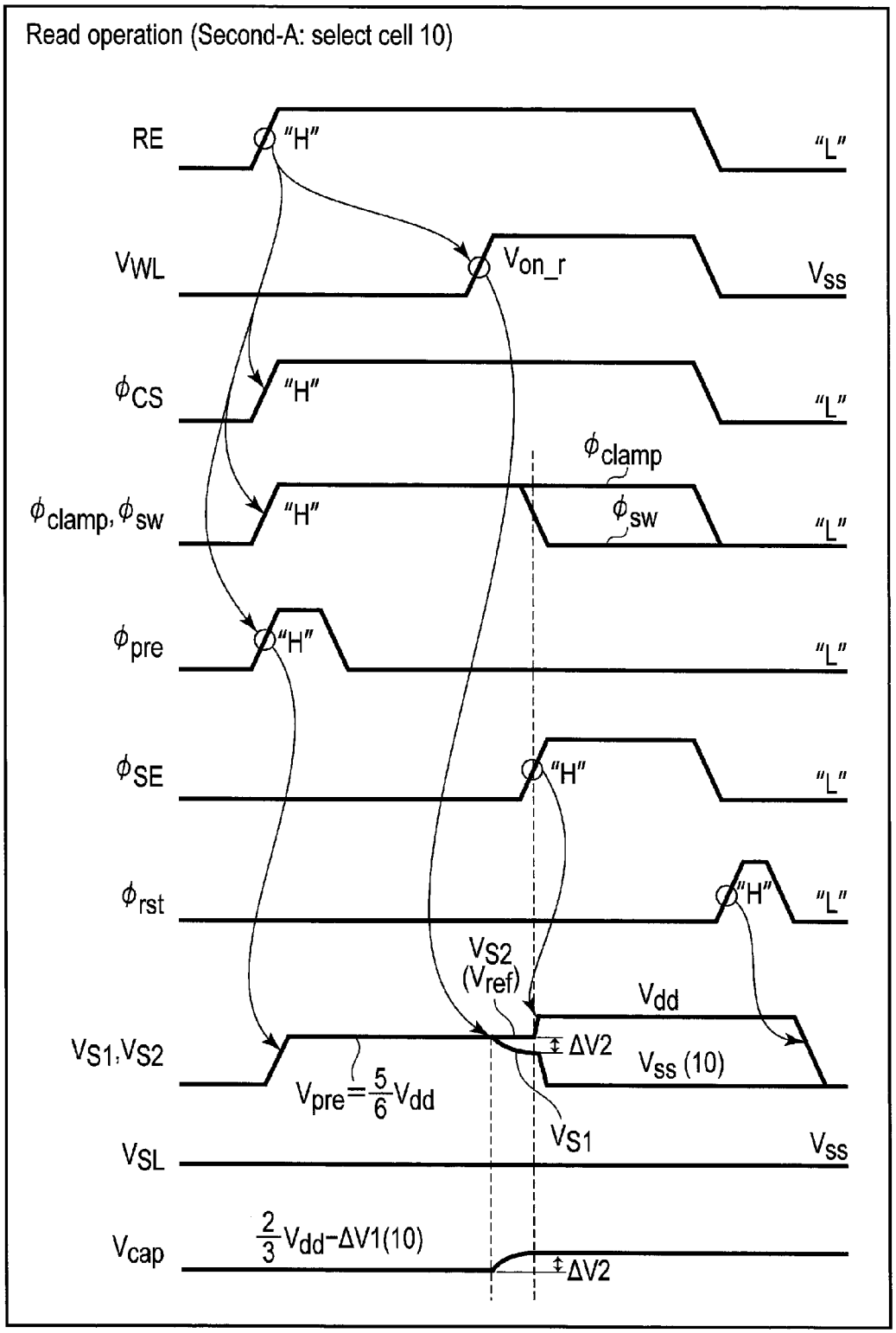
FIG. 35 is a diagram illustrating an example of the operation waveforms of the second-A read operation.

FIGS. 34 and 35 each illustrate the second-A read operation. FIG. 34 illustrates the operation waveforms when the data "11" is stored in the select cell which is a target of the read operation, and FIG. 35 illustrates the operation waveforms when the data "10" is stored in the select cell.

In these drawings, RE is the read enable signal, $V_{WL}$, $V_{BL}$, and $V_{SL}$ correspond to, for example, $V_{WL}$, $V_{BL}$, and $V_{SL}$ of FIG. 29, and $\varphi_{clamp}$, $\varphi_{sw}$, $\varphi_{pre}$, $\varphi_{SE}$, $V_{S1}$, $V_{S2}$, $\varphi_{rst}$, and $\varphi_{cap}$ correspond to $\varphi_{clamp}$, $\varphi_{SW}$, $\varphi_{pre}$, $\varphi_{SE}$, $V_{S1}$, $V_{S2}$, $\varphi_{rst}$, and $\varphi_{cap}$ of FIG. 23.

The operation waveforms are controlled by the controller 12 of FIG. 22.

When the read enable signal RE ascends to the high level, the controller 12 sets the control signals $\varphi_{CS}$, $\varphi_{clamp}$ and $\varphi_{sw}$ to the high level. In addition, the controller 12 sets the control signal $\varphi_{pre}$ to the high level.

When the control signal $\varphi_{pre}$ ascends to the high level, the precharge potential $V_{pre}$ ($=(5/6) \times V_{dd}$) is transferred as $V_{BL}$ to the bit line $BL_j$ selected from the potential generator 13 of FIG. 30, and the potentials $V_{S1}$ and $V_{S2}$ at two input/output nodes S1 and S2 of the sense amplifier 17 of FIG. 23 are set to the precharge potential $V_{pre}$.

Thereafter, when the control signal $\varphi_{pre}$ descends to the low level, the potential $V_{BL}$ of the selected bit line $BL_j$ and the potentials $V_{S1}$ and $V_{S2}$ at two input/output nodes S1 and S2 each are set to the precharge potential $V_{pre}$ (floating).

In addition, $V_{ss}$ (0V) is transferred as $V_{SL}$ from the potential generator 13 of FIG. 30 to the source line $SL_j$.

Thereafter, the controller 12 instructs the row decoder/driver 14 of FIG. 22 to transfer $V_{on\_r}$ as $V_{WL}$ to the selected word line $WL_i$. In other words, when receiving the instruction from the controller 12, the row decoder/driver 14 of FIG. 22 transfers $V_{on\_r}$ to the selected word line $WL_i$ from the potential generator 13 of FIG. 30.

As a result, the transistor $T_{ij}$ in the selected memory cell (select cell) $U_{ij}$ is turned on, and the potential $V_{BL}$ of the selected bit line $BL_j$ changes according to the data stored in the capacitor $C_{ij}$ in the select cell $U_{ij}$.

For example, as illustrated in FIG. 34, in a case where the transistor $T_{ij}$ is turned on when the data stored in the capacitor $C_{ij}$ is "11" ($V_{cap}$ is $V_{dd} - \Delta V1$), the charges accumulated in the capacitor $C_{ij}$ move to the bit line $BL_j$, and the potential $V_{BL}$ of the bit line $BL_j$ and the potential $V_{S1}$ at the input/output node S1 rise up by $\Delta V2$ from $V_{pre}=(5/6) \times V_{dd}$ (floating). At this time, $V_{cap}$ falls down by $\Delta V2$ from $V_{dd} - \Delta V1$. In addition, the potential $V_{S2}$ (the reference voltage $V_{ref}$) at the input/output node S2 is kept at $V_{pre}=(5/6) \times V_{dd}$ (floating) without any change.

On the contrary, as illustrated in FIG. 35, in a case where the transistor $T_{ij}$ is turned on when the data stored in the capacitor $C_{ij}$ is "10" ($V_{cap}$ is $((2/3) \times V_{dd}) - \Delta V1$), the charges accumulated in the bit line $BL_j$ move to the capacitor $C_{ij}$, and the potential $V_{BL}$ of the bit line $BL_j$ and the potential $V_{S1}$ at the input/output node S1 fall down by $\Delta V2$ from $(5/6) \times V_{dd}$ (floating) (floating). At this time, $V_{cap}$ rises up by $\Delta V2$ from $((2/3) \times V_{dd}) - \Delta V1$. In addition, the potential $V_{S2}$ (the reference voltage $V_{ref}$) at the input/output node S2 is kept at $V_{pre}=(5/6) \times V_{dd}$ (floating) without any change.

Thereafter, the controller 12 sets the control signal (sense amplifier enable signal) $\varphi_{SE}$ to the high level. As a result, for example, the sense amplifier 17 of FIG. 23 enters the operating state, and a potential difference $(V_{S1}-V_{S2})$ between two input/output nodes S1 and S2 of the sense amplifier 17 is amplified.

In other words, as illustrated in FIG. 33, in a case where the potential $V_{S1}$ at the input/output node S1 is larger than the potential $V_{S2}$ ($V_{ref}$) at the input/output node S2, the potential $V_{S1}$ at the input/output node S1 changes to $V_{dd}$, and the potential $V_{S2}$ at the input/output node S2 changes to 0V.

Therefore, the read data "11" ($V_{dd}$) is output from the input/output node S1. The read data is transferred to the interface unit 11 and the controller 12.

On the other hand, as illustrated in FIG. 35, in a case where the potential $V_{S1}$ at the input/output node S1 is smaller than the potential $V_{S2}$ ($V_{ref}$) at the input/output node S2, the potential $V_{S1}$ at the input/output node S1 changes to 0V, and the potential $V_{S2}$ at the input/output node S2 changes to $V_{dd}$. Therefore, the read data "10" (0V) is output from the input/output node S1. The read data is transferred to the interface unit 11 and the controller 12.

The controller 12 stores, for example, the read data related to the second-A read operation in a second register Reg.1 in the register Reg.

In addition, the controller 12 sets the control signal $\varphi_{SW}$ to the Low Level Almost at the Same Time when the control signal $\varphi_{SE}$ is set to the high level, and turns off the switch element $Q_{SW}$. This operation is to prevent the potential $V_{S1}$ at the input/output node S1 ($=V_{dd}$ or 0V) amplified by the sense amplifier 17 from being transferred to the memory cell $U_{ij}$ through the bit line $BL_j$. In other words, at this time point, the write-back operation is not performed with respect to the memory cell $U_{ij}$.

Further, in a case where the switch element $Q_{SW}$ is omitted, the control signal $\varphi_{clamp}$ may be set to the low level almost at the same time when the control signal $\varphi_{SE}$ is set to the high level.

Thereafter, the controller 12 change the potential $V_{WL}$ of the selected word line $WL_i$ from $V_{on\_r}$ to $V_{ss}$ (0V), and changes each of the control signals $\varphi_{CS}$, $\varphi_{clamp}$, and $\varphi_{SE}$ to the low level.

Finally, the controller 12 sets the control signal $\varphi_{rst}$ to the high level. As a result, the potential $V_{BL}$ of the selected bit line $BL_j$, and the potentials $V_{S1}$ and $V_{S2}$ at two input/output nodes S1 and S2 of the sense amplifier 17 become to $V_{ss}$ (0V) and reset.

Second-B Read Operation

Figure 37:
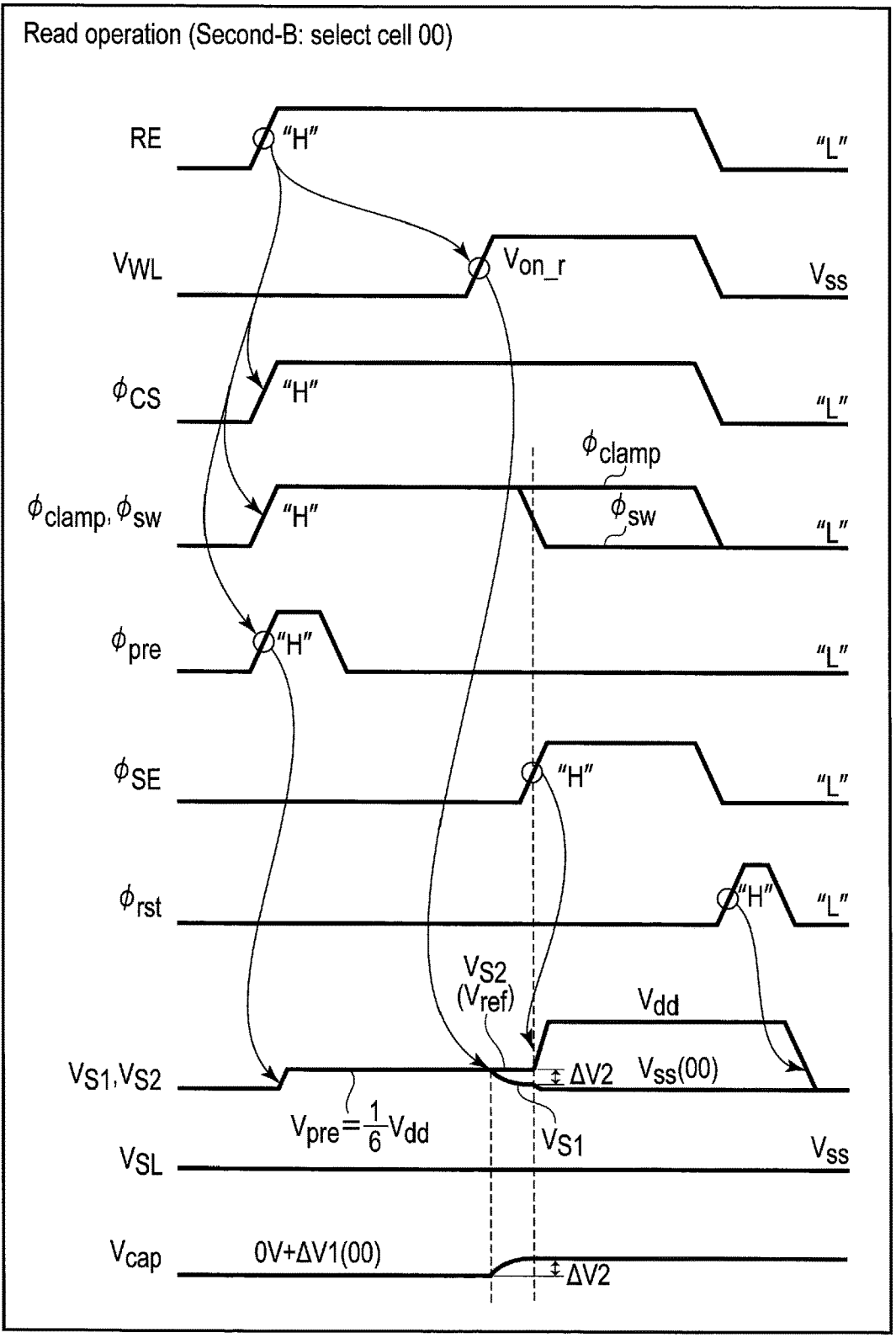
FIG. 37 is a diagram illustrating an example of the operation waveforms of the second-B read operation.

FIGS. 36 and 37 each illustrate the second-B read operation. FIG. 36 illustrates the operation waveforms when the data "01" is stored in the select cell which is a target of the read operation, and FIG. 37 illustrates the operation waveforms when the data "00" is stored in the select cell.

In these drawings, RE is the read enable signal, $V_{WL}$, $V_{BL}$, and $V_{SL}$ correspond to, for example, $V_{WL}$, $V_{BL}$, and $V_{SL}$ of FIG. 29, and $\varphi_{clamp}$, $\varphi_{sw}$, $\varphi_{pre}$, $\varphi_{SE}$, $V_{S1}$, $V_{S2}$, $\varphi_{rst}$, and $\varphi_{cap}$ correspond to $\varphi_{sw}$, $\varphi_{pre}$, $\varphi_{SE}$, $V_{S1}$, $V_{S2}$, $\varphi_{rst}$, and $\varphi_{cap}$ of FIG. 23.

The operation waveforms are controlled by the controller 12 of FIG. 22.

When the read enable signal RE ascends to the high level, the controller 12 sets the control signals $\varphi_{CS}$, $\varphi_{clamp}$, and $\varphi_{sw}$ to the high level. In addition, the controller 12 sets the control signal $\varphi_{pre}$ to the high level.

When the control signal $\varphi_{pre}$ ascends to the high level, the precharge potential $V_{pre}$ ($=(1/6) \times V_{dd}$) is transferred as $V_{BL}$ to the bit line $BL_j$ selected from the potential generator 13 of FIG. 30, and the potentials $V_{S1}$ and $V_{S2}$ at two input/output nodes S1 and S2 of the sense amplifier 17 of FIG. 23 are set to the precharge potential $V_{pre}$.

Thereafter, when the control signal $\varphi_{pre}$ descends to the low level, the potential $V_{BL}$ of the selected bit line $BL_j$ and the potentials $V_{S1}$ and $V_{S2}$ at two input/output nodes S1 and S2 each are set to the precharge potential $V_{pre}$ (floating).

In addition, $V_{ss}$ (0V) is transferred as $V_{SL}$ from the potential generator 13 of FIG. 30 to the source line $SL_j$.

Thereafter, the controller 12 instructs the row decoder/driver 14 of FIG. 22 to transfer $V_{on\_r}$ as $V_{WL}$ to the selected word line WL$_i$. In other words, when receiving the instruction from the controller 12, the row decoder/driver 14 of FIG. 22 transfers V$_{on\_r}$ to the selected word line WL$_i$ from the potential generator 13 of FIG. 30.

As a result, the transistor T$_{ij}$ in the selected memory cell (select cell) U$_{ij}$ is turned on, and the potential V$_{BL}$ of the selected bit line BL$_j$ changes according to the data stored in the capacitor C$_{ij}$ in the select cell U$_{ij}$.

For example, as illustrated in FIG. 36, in a case where the transistor T$_{ij}$ is turned on when the data stored in the capacitor C$_{ij}$ is "01" (V$_{cap}$ is (⅓)×V$_{dd}$), the charges accumulated in the capacitor C$_{ij}$ move to the bit line BL$_j$, and the potential V$_{BL}$ of the bit line BL$_j$ and the potential V$_{S1}$ at the input/output node S1 rise up by ΔV2 from V$_{pre}$=(⅙)×V$_{dd}$ (floating). At this time, V$_{cap}$ is lowered by ΔV2 from ((⅓)×V$_{dd}$)+ΔV1. In addition, the potential V$_{S2}$ (the reference voltage V$_{ref}$) at the input/output node S2 is kept at V$_{pre}$=(⅙)×V$_{dd}$ (floating) without any change.

On the contrary, as illustrated in FIG. 37, in a case where the transistor T$_{ij}$ is turned on when the data stored in the capacitor C$_{ij}$ is "00" (V$_{cap}$ is 0V), the charges accumulated in the bit line BL$_1$ move to the capacitor C$_{ij}$, and the potential V$_{BL}$ of the bit line BL$_j$ and the potential V$_{S1}$ at the input/output node S1 fall down by ΔV2 from (⅙)×V$_{dd}$ (floating) (floating). At this time, V$_{cap}$ rises up by ΔV2 from (0V+ ΔV1). In addition, the potential V$_{S2}$ (the reference voltage V$_{ref}$) at the input/output node S2 is kept at V$_{pre}$=(⅙)×V$_{dd}$ (floating) without any change.

Thereafter, the controller 12 sets the control signal (sense amplifier enable signal) φ$_{SE}$ to the high level. As a result, for example, the sense amplifier 17 of FIG. 23 enters the operating state, and a potential difference (V$_{S1}$–V$_{S2}$) between two input/output nodes S1 and S2 of the sense amplifier 17 is amplified.

In other words, as illustrated in FIG. 36, in a case where the potential V$_{S1}$ at the input/output node S1 is larger than the potential V$_{S2}$ (V$_{ref}$) at the input/output node S2, the potential V$_{S1}$ at the input/output node S1 changes to V$_{dd}$, and the potential V$_{S2}$ at the input/output node S2 changes to 0V. Therefore, the read data "01" (V$_{dd}$) is output from the input/output node S1. The read data is transferred to the interface unit 11 and the controller 12.

On the other hand, as illustrated in FIG. 37, in a case where the potential V$_{S1}$ at the input/output node S1 is smaller than the potential V$_{S2}$ (V$_{ref}$) at the input/output node S2, the potential V$_{S1}$ at the input/output node S1 changes to 0V, and the potential V$_{S2}$ at the input/output node S2 changes to V$_{dd}$. Therefore, the read data "00" (0V) is output from the input/output node S1. The read data is transferred to the interface unit 11 and the controller 12.

The controller 12 stores, for example, the read data related to the second-B read operation in a second register Reg.1 in the register Reg.

In addition, the controller 12 sets the control signal φ$_{SW}$ to the low level almost at the same time when the control signal φ$_{SE}$ is set to the high level, and turns off the switch element Q$_{SW}$. This operation is to prevent the potential V$_{S1}$ at the input/output node S1 (=V$_{dd}$ or 0V) amplified by the sense amplifier 17 from being transferred to the memory cell U$_{ij}$ through the bit line BL$_j$. In other words, at this time point, the write-back operation is not performed with respect to the memory cell U$_{ij}$.

Further, in a case where the switch element Q$_{SW}$ is omitted, the control signal φ$_{clamp}$ may be set to the low level almost at the same time when the control signal φ$_{SE}$ is set to the high level.

Thereafter, the controller 12 change the potential V$_{WL}$ of the selected word line WL$_i$ from V$_{on\_r}$ to V$_{ss}$ (0V), and changes each of the control signals φ$_{CS}$, φ$_{clamp}$, and φ$_{SE}$ to the low level.

Finally, the controller 12 sets the control signal φ$_{rst}$ to the high level. As a result, the potential V$_{BL}$ of the selected bit line BL$_j$, and the potentials V$_{S1}$ and V$_{S2}$ at two input/output nodes S1 and S2 of the sense amplifier 17 become to V$_{ss}$ (0V) and reset.

Hitherto, as described above, the 2-bit data stored in the memory cell U$_{ij}$ can be read out by two read operations.

However, the amount of charges accumulated in the capacitor C$_{ij}$ of the memory cell U$_{ij}$ does not store a correct value due to the above two read operations (destructive read). Therefore, the controller 12 of FIG. 22 performs the write-back operation to rewrite a correct amount of charges to the capacitor C$_{ij}$ on the basis of the data stored in the register Reg. after performing the above two read operations.

Figure 38:
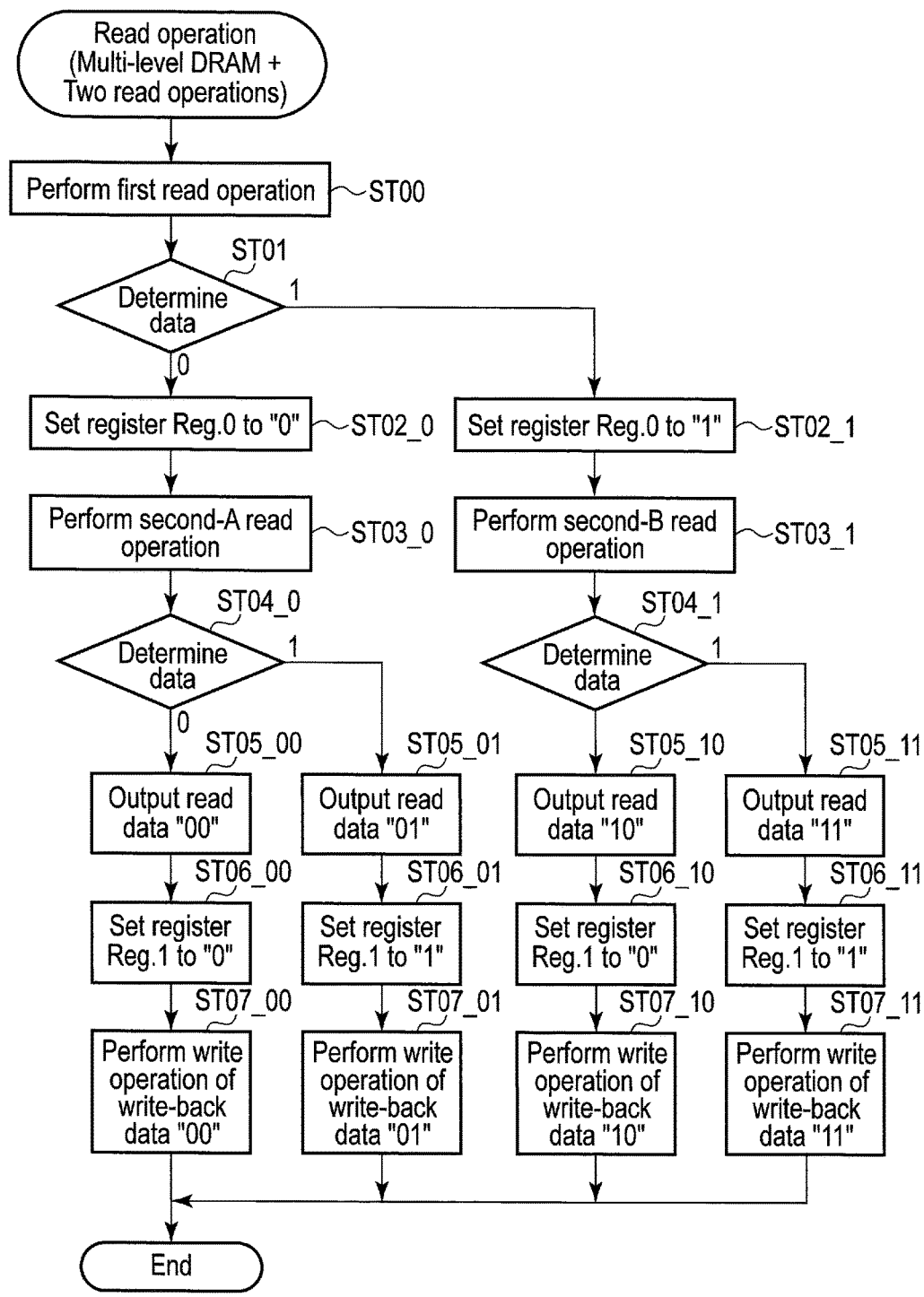
FIG. 38 is a flowchart illustrating a flow of Multi-level DRAM+twice read.

FIG. 38 is a flowchart of the two read operations and the write-back operation.

In the drawing, Steps ST00, ST01, ST02_0, ST02_1, ST03_0, ST03_1, ST04_0, ST04_1, ST05_00, ST05_01, ST05_10, ST05_11, ST06_00, ST06_01, ST06_10, and ST06_11 correspond to the above two read operations.

Figure 39:
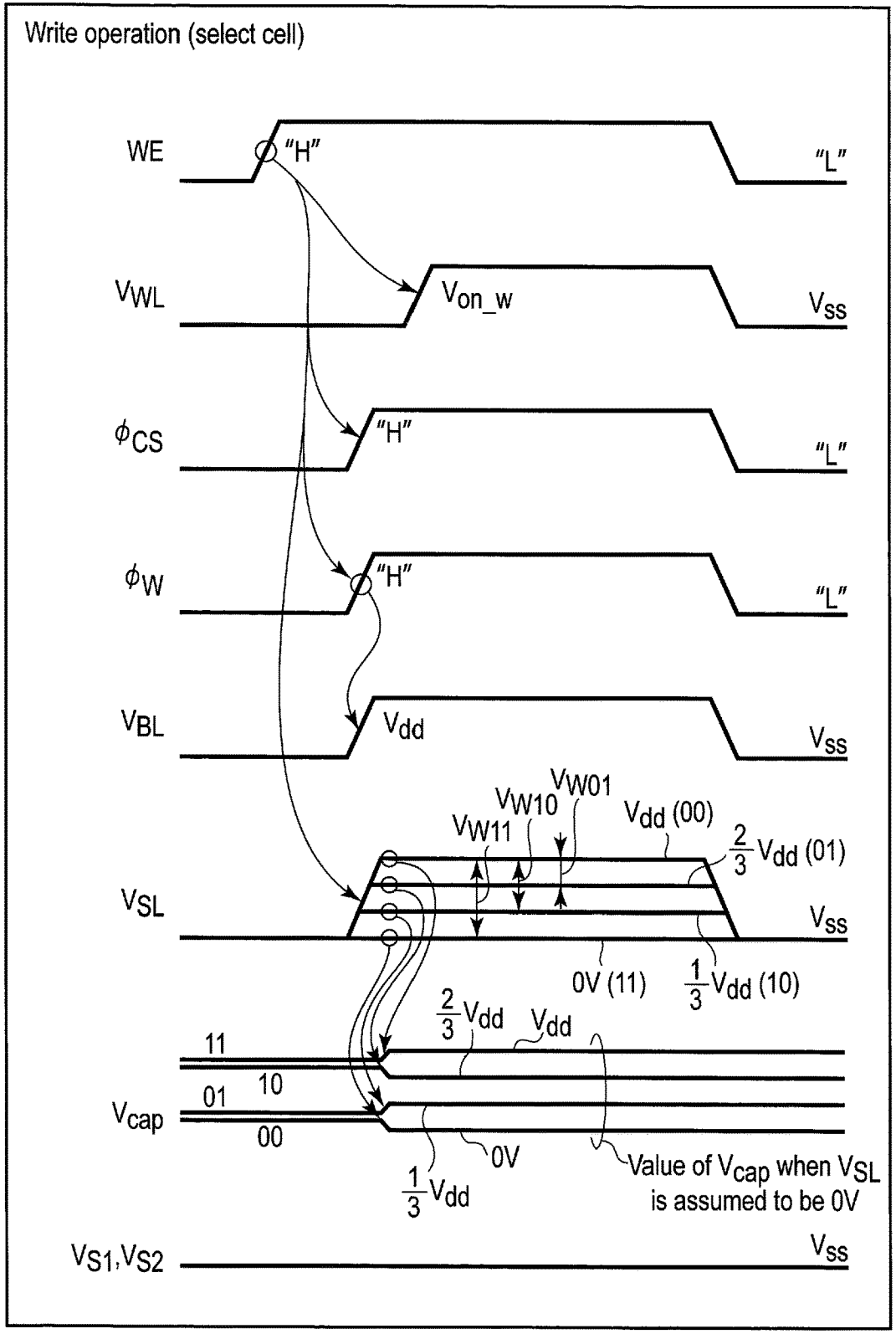
FIG. 39 is a diagram illustrating an example of operation waveforms of a write-back operation.

FIG. 39 illustrates an example of the operation waveforms of the write-back operation. The operation waveforms correspond to Steps ST07_00, ST07_01, ST07_10, and ST07_11 of FIG. 38.

In addition, in the drawing, WE corresponds to the write enable signal, V$_{WL}$, V$_{BL}$, and V$_{SL}$ correspond to, for example, V$_{WL}$, V$_{BL}$, and V$_{SL}$ of FIG. 26, and φ$_W$, V$_{cap}$, V$_{S1}$, and V$_{S2}$ correspond to φ$_W$, V$_{cap}$, V$_{S1}$, and V$_{S2}$ of FIG. 23.

The operation waveforms are controlled by the controller 12 of FIG. 22.

When the write enable signal WE ascends to the high level, the controller 12 sets the control signal φ$_{CS}$ and the control signal φ$_W$ to the high level. When the control signal φ$_{CS}$ and the control signal φ$_W$ ascend to the high level, V$_{dd}$ is transferred as V$_{BL}$ to the bit line BL$_j$ selected from the potential generator 13 of FIG. 30. In addition, the potential (V$_{dd}$, (⅔)×V$_{dd}$, (⅓)×V$_{dd}$, or 0V) corresponding to the write-back data (00, 01, 10, or 11) is transferred as V$_{SL}$ to the source line SL$_j$ selected from the potential generator 13 of FIG. 30.

For example, as illustrated in FIG. 40, in a case where the read data is "11" in the above two read operations, the registers Reg.0 and Reg.1 each store the data "11". Therefore, the write-back data is "11", and for example, 0V is transferred as V$_{SL}$ to the source line SL$_j$ selected by the potential generator 13 of FIG. 30.

Similarly, in a case where the read data is "10", "01", and "00" in the above two read operations, the registers Reg.0 and Reg.1 each store the data "10", "01", and "00". Therefore, the write-back data each is "10", "01", and "00".

Then, in a case where the write-back data is "10", (⅓)×V$_{dd}$ is transferred as V$_{SL}$ to the source line SL$_j$ selected by the potential generator 13 of FIG. 30. In addition, in a case where the write-back data is "01", (⅔)×V$_{dd}$ is transferred as V$_{SL}$ to the source line SL$_j$ selected by the potential generator 13 of FIG. 30. Furthermore, in a case where the write-back data is "00", V$_{dd}$ is transferred as V$_{SL}$ to the source line SL$_j$ selected by the potential generator 13 of FIG. 30.

Thereafter, the controller 12 instructs the row decoder/driver 14 of FIG. 22 to transfer V$_{on\_w}$ as V$_{WL}$ to the selected word line WL$_i$. In other words, when receiving the instruction from the controller 12, the row decoder/driver 14 of FIG. 22 transfers $V_{on\_w}$ to the word line $WL_i$ selected from the potential generator 13 of FIG. 30.

As a result, the transistor $T_{ij}$ in the selected memory cell (select cell) $U_{ij}$ is turned on, and the write voltage $V_{storage}$ ($V_{W00}$ (0V), $V_{W01}$, $V_{W10}$, or $V_{W11}$) corresponding to the write-back data (00, 01, 10, or 11) is applied to the capacitor $C_{ij}$ in the select cell $U_{ij}$.

Figure 41:
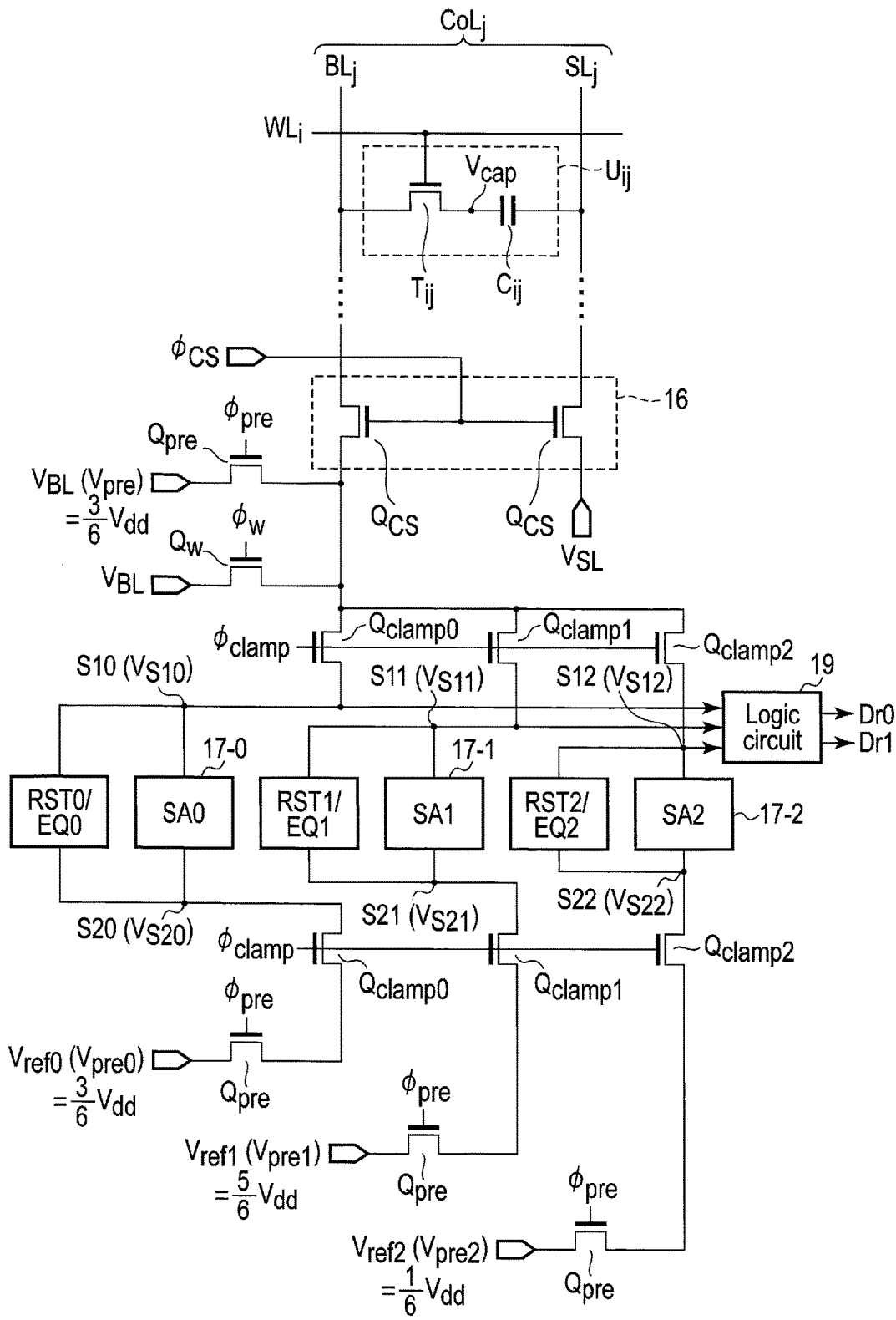
FIG. 41 is a circuit diagram illustrating an example of the peripheral circuit which is used in once reading.

FIG. 41 illustrates a modification of the peripheral circuit of FIG. 23.

In the example of FIG. 23, one sense amplifier 17 in the multi-level DRAM is connected to one memory cell $U_{ij}$. Therefore, in a case where the memory cell $U_{ij}$ stores the n-bit data, the n-bit data is read out of the memory cell $U_{ij}$ by the n read operations as described above. In this case, "n" is a natural number of 2 or more.

With this regard, in the example of FIG. 41, in a case where the memory cell $U_{ij}$ in the multi-level DRAM stores the n-bit data (for example, n=2), ($2^n-1$) sense amplifiers 17-0, 17-1, and 17-2 are connected to one memory cell $U_{ij}$. In this case, the controller 12 causes the n sense amplifiers (SA0, SA1, and SA2) 17-0, 17-1, and 17-2 to be operated in parallel, so that the n-bit data can be read out of the memory cell $U_{ij}$ by one read operation.

In FIG. 41, the same elements as those of FIG. 23 will be denoted with the same symbols, and the detailed description thereof will be omitted. In addition, the example of FIG. 41 is different from the example of FIG. 23 in that the plurality of sense amplifiers 17-0, 17-1, and 17-2 correspond to one memory cell Uij, and a logic circuit 19 outputs the read data Dr0 and Dr1 on the basis of the data from the plurality of sense amplifiers 17-0, 17-1, and 17-2.

The sense amplifiers 17-0, 17-1, and 17-2 each correspond to the sense amplifier 17 of FIG. 23. In addition, RST0/EQ0, RST1/EQ1, and RST2/EQ2 each correspond to the reset circuit (the transistor $Q_{rst}$) of FIG. 23 and the equalize circuit (the transistor $Q_{eq}$).

Herein, as illustrated in the example of FIG. 41, in a case where the 2-bit data is read out by one read operation, the bit line $BL_j$ and nodes S10, S11, and S12 are set to $V_{BL}=(3/6) \times V_{dd}$ as the precharge potential $V_{pre}$.

On the other hand, a node S20 of the sense amplifier 17-0 is set to $V_{ref0}=(3/6) \times V_{dd}$ as a precharge potential $V_{pre0}$. In addition, a node S21 of the sense amplifier 17-1 is set to $V_{ref1}=(5/6) \times V_{dd}$ as a precharge potential $V_{pre1}$. Furthermore, a node S22 of the sense amplifier 17-2 is set to $V_{ref2}=(1/6) \times V_{dd}$ as a precharge potential $V_{pre2}$.

FIG. 42 illustrates an example of the logic circuit 19 of FIG. 41. A potential $V_{S10}$ at the node S10 of FIG. 41 is input to a latch circuit L10. In addition, potentials $V_{S11}$ and $V_{S12}$ at the nodes S11 and S12 of FIG. 41 are input to latch circuits L11 and L12 respectively.

The data (potential) latched by the latch circuits L11 and L12 is input to a multiplexer MUX_dr1.

The data (potential) latched by the latch circuit L10 is output from the logic circuit 19 as the read data Dr0, and at the same time input to the multiplexer MUX_dr1 as a select signal to select the read data Dr1 which is output from the multiplexer MUX_dr1.

For example, when $V_{S10}$ is 1 ($V_{dd}$) and the latch circuit L10 latches "1", the multiplexer MUX_dr1 outputs the data (that is, $V_{S11}$) (potential) latched by the latch circuit L11 as the read data Dr1. In addition, when $V_{S10}$ is "0" ($V_{ss}$) and the latch circuit L10 latches "0", the multiplexer MUX_dr1 outputs the data (that is, $V_{S12}$) (potential) latched by the latch circuit L12 as the read data Dr1.

FIG. 43 illustrates a flowchart of once reading in which the peripheral circuit of FIG. 41 is used. FIG. 44 illustrates the operations of the plurality of sense amplifiers SA0, SA1, and SA2 of FIG. 41 in a case where the once reading is performed.

The once reading is to perform the first read operation of FIGS. 32 and 33, the second-A read operation of FIGS. 34 and 35, and the second-B read operation of FIGS. 36 and 37 at a time.

First, similarly to the examples of FIGS. 32 to 37, the read operation is performed, and the read data is determined and output using the sense amplifiers SA0, SA1, and SA2 and the logic circuit 19 (Steps ST10, ST11, and ST12).

In this case, the bit line $BL_j$ and the nodes S10, S11, and S12 are set to $V_{BL}$ ($V_{pre}$)=$(3/6) \times V_{dd}$. In addition, the node S20 of the sense amplifier SA0 is set to $V_{ref0}$ ($V_{pre0}$)=$(3/6) \times V_{dd}$, the node S21 of the sense amplifier SA1 is set to $V_{ref1}$ ($V_{pre1}$)=$(5/6) \times V_{dd}$, and the node S22 of the sense amplifier SA2 is set to $V_{ref2}$ ($V_{pre2}$)=$(1/6) \times V_{dd}$.

At this time, in the sense amplifier SA0, as illustrated in FIG. 44, when the data stored in the memory cell $U_{ij}$ is "11" and "10", the potential $V_{S10}$ at the node S10 becomes $V_{dd}$ (a potential $V_{S20}$ at the node S20 is $V_{ss}$). When the data stored in the memory cell $U_{ij}$ is "01" or "00", the potential $V_{S10}$ at the node S10 becomes $V_{ss}$ (the potential $V_{S20}$ at the node S20 is $V_{dd}$).

In addition, in the sense amplifier SA1, as illustrated in FIG. 44, when the data stored in the memory cell $U_{ij}$ is "11", the potential $V_{S11}$ at the node S11 becomes $V_{dd}$ (a potential $V_{S21}$ at the node S21 is $V_{ss}$). When the data stored in the memory cell $U_{ij}$ is "10", "01", and "00", the potential $V_{S11}$ at the node S11 becomes $V_{ss}$ (the potential $V_{S21}$ at the node S21 is $V_{dd}$).

Furthermore, in the sense amplifier SA2, as illustrated in FIG. 44, when the data stored in the memory cell $U_{ij}$ is "11", "10", and "01", the potential $V_{S12}$ at the node S12 becomes $V_{dd}$ (a potential $V_{S22}$ at the node S22 is $V_{ss}$). When the data stored in the memory cell $U_{ij}$ is "00", the potential $V_{S12}$ at the node S12 becomes $V_{ss}$ (the potential $V_{S22}$ at the node S22 is $V_{dd}$).

Therefore, the logic circuit 19 of FIG. 42 outputs the read data (Dr0=1 and Dr1=1) in a case where the read data is "11" (that is, $V_{S10}$, $V_{S11}$, and $V_{S12}$ are "111" respectively).

In addition, the logic circuit 19 of FIG. 42 outputs the read data (Dr0=1 and Dr1=0) in a case where the read data is "10" (that is, $V_{S10}$, $V_{S11}$, and $V_{S12}$ are "101" respectively). In addition, the logic circuit 19 of FIG. 42 outputs the read data (Dr0=0 and Dr1=1) in a case where the read data is "01" (that is, $V_{S10}$, $V_{S11}$, and $V_{S12}$ are "001" respectively).

Furthermore, the logic circuit 19 of FIG. 42 outputs the read data (Dr0=0 and Dr1=0) in a case where the read data is "00" (that is, in a case where $V_{S10}$, $V_{S11}$, and $V_{S12}$ each are "000" respectively).

FIG. 45 illustrates the above-described configuration. As can be seen from the drawing, the 2-bit data can be read out of the memory cell $U_{ij}$ using sense amplifiers SA0, SA1, and SA2 and the logic circuit 19.

In addition, the read data Dr0 and Dr1 is input to the controller 12 of FIG. 22. Therefore, the controller 12 of FIG. 22 performs the write-back operation on the basis of the read data after the read operation (once reading) (Step ST13).

Since the write-back operation may be performed according to the flow of FIG. 39, the detailed description will be omitted.

Further, the bit line boost effect illustrated in FIGS. 19 to 21 can also be applied to the multi-level DRAM.

(Exemplary Structure of Device Structure)

An advance in performance of the DRAM can be realized by the embodiments of FIGS. 1 to 45. In the following, the description will be given about a technique of achieving cost reduction of the DRAM.

The cost reduction of the DRAM can be realized by, for example, storing a plurality of bits (multi-level) in the memory cell (capacitor) of the DRAM as described above, and also can be realized by forming the DRAM in a three-dimensional configuration. With such a configuration, a large capacity of the DRAM is realized, and the cost per a bit is lowered.

Herein, the three-dimensional configuration of the DRAM means that the memory cell (the transistor and the capacitor) is disposed above the upper surface of a semiconductor substrate. In this case, for example, the peripheral circuit such as the sense amplifier is disposed on the semiconductor substrate, and the memory cell array is disposed at a place upper than the peripheral circuit.

Figure 47:
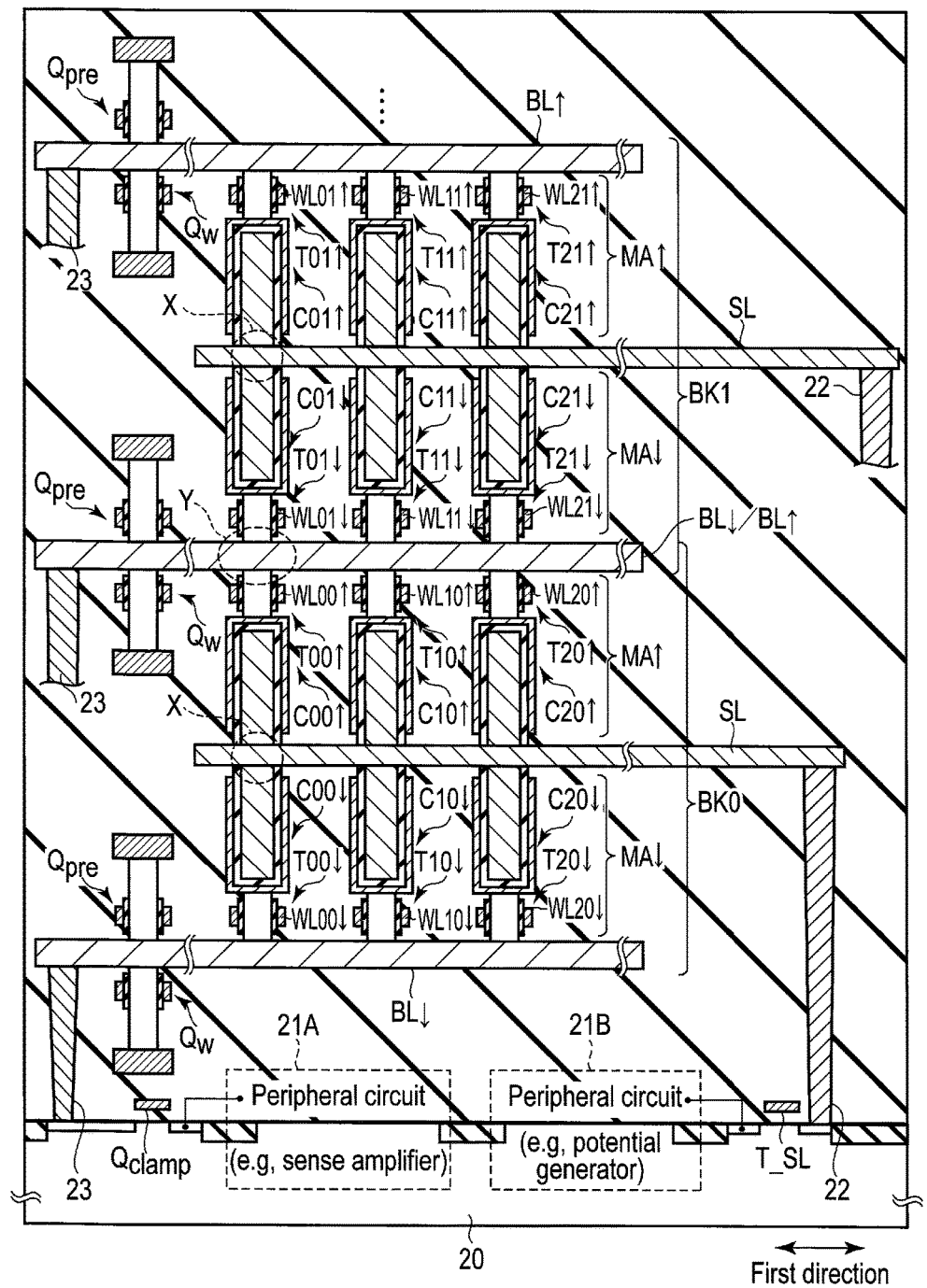
FIG. 47 is a cross-sectional view taken along a line XLVII-XLVII of FIG. 46.

FIG. 46 illustrates a plan view of a three-dimensional DRAM. FIG. 47 is a cross-sectional view taken along a line XLVII-XLVII of FIG. 46.

A semiconductor substrate 20 is, for example, a silicon substrate and includes an upper surface. Peripheral circuits 21A and 21B are disposed on the upper surface of the semiconductor substrate 20. In addition, the transistors (for example, FET) $Q_{clamp}$ and T_SL are disposed on the semiconductor substrate 20. The transistor $Q_{clamp}$ corresponds to, for example, the transistor $Q_{clamp}$ of FIGS. 3, 4, and 23. The transistor T_SL is a select element which is used to select the source line SL in the three-dimensional DRAM.

The memory cell array is disposed at a place upper than the peripheral circuits 21A and 21B. The memory cell array includes two blocks BK0 and BK1 which are stacked. In this example, the number of blocks is two, but the invention is not limited thereto. The number of blocks may be one, or two or more.

Each of two blocks BK0 and BK1 further includes two subarrays $MA_\downarrow$ and $MA_\uparrow$. The subarray MAI includes a bit line $BL_\downarrow$, the source line SL placed above the bit line $BL_\downarrow$, and the memory cell (a transistor $T_{ij\downarrow}$ and a capacitor $C_{ij\downarrow}$) between the bit line $BL_\downarrow$ and the source line SL.

The subarray $MA_\uparrow$ includes the source line SL, a bit line $BL_\uparrow$ placed above the source line SL, and the memory cell (a transistor $T_{ij\uparrow}$ and a capacitor $C_{ij\uparrow}$) between the source line SL and the bit line $BL_\uparrow$. The source line SL of the subarray $MA_\downarrow$ and the source line SL of the subarray $MA_\uparrow$ are shared by one conductive line (Area X). The source line SL is connected to the transistor T_SL through a contact plug 22.

In addition, the bit line $BL_\uparrow$ of the block BK0 and the bit line $BL_\downarrow$ of the block BK1 are shared by one conductive line (Area Y). The bit line $BL_\downarrow$ and the bit line $BL_\uparrow$ are connected to the transistor $Q_{clamp}$ through a contact plug 23.

The bit lines $BL_\downarrow$ and $BL_\uparrow$ and the source line SL extend in the first direction along the upper surface of the semiconductor substrate 20. In addition, word lines $WL_{ij\downarrow}$ and $WL_{ij\uparrow}$ extend along the upper surface of the semiconductor substrate 20 and in the second direction intersecting with the first direction.

The memory cell in the subarray $MA_\downarrow$ includes the transistor $T_{ij\downarrow}$ and the capacitor $C_{ij\downarrow}$ above the transistor $T_{ij\downarrow}$.

For example, as illustrated in FIG. 48, the transistor $T_{ij\downarrow}$ includes a semiconductor layer (semiconductor pillar) $24_\downarrow$ as a channel (current path), a gate insulating layer $25_\downarrow$, and the word line $WL_{ij\downarrow}$. The lower surface of the semiconductor layer $24_\downarrow$ is connected to the bit line $BL_\downarrow$ of FIG. 47. The capacitor $C_{ij\downarrow}$ includes a pillar electrode portion $26_\downarrow$, an insulating portion $27_\downarrow$ covering the pillar electrode portion $26_\downarrow$, and a cell electrode portion $28_\downarrow$ covering the insulating portion $27_\downarrow$. The upper surface of the pillar electrode portion $26_\downarrow$ is connected to the source line SL. The lower surface of the cell electrode portion $28_\downarrow$ is connected to the semiconductor layer $24_\downarrow$.

The transistor $T_{ij\downarrow}$ is, for example, a vertical transistor in which the semiconductor layer $24_\downarrow$ is disposed as a channel above the semiconductor substrate 20, and the semiconductor layer $24_\downarrow$ as a channel is intersected with the upper surface of the semiconductor substrate 20. The semiconductor layer $24_1$ as a channel may be made of any material as long as being independent of the semiconductor substrate 20. For example, the semiconductor layer $24_1$ may be made of an epitaxial single crystal silicon layer, a polysilicon layer, or an amorphous silicon layer.

In addition, the semiconductor layer $24_\downarrow$ may be an oxide semiconductor layer.

In recent years, there are researched various oxide semiconductor thin film transistors (so-called oxide semiconductor TFTs) having an excellent off-leak characteristic (a characteristic that a leakage current is less at the time of turning-off). The oxide semiconductor TFT has a feature in that the oxide semiconductor is used as a channel. The oxide semiconductor is, for example, a so-called IGZO (InGaZnO) which contains an indium oxide, a gallium oxide, and a zinc oxide. The oxide semiconductor may be, for example, a tin oxide, aluminum oxide, and a silicon oxide. Such an oxide semiconductor TFT may be employed to the transistor $T_{ij\downarrow}$.

The oxide semiconductor TFT can be formed by a low temperature process of, for example, about 200° C. Therefore, the technique is significantly effective to the three-dimensional DRAM in a sense that the peripheral circuits 21A and 21B on the semiconductor substrate 20 are not subjected to a heat stress in a wafer process. In addition, the oxide semiconductor TFT can significantly reduce a leakage current at the time of turning-off compared to a general silicon channel transistor.

Therefore, when the oxide semiconductor (for example, IGZO etc.) is used as the semiconductor layer $24_\downarrow$, it is possible to realize a DRAM (ULR DRAM: Ultra Long Retention DRAM) which has a significantly long data retaining time.

For example, in a case where the transistor $T_{ij\downarrow}$ has a silicon channel, the retaining time is about 64 msec. Therefore, the data has to be refreshed (rewritten) in a short time period. On the contrary, in a case where the transistor $T_{ij\downarrow}$ has an IGZO channel, the retaining time is about 10 days. Therefore, the refreshing of the data does not affect the performance of the system.

In this embodiment, the semiconductor layer $24_\downarrow$ serving as a channel of the transistor $T_{ij\downarrow}$ is formed in a cylindrical shape, but the invention is not limited thereto. The gate insulating layer $25_\downarrow$ includes, for example, an insulating body such as a silicon oxide. The word line $WL_{ij\downarrow}$ includes, for example, a metal material such as aluminum, copper, and tungsten.

The capacitor $C_{ij\downarrow}$ is a so-called fin-type capacitor. The capacitor $C_{ij\downarrow}$ is formed in a cylindrical shape, but the invention is not limited thereto. The pillar electrode portion $26_\downarrow$ and the cell electrode portion $28_\downarrow$ include, for example, a metal material such as aluminum, copper, and tungsten. The insulating portion $27_\downarrow$ includes, for example, a copper oxide, a tungsten oxide, a silicon oxide, an aluminum oxide, a hafnia oxide, a zirconium oxide, a tantalum oxide, and a stacked structure of these oxides.

The memory cell in the subarray $MA_\uparrow$ includes the capacitor $C_{ij\uparrow}$ and the transistor $T_{ij\uparrow}$ on the capacitor $C_{ij\uparrow}$.

For example, as illustrated in FIG. 49, the transistor $T_{ij\uparrow}$ includes a semiconductor layer (semiconductor pillar) $24_\uparrow$ as a channel (current path), a gate insulating layer $25_\uparrow$, and the word line $WL_{ij\uparrow}$. The upper surface of the semiconductor layer $24_\uparrow$ is connected to the bit line $BL_\uparrow$ of FIG. 47. The capacitor $C_{ij\uparrow}$ includes a pillar electrode portion $26_\uparrow$, an insulating portion $27_\uparrow$ which covers the pillar electrode portion $26_\uparrow$, and a cell electrode portion $28_\uparrow$ which covers the insulating portion $27_\uparrow$. The lower surface of the pillar electrode portion $26_\uparrow$ is connected to the source line SL. The upper surface of the cell electrode portion $28_\uparrow$ is connected to the semiconductor layer $24_\uparrow$.

The transistor $T_{ij\uparrow}$ is the vertical transistor in which the semiconductor layer $24_\uparrow$ serving as a channel is intersected with the upper surface of the semiconductor substrate 20 similarly to the transistor $T_{ij\downarrow}$ in the subarray $MA_\downarrow$. The capacitor $C_{ij\uparrow}$ is a fin-type capacitor similarly to the capacitor $C_{ij\downarrow}$ in the subarray $MA_\downarrow$.

The structure of the transistor $T_{ij\uparrow}$ and the capacitor $C_{ij\uparrow}$ is different from that of the transistor $T_{ij\downarrow}$ and the capacitor $C_{ij\downarrow}$ in that the upper and lower portions are inversed.

A pair of the transistor $Q_{pre}$ and the transistor $Q_W$ are connected to the bit line $BL_\downarrow$ and the bit line $BL_\uparrow$ respectively. The transistor $Q_{pre}$ and the transistor $Q_W$ correspond to, for example, the transistor $Q_{pre}$ and the transistor $Q_W$ of FIGS. 3, 4, and 23.

The transistor $Q_{pre}$ and the transistor $Q_W$ are the vertical transistors similarly to the transistors $T_{ij\downarrow}$ and $T_{ij\uparrow}$ of the memory cell.

Figure 50:
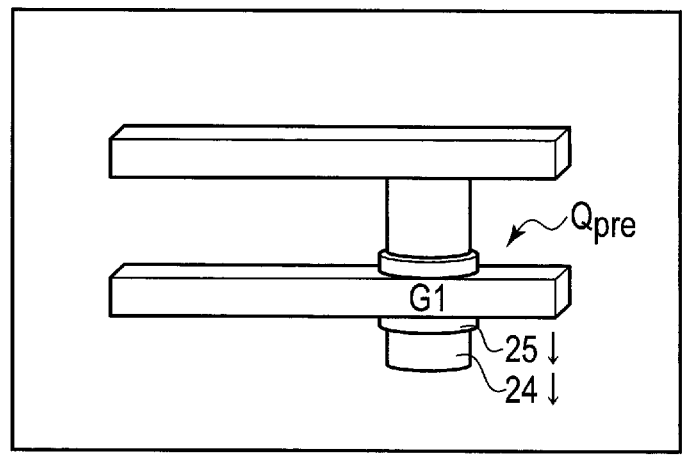
FIG. 50 is a perspective view illustrating an exemplary structure of a transistor $Q_{pre}$.

For example, as illustrated in FIG. 50, the transistor $Q_{pre}$ includes the semiconductor layer (semiconductor pillar) $24_\downarrow$ serving as a channel (current path), the gate insulating layer $25_\downarrow$, and a gate electrode G1. The lower surface of the semiconductor layer $24_\downarrow$ is connected to the bit line $BL_\downarrow$, or the bit line $BL_\uparrow$ of FIG. 47.

Figure 51:
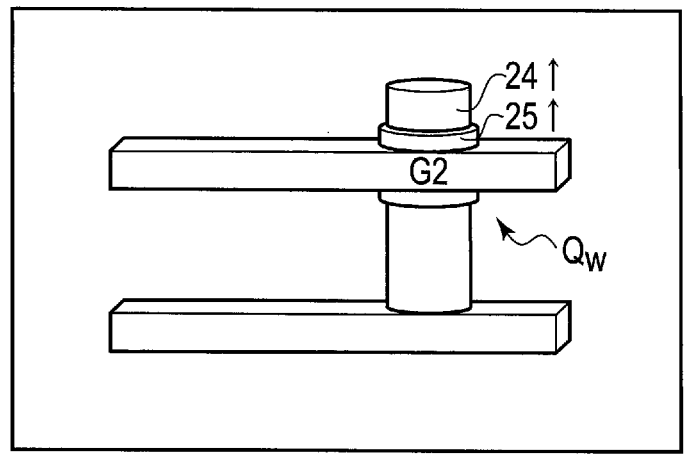
FIG. 51 is a perspective view illustrating an exemplary structure of a transistor $Q_W$.

In addition, as illustrated in FIG. 51, the transistor $Q_W$ includes the semiconductor layer (semiconductor pillar) $24_1$ serving as a channel (current path), the gate insulating layer $25_r$, and a gate electrode G2. The upper surface of the semiconductor layer $24_\uparrow$ is connected to the bit line $BL_\downarrow$ or the bit line $BL_\uparrow$ of FIG. 47.

The transistor $Q_{pre}$ and the transistor $Q_W$ are disposed as the vertical transistors in the memory cell array, and thus a charging speed of the bit line $BL_\downarrow/BL_\uparrow$ by these transistors is performed at a high speed.

Further, the positions of the transistor $Q_{pre}$ and the transistor $Q_W$ may be changed.

For example, the transistor $Q_{pre}$ may be connected to the lower surface of the bit line $BL_\downarrow/BL_\uparrow$ of FIG. 47, and the transistor $Q_W$ may be connected to the upper surface of the bit line $BL_\downarrow/BL_\uparrow$ of FIG. 47. In addition, the transistor $Q_{pre}$ and the transistor $Q_W$ both may be connected to the upper surface of the bit line $BL_\downarrow/BL_\uparrow$, or may be connected to the lower surface of the bit line $BL_\downarrow/BL_\uparrow$.

In such a three-dimensional DRAM, for example, the write operation in the block BK0 and the write operation in the block BK1 can be performed in parallel. In addition, the write operation in the subarray $MA_\downarrow$ in the block BK0 and the write operation in the subarray $MA_\uparrow$ in the block BK0 are performed in series since the source line SL is shared. The operation will be described below.

In addition, in the write operation in the subarray $MA_\downarrow$ in the block BK0, one of a plurality of word lines $WL_{ij\downarrow}$ is selected. The potential of the selected one word line is set to an active state (high level), and the potentials of the other word lines are set to a non-active state (low level).

In addition, in such a case of the three-dimensional DRAM, a plan size per one memory cell in one subarray can realize $4F^2$ as can be seen from the plan view of FIG. 46. Therefore, assuming that n blocks (that is, 2n subarrays) are stacked on the semiconductor substrate 20, the plan size per one memory cell can realize $2F^2/n$ ($=4F^2/2n$). In this case, "n" is a natural number of 1 or more.

FIG. 52 illustrates a modification of the device structure of FIG. 47.

The device structure is different from the device structure of FIG. 47 in that the transistor T_SL for selecting the source line SL is the vertical transistor similarly to the transistors $T_{ij\downarrow}$ and $T_{ij\uparrow}$ in the memory cell.

Figure 53:
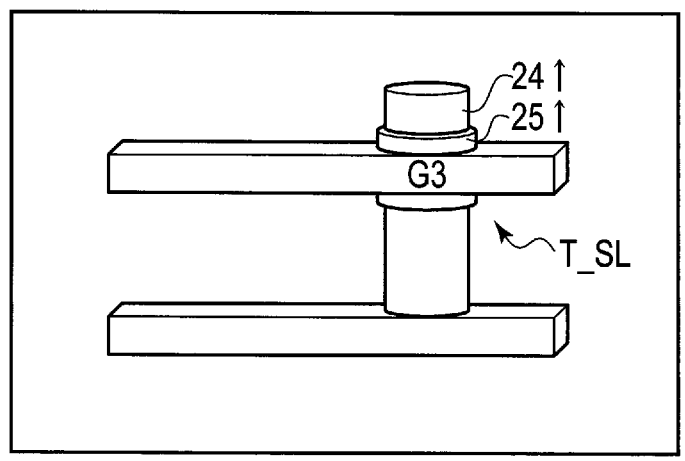
FIG. 53 is a perspective view illustrating an exemplary structure of a transistor T_SL.

For example, as illustrated in FIG. 53, the transistor T_SL includes the semiconductor layer (semiconductor pillar) $24_\uparrow$ serving as a channel (current path), the gate insulating layer $25_\uparrow$, and a gate electrode G3. The semiconductor layer $24_\uparrow$ is connected between the source line SL and the peripheral circuit 21B. In addition, the position of the transistor T_SL may be changed similarly to the transistors $Q_{pre}$ and $Q_W$.

FIGS. 54 to 57 each illustrate examples of the peripheral circuit which includes the column selector and the sense amplifier when the device structure of FIGS. 46 to 53 is employed.

The capacitors $C_{ij\downarrow}$ and $C_{ij\uparrow}$, the transistors $T_{ij\downarrow}$ and $T_{ij\uparrow}$, the word lines $WL_{ij\downarrow}$ and $WL_{ij\uparrow}$, the bit lines $BL_\downarrow$ and $BL_\uparrow$, the source line SL, and the transistors $Q_{pre}$, $Q_W$, $Q_{clamp}$, and T_SL correspond respectively to the capacitors $C_{ij\downarrow}$ and $C_{ij\uparrow}$, the transistors $T_{ij\downarrow}$ and $T_{ij\uparrow}$, the word lines $WL_{ij\downarrow}$ and $WL_{ij\uparrow}$, the bit lines $BL_\downarrow$ and $BL_\uparrow$, the source line SL, and the transistors $Q_{pre}$, $Q_W$, $Q_{clamp}$, and T_SL illustrated in FIGS. 46 to 53.

In addition, in FIGS. 54 to 57, the same elements as those of the peripheral circuit illustrated in FIGS. 3, 4, and 23 will be denoted with the same symbols, and the detailed description will be omitted.

Figure 55:
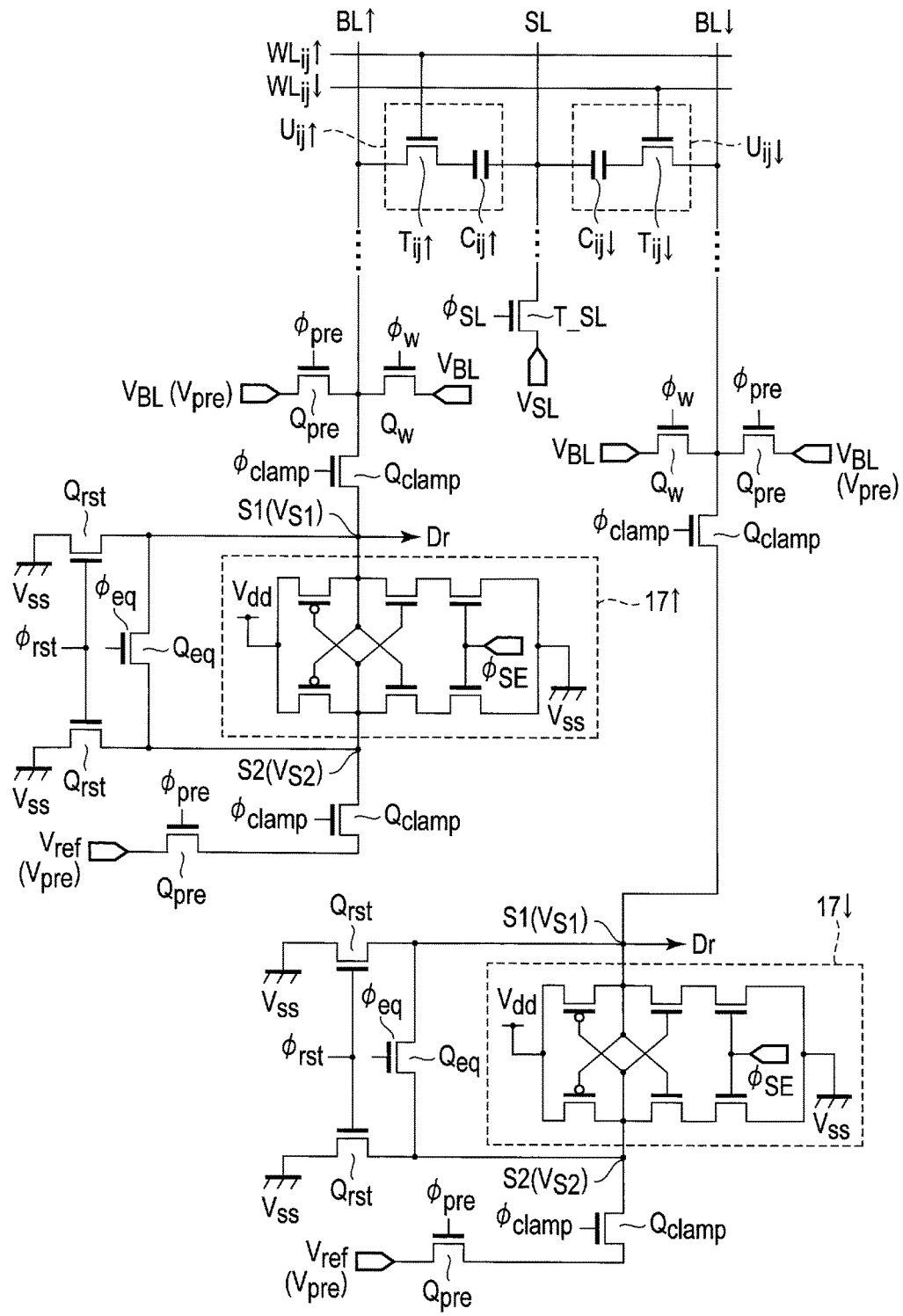
FIG. 55 is a circuit diagram illustrating an example of the peripheral circuit.

FIGS. 54 and 55 illustrate the single-level DRAM of the 1-cell/1-bit type or the multi-level DRAM, and correspond to FIGS. 3 and 23. The difference from FIG. 54 and FIG. 55 is in a correspondence relation between the sense amplifier 17 and the bit lines $BL_\downarrow$ and $BL_\uparrow$. In other words, while one sense amplifier 17 is commonly connected to two bit lines $BL_\downarrow$ and $BL_\uparrow$ in the example of FIG. 54, one sense amplifier $17_\downarrow$ is connected to one bit line $BL_\downarrow$, and one sense amplifier 17↑ is connected to one bit line $BL_\uparrow$ in the example of FIG. 55.

In the case of the three-dimensional DRAM illustrated in FIGS. 46 to 53, the memory cell $U_{ij\downarrow}$ and the memory cell $U_{ij\uparrow}$ share one source line SL. In addition, in this embodiment, as described above, for example, the write data is written to the memory cells $U_{ij\downarrow}$ and $U_{ij\uparrow}$ by changing the potential of the source line SL in the write operation. Therefore, the write operation is not possible to be performed in parallel with respect to these two memory cells $U_{ij\downarrow}$ and $U_{ij\uparrow}$.

Thus, the word line $WL_{ij\downarrow}$ connected to the memory cell $U_{ij\downarrow}$ and the word line $WL_{ij\uparrow}$ connected to the memory cell $U_{ij\uparrow}$ are set apart from each other.

Therefore, for example, in a case where the write data is written to the memory cell $U_{ij\downarrow}$, the word line $WL_{ij\downarrow}$ is set to the high level (selection state), the word line $WL_{ij\uparrow}$ is set to the low level (non-selection state), the bit line $BL_\uparrow$ is set to a fixed potential, and the source line SL is set to the potential $V_{SL}$, according to the value of the write data, so that the write data can be independently written to the memory cell $U_{ij\downarrow}$.

In addition, for example, in a case where the write data is written to the memory cell $U_{ij\uparrow}$, the word line $WL_{ij\uparrow}$ is set to the high level (selection state), the word line $WL_{ij\downarrow}$ is set to the low level (non-selection state), the bit line $BL_{\uparrow}$ is set to a fixed potential, and the source line SL is set to the potential $V_{SL}$ according to the value of the write data, so that the write data can be independently written to the memory cell $U_{ij\uparrow}$.

In other words, for example, the write operations with respect to the two memory cells $U_{ij\downarrow}$ and $U_{ij\uparrow}$ are performed in series by time division control as illustrated in FIG. 58.

Further, the write operations with respect to the memory cells $U_{ij\downarrow}$ and $U_{ij\uparrow}$, for example, show the same waveforms as those of FIG. 12 or 17 in the case of the single-level DRAM, and show the same waveforms as those of FIG. 31 in the case of the multi-level DRAM, so that the detailed description will be omitted herein.

However, in the examples of FIGS. 54 and 55, for example, the elements corresponding to the column selector 16 of FIGS. 3 and 23 are not provided. When the write operation is performed with respect to one of two memory cells $U_{ij\downarrow}$ and $U_{ij\uparrow}$, $\varphi_{SL}$ may be set to the high level, and the transistor T_SL may be turned on. Therefore, when $\varphi_{CS}$ is replaced with $\varphi_{SL}$ in the waveforms of FIG. 12, 17, or 31, the write operation with respect to the respective memory cells $U_{ij\downarrow}$ and $U_{ij\uparrow}$ can be explained.

In the case of the example of FIG. 54, the read operation is performed in series with respect to two memory cells $U_{ij\downarrow}$ and $U_{ij\uparrow}$.

For example, in a case where the data is read out of the memory cell $U_{ij\downarrow}$, the word line $WL_{ij\downarrow}$ is set to the high level (selection state), the word line $WL_{ij\uparrow}$ is set to the low level (non-selection state), the source line SL is set to 0V, and the bit line $BL_{\downarrow}$ is set to the precharge potential $V_{pre}$. Therefore, the data can be read out of the memory cell $U_{ij\downarrow}$.

In addition, for example, in a case where the data is read out of the memory cell $U_{ij\uparrow}$, the word line $WL_{ij\uparrow}$ is set to the high level (selection state), the word line $WL_{ij\downarrow}$ is set to the low level (non-selection state), the source line SL is set to 0V, and the bit line $BL_{\uparrow}$ is set to the precharge potential $V_{pre}$. Therefore, the data can be read out of the memory cell $U_{ij\uparrow}$.

With this regard, in the case of the example of FIG. 55, the read operation can be performed in parallel with respect to two memory cells $U_{ij\downarrow}$ and $U_{ij\uparrow}$.

For example, in a case where the data is read out of two memory cells $U_{ij\downarrow}$ and $U_{ij\uparrow}$ in parallel, two word lines $WL_{ij\downarrow}$ and $WL_{ij\uparrow}$ both are set to the high level (selection state), the source line SL is set to 0V, and two bit lines $BL_{\downarrow}$ and $BL_{\uparrow}$ both are set to the precharge potential $V_{pre}$. Therefore, the data can be read out of two memory cells $U_{ij\downarrow}$ and $U_{ij\uparrow}$ in parallel.

Further, the read operations with respect to the memory cells $U_{ij\downarrow}$ and $U_{ij\uparrow}$, for example, show the same waveforms as those of FIG. 13, 14, 19, or 20 in the case of the single-level DRAM, and show the same waveforms as those of FIGS. 32 to 37 in the case of the multi-level DRAM, so that the detailed description will be omitted herein.

In this case, $\varphi_{CS}$ in the waveforms of FIGS. 13, 14, 19, and 20, or FIGS. 32 to 37 is necessarily replaced with $\varphi_{SL}$.

Figure 56:
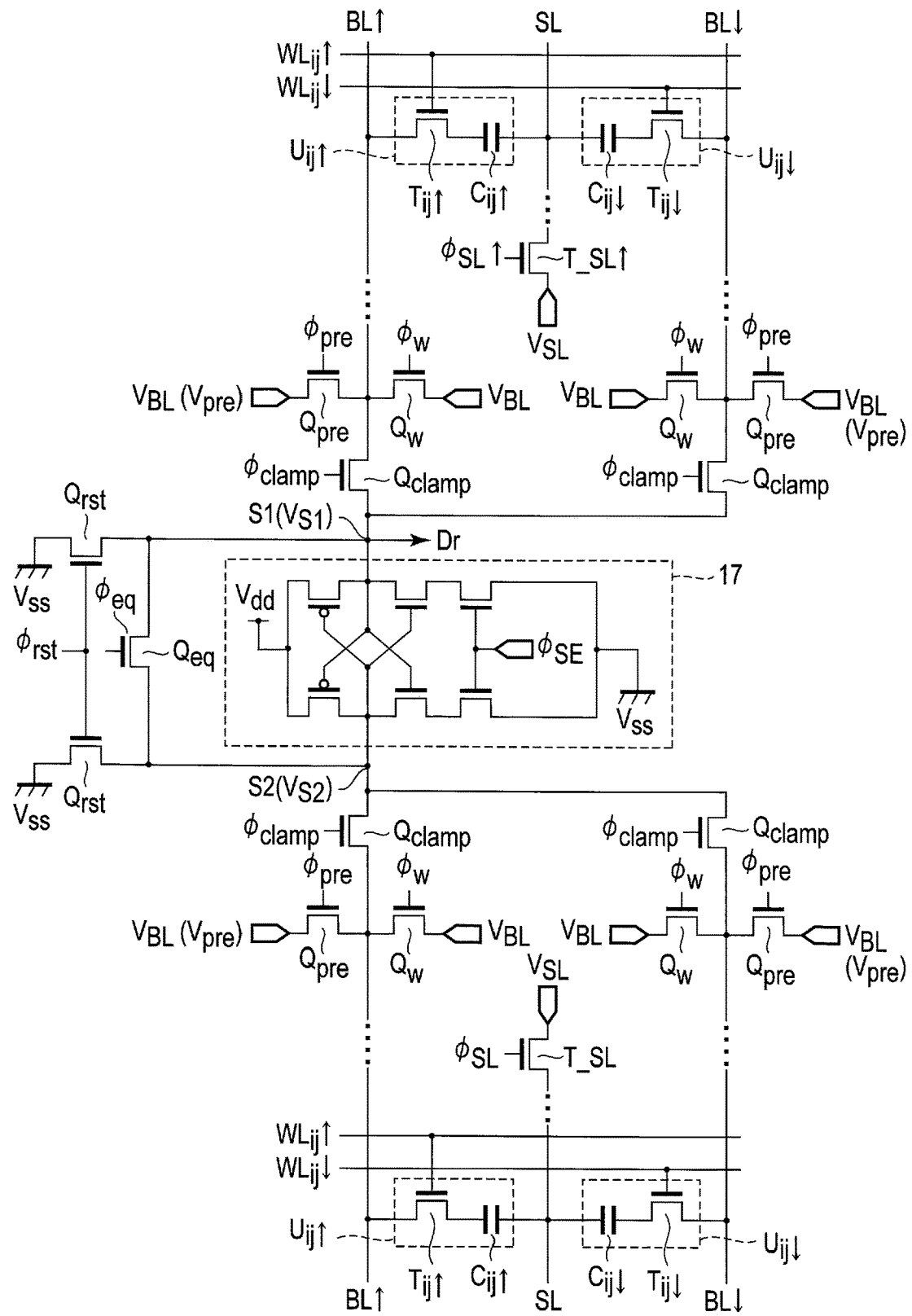
FIG. 56 is a circuit diagram illustrating an example of the peripheral circuit.

FIGS. 56 and 57 illustrate the single-level DRAM of the 2-cell/1-bit type, and correspond to FIG. 4. The difference of FIGS. 56 and 57 is a correspondence relation between the sense amplifier 17 and the bit lines $BL_{\downarrow}$ and $BL_{\uparrow}$. In other words, while one sense amplifier 17 is commonly connected to a bit line pair $BL_{\downarrow}$ and $BL_{\downarrow}$ and a bit line pair $BL_{\uparrow}$ and $BL_{\uparrow}$ in the example of FIG. 56, one sense amplifier $17_{\downarrow}$ is connected to the bit line pair $BL_{\downarrow}$ and $BL_{\downarrow}$, and one sense amplifier $17_{\uparrow}$ is connected to the bit line pair $BL_{\uparrow}$ and $BL_{\uparrow}$ in the example of FIG. 57.

The write operation is performed in series with respect to the memory cell pair $U_{ij\downarrow}$ and $U_{ij\downarrow}$ and the memory cell pair $U_{ij\uparrow}$ and $U_{ij\uparrow}$ similarly to the case of FIGS. 54 and 55. In other words, the word line $WL_{ij\downarrow}$ connected to the memory cell pair $U_{ij\downarrow}$ and $U_{ij\downarrow}$ and the word line $WL_{ij\uparrow}$ connected to the memory cell pair $U_{ij\uparrow}$ and $U_{ij\uparrow}$ are set apart from each other.

Therefore, for example, in a case where the write data is written to the memory cell pair $U_{ij\downarrow}$ and $U_{ij\downarrow}$, the word line $WL_{ij\downarrow}$ is set to the high level (selection state), the word line $WL_{ij\uparrow}$ is set to the low level (non-selection state), the bit line $BL_{\downarrow}$ is set to a fixed potential, and the source line SL is set to the potential $V_{SL}$ according to the value of the write data, so that the write data can be independently written to the memory cell pair $U_{ij\downarrow}$ and $U_{ij\downarrow}$.

In addition, for example, in a case where the write data is written to the memory cell pair $U_{ij\uparrow}$ and $U_{ij\uparrow}$, the word line $WL_{ij\uparrow}$ is set to the high level (selection state), the word line $WL_{ij\downarrow}$ is set to the low level (non-selection state), the bit line $BL_{\uparrow}$ is set to a fixed potential, and the source line SL is set to the potential $V_{SL}$ according to the value of the write data, so that the write data can be independently written to the memory cell pair $U_{ij\uparrow}$ and $U_{ij\uparrow}$.

Further, the write operation (in the case of the single-level DRAM) with respect to the memory cell pair $U_{ij\downarrow}$ and $U_{ij\downarrow}$ or the memory cell pair $U_{ij\uparrow}$ and $U_{ij\uparrow}$ shows, for example, the same waveforms as those of FIG. 12 or 17. In this case, complementary data is stored in the memory cell pair $U_{ij\downarrow}$ and $U_{ij\downarrow}$, and complementary data is stored in the memory cell pair $U_{ij\downarrow}$ and $U_{ij\uparrow}$.

In addition, $\varphi_{CS}$ is necessarily replaced with $\varphi_{SL}$ in the waveforms of FIG. 12 or 17.

In the case of the example of FIG. 56, the read operations are performed in series with respect to the memory cell pair $U_{ij\downarrow}$ and $U_{ij\downarrow}$ and the memory cell pair $U_{ij\uparrow}$ and $U_{ij\uparrow}$ similarly to the example of FIG. 54.

For example, in a case where the data is read out of the memory cell pair $U_{ij\downarrow}$ and $U_{ij\downarrow}$, the word line $WL_{ij\downarrow}$ is set to the high level (selection state), the word line $WL_{ij\uparrow}$ is set to the low level (non-selection state), the source line SL is set to 0V, and the bit line $BL_{\downarrow}$ is set to the precharge potential $V_{pre}$. Therefore, the data can be read out of the memory cell pair $U_{ij\downarrow}$ and $U_{ij\downarrow}$.

In addition, for example, in a case where the data is read out of the memory cell pair $U_{ij\uparrow}$ and $U_{ij\uparrow}$, the word line $WL_{ij\uparrow}$ is set to the high level (selection state), the word line $WL_{ij\downarrow}$ is set to the low level (non-selection state), the source line SL is set to 0V, and the bit line $BL_{\uparrow}$ is set to the precharge potential $V_{pre}$. Therefore, the data can be read out of the memory cell pair $U_{ij\uparrow}$ and $U_{ij\uparrow}$.

With this regard, in the case of the example of FIG. 57, the read operation can be performed with respect to the memory cell pair $U_{ij\downarrow}$ and $U_{ij\downarrow}$ and the memory cell pair $U_{ij\uparrow}$ and $U_{ij\uparrow}$ in parallel.

For example, in a case where the data is read out of the memory cell pair $U_{ij\downarrow}$ and $U_{ij\downarrow}$ and the memory cell pair $U_{ij\uparrow}$ and $U_{ij\uparrow}$ in parallel, two word lines $WL_{ij\downarrow}$ and $WL_{ij\uparrow}$ both are set to the high level (selection state), the source line SL is set to 0V, and two bit lines $BL_{\downarrow}$ and $BL_{\uparrow}$ both are set to the precharge potential $V_{pre}$. Therefore, the data can be read out of the memory cell pair $U_{ij\downarrow}$ and $U_{ij\downarrow}$ and the memory cell pair $U_{ij\uparrow}$ and $U_{ij\uparrow}$ in parallel.

Further, the read operation (the case of the single-level DRAM) with respect to the memory cell pair $U_{ij\downarrow}$ and $U_{ij\downarrow}$ or the memory cell pair $U_{ij\uparrow}$ and $U_{ij\uparrow}$ shows, for example, the same waveforms as those of FIG. 15 or 16, so that the detailed description will be omitted herein. In this case, $\varphi_{CS}$ is necessarily replaced with $\varphi_{SL}$ in the waveforms of FIG. 15 or 16.

FIG. 59 illustrates an influence of a potential change of the source line onto a non-select cell.

In the case of the three-dimensional DRAM illustrated in FIGS. 46 to 53, the memory cell $U_{ij\downarrow}$ and the memory cell $U_{ij\uparrow}$ share one source line SL. Therefore, for example, in a case where the write data is written to the memory cell $U_{ij\downarrow}$, the memory cell $U_{ij\downarrow}$ becomes the select cell, and the memory cell $U_{ij\uparrow}$ becomes the non-select cell which does not perform the writing.

In addition, the potential $V_{SL}$ of the source line SL comes to be applied even to the non-select cell during a period when the writing is performed on the select cell. Therefore, it is necessary that the change in the potential $V_{SL}$ of the source line SL does not affect on the data ($V_{cap}$) of the non-select cell.

As illustrated in the drawing, in this embodiment, the data ($V_{cap}$) of the non-select cell does not change even when the potential $V_{SL}$ of the source line SL is changed in order to write the write data to the select cell. In other words, $V_{cap}$ of the non-select cell is temporally changed by the capacity coupling, but rightly recovered. This is because the transistor of the non-select cell is turned off.

Therefore, it is desirable that a transistor (for example, the oxide semiconductor TFT) having a less off-leak characteristic be used as the transistors $T_{ij\downarrow}$ and $T_{ij\uparrow}$ in the memory cells $U_{ij\downarrow}$ and $U_{ij\uparrow}$.

(Applications)

The DRAM related to this embodiment may be applied to a page buffer of a NAND memory. The page buffer of the NAND memory is a memory which temporally stores the write data to be written to the NAND memory and the read data to be read out of the NAND memory.

In the NAND memory, the write operation and the read operation are performed in unit of data called a page. Therefore, the page buffer is necessary for the purpose of taking synchronization with data (page data) in unit of data.

However, the NAND memory has been formed in multileveled structure in recent years. For example, 2-bit (or more number of bits) data may be stored in one memory cell. In this case, the memory size of the page buffer is also increased in proportion to the number of bits to be stored in one memory cell. In general, in a case where n-bit ("n" is a natural number of 2 or more) is stored in one memory cell, the number of page buffers corresponding to one memory cell becomes "n".

Therefore, assuming that one page buffer includes two SRAMs, in a case where n-bit data is stored in one memory cell, 2n SRAM cells are required for one memory cell. In addition, assuming that the page data 8 Kbyte (64 Kbit), (2n×64) SRAM cells are required for one page data.

Since the SRAM cell is two-dimensionally formed on the semiconductor substrate, the area of the page buffer in the NAND memory (chip) tends to increase when the NAND memory is formed in a multileveled structure. In this case, the area of the page buffer acts as a bottle neck, and the area (memory capacity) of the memory cell array in the NAND memory cannot be increased.

The DRAM of this embodiment is used as a substitute of the conventional page buffer (SRAM cell), so that the problem that the memory size of the page buffer is increased can be solved.

FIG. 60 illustrates an application to the page buffer of the NAND memory.

A NAND memory 1 includes an interface circuit 2, a controller 3, a potential generator 4, a row decoder/driver 5, a memory cell array 6, a sense amplifier 7, and a page buffer 8.

The interface circuit 2 receives, for example, read/write/erase command CMD and the address signal ADDR. In addition, the interface circuit 2 serves as an interface of read/write data Dw and Dr.

The controller 3 controls a read/write/erase operation with respect to the memory cell array 6. For example, when the interface circuit 2 receives the read/write command, the controller 3 controls the read/write operation with respect to the memory cell array 6. In the read/write operation, the controller 3 instructs the potential generator 4 to generate a read/write pulse. The potential generator 4 generates the read/write pulse on the basis of the instruction from the controller 3.

The memory cell array 6 includes a plurality of blocks (in this example, m blocks) $BK_0$, $BK_1$, . . . , and $BK_{(m-1)}$. Each block includes a plurality of cell units UT which are connected to a plurality of bit lines (in this example, j bit lines) $BL_0$, $BL_1$, . . . , and $BL_{(j-1)}$.

For example, in the block $BK_0$, the cell unit UT includes a NAND string which includes a plurality of memory cells (in this example, i memory cells) $MC_0$, $MC_1$, . . . , and $MC_{(i-1)}$ connected in series, a select transistor TS which is connected between the NAND string and the source line SL, and a select transistor TD which is connected between the NAND string and the bit line $BL_k$ ("k" is one of 1 to (j−1)).

Each of the plurality of memory cells $MC_0$, $MC_1$, . . . , and $MC_{(i-1)}$ is, for example, a flash memory cell which includes a charge storage layer FG and a control gate electrode CG. The select transistors TS and TD are, for example, FETs which include the gate electrodes G.

The control gate electrodes CG of the plurality of memory cells $MC_0$, $MC_1$, . . . , and $MC_{(i-1)}$ are connected to a plurality of word lines $WL_0$, $WL_1$, . . . , and $WL_{(i-1)}$ respectively. The gate electrodes G of the select transistors TS and TD are connected to select gate lines SGS and SGD. The plurality of bit lines $BL_0$, $BL_1$, . . . , and $BL_{(j-1)}$ are respectively connected to the sense amplifiers (SA) 7. The page buffer 8 is connected between the interface circuit 2 and the sense amplifier 7.

The page buffer 8 is, for example, the DRAM of FIG. 1 or 22, and receives the write enable signal WE, the read enable signal RE, and the address signal Addr from the controller 3. The page buffer 8 temporally stores the write data Dw or the read data Dr on the basis of the control of the controller 3.

FIG. 61 illustrates an area reduction effect of the page buffer.

For example, in a case where one memory cell is a TLC (Triple-level-cell)-NAND which stores 3-bit data, the conventional page buffer 8 requires, for example, six SRAM cells for one sense amplifier SA, and these SRAM cells are two-dimensionally formed on the semiconductor substrate. On the contrary, the page buffer 8 of this embodiment requires, for example, six DRAM cells for one sense amplifier SA, and these DRAM cells are formed to be stacked on the semiconductor substrate.

Therefore, the page buffer 8 of this embodiment can be made in a significantly reduced area occupied in the NAND memory (chip) compared to the conventional page buffer 8.

CONCLUSION

Hitherto, according to this embodiment, the high performance and the cost reduction of the DRAM can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a first memory cell including,
      a first capacitor which includes a first electrode and a second electrode, and
      a first transistor which includes a first current path containing a first terminal and a second terminal, and a first control terminal to turn on/off the first current path, the first terminal being connected to the first electrode;
   a first conductive line connected to the second terminal;
   a second conductive line connected to the second electrode;
   a third conductive line connected to the first control terminal;
   a first sense amplifier;
   a first switch element connected between the first conductive line and the first sense amplifier; and
   a controller turning off the first switch element in a first write operation, applies a first potential to the first conductive line, and sets a potential of the second conductive line according to a value of first write data to be written to the first memory cell.

2. The device of claim 1, wherein
   the first and second conductive lines extend in a first direction, and
   the third conductive line extends in a second direction intersecting with the first direction.

3. The device of claim 1, wherein
   the first write data is 1-bit data, and
   the controller applies one of the first potential and a second potential different from the first potential to the second conductive line in the first write operation.

4. The device of claim 3, wherein
   the first potential is a positive potential, and the second potential is a ground potential.

5. The device of claim 3, wherein
   the first potential is a positive potential, and the second potential is a negative potential.

6. The device of claim 3,
   wherein in a read operation after the first write operation,
      the controller operates to
         turn on the first switch element,
         set the first conductive line to float after applying a third potential to the first conductive line,
         apply a fourth potential different from the third potential to the second conductive line, and
         set a potential of the first conductive line according to a value of data stored in the first memory cell.

7. The device of claim 6, wherein
   the third potential is a potential between the first potential and the second potential.

8. The device of claim 7, wherein the third potential is a positive potential, and the fourth potential is a ground potential.

9. The device of claim 7, wherein
   the controller sets the first conductive line to float, and sets the second conductive line to a fifth potential different from the fourth potential from the fourth potential after the fourth potential is applied to the second conductive line.

10. The device of claim 1, wherein
    the first write data is n-bit data, and
    the controller applies one of the first potential, a second potential, a third potential, . . . , and a 2n-th potential to the second conductive line in the first write operation (herein, "n" is a natural number of 2 or more, and the first, second, third, . . . , and 2n-th potentials are different from each other).

11. The device of claim 10,
    wherein the controller reads data stored in the first memory cell by n sense operations in a read operation after the first write operation,
    wherein, in each sense operation, the controller operates to
       turn on the first switch element,
       set the first conductive line to float after applying a third potential to the first conductive line, and
       apply a fourth potential different from the third potential to the second conductive line, and
    wherein a value of the third potential is different in the respective sense operations.

12. The device of claim 1, further comprising:
    a second memory cell including
       a second capacitor which includes a third electrode and a fourth electrode, the fourth electrode being connected to the second conductive line, and
       a second transistor which includes a second current path containing a third terminal and a fourth terminal, and a second control terminal to turn on/off the second current path, the third terminal being connected to the third electrode;
    a fourth conductive line connected to the fourth terminal; and
    a fifth conductive line connected to the second control terminal,
    wherein the first switch element is also connected between the fourth conductive line and the first sense amplifier, and
    wherein, in a second write operation after the first write operation, the controller operates to
       turn off the first switch element,
       apply the first potential to the fourth conductive line, and
       set a potential of the second conductive line according to a value of second write data to be written to the second memory cell.

13. The device of claim 1, further comprising:
    a second memory cell including
       a second capacitor which includes a third electrode and a fourth electrode, the fourth electrode being connected to the second conductive line, and
       a second transistor which includes a second current path containing a third terminal and a fourth terminal, and a second control terminal to turn on/off the second current path, the third terminal being connected to the third electrode;
a fourth conductive line connected to the fourth terminal;
a fifth conductive line connected to the second control terminal;
a second sense amplifier; and
a second switch element connected between the fourth conductive line and the second sense amplifier,
wherein, in a second write operation after the first write operation, the controller operates to
turn off the first and second switch elements,
apply the first potential to the fourth conductive line, and
set a potential of the second conductive line according to a value of second write data to be written to the second memory cell.

14. The device of claim 1, wherein
the sense amplifier is disposed on a semiconductor substrate, and the first and second directions are directions along an upper surface of the semiconductor substrate.

15. The device of claim 1, wherein
the first memory cell is disposed above the sense amplifier.

16. The device of claim 1, further comprising:
a nonvolatile memory as a storage device,
wherein the first memory cell stores data to be written to the nonvolatile memory or data to be read out of the nonvolatile memory.

17. A semiconductor memory device comprising:
a semiconductor substrate;
a first sense amplifier on the semiconductor substrate; and
a memory cell array above the first sense amplifier,
wherein the memory cell array including
a first memory cell which includes
  a first capacitor which include a first electrode and a second electrode, and
  a first transistor which includes a first current path containing a first terminal and a second terminal, and a first control terminal to turn on/off the first current path, the first terminal being connected to the first electrode,
a second memory cell which includes
  a second capacitor which includes a third electrode and a fourth electrode, and
  a second transistor which includes a second current path containing a third terminal and a fourth terminal, and a second control terminal to turn on/off the second current path, the third terminal being connected to the third electrode,
a first conductive line connected to the second terminal and extends in a first direction along an upper surface of the semiconductor substrate,
a second conductive line connected to the second and fourth electrodes and extends in the first direction,
a third conductive line connected to the first control terminal and extends in a second direction intersecting with the first direction along the upper surface of the semiconductor substrate,
a fourth conductive line connected to the fourth terminal and extends in the first direction, and
a fifth conductive line connected to the second control terminal and extends in the second direction.

18. The device of claim 17, further comprising:
a potential generator that is able to generate a plurality of potentials and applies one of the potentials to the second conductive line.

19. The device of claim 17, wherein
the first and second memory cells are stacked in a third direction intersecting with the upper surface of the semiconductor substrate.

20. The device of claim 17, wherein
the first current path includes an oxide semiconductor layer.

* * * * *